(12) United States Patent
Sabotta et al.

(10) Patent No.: US 11,703,921 B2
(45) Date of Patent: Jul. 18, 2023

(54) CONFIGURABLE HEATSINK

(71) Applicant: NVIDIA Corporation, Santa Clara, CA (US)

(72) Inventors: Michael L. Sabotta, Cypress, TX (US); Susheela N. Narasimhan, Fremont, CA (US); Reza Azizian, San Jose, CA (US); Herman W. Chu, Palo Alto, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 16/813,590

(22) Filed: Mar. 9, 2020

(65) Prior Publication Data

US 2021/0278885 A1 Sep. 9, 2021

(51) Int. Cl.
*G06F 1/20* (2006.01)
*H05K 7/20* (2006.01)

(52) U.S. Cl.
CPC .......... *G06F 1/20* (2013.01); *H05K 7/20154* (2013.01); *H05K 7/20209* (2013.01)

(58) Field of Classification Search
CPC .. G06F 1/20; H05K 7/20154; H05K 7/20209; F28D 15/0241
USPC .......... 361/679.54, 697, 700, 702, 709, 715; 165/83
See application file for complete search history.

(56) References Cited

U.S. PATENT DOCUMENTS

| | | | | |
|---|---|---|---|---|
| 6,359,781 B1* | 3/2002 | Hoss | ................. | G06F 1/20 165/104.33 |
| 6,447,322 B1* | 9/2002 | Yan | .................. | H05K 7/1053 361/709 |
| 6,795,315 B1* | 9/2004 | Wu | .................. | G06F 1/20 165/104.33 |
| 7,609,522 B2* | 10/2009 | Jin | .................. | H01L 23/4006 165/80.2 |
| 10,212,852 B1* | 2/2019 | Reddy | .......... | G02B 6/4269 |
| 10,602,602 B2* | 3/2020 | Zhai | .............. | H05K 7/2039 |
| 10,631,436 B1* | 4/2020 | Larsen | ............ | H01L 23/36 |
| 2003/0019607 A1 | 1/2003 | Wei | | |
| 2003/0159819 A1* | 8/2003 | Lee | ............. | H01L 23/4093 165/185 |
| 2004/0240184 A1 | 12/2004 | Rivera | | |
| 2006/0012959 A1* | 1/2006 | Lee | .............. | H01L 23/427 361/700 |
| 2007/0076378 A1* | 4/2007 | Blanco | ........... | H01L 23/433 361/719 |

(Continued)

FOREIGN PATENT DOCUMENTS

KR 20020095412 A 12/2002

OTHER PUBLICATIONS

IEEE, "IEEE Standard 754-2008 (Revision of IEEE Standard 754-1985): IEEE Standard for Floating-Point Arithmetic," Aug. 29, 2008, 70 pages.

(Continued)

*Primary Examiner* — Stephen S Sul
(74) *Attorney, Agent, or Firm* — Lowenstein Sandler LLP

(57) ABSTRACT

Apparatuses, systems, and techniques to cool computer processors. In at least one embodiment, a system comprises one or more processors and a heatsink connected by a flexible heat conduit to the one or more processors, and a position of the heatsink is adjustable.

28 Claims, 44 Drawing Sheets

(56) References Cited

U.S. PATENT DOCUMENTS

| | | | | |
|---|---|---|---|---|
| 2008/0218963 A1* | 9/2008 | Wu | ...................... | H01L 23/427 |
| | | | | 361/679.48 |
| 2010/0172089 A1* | 7/2010 | Chiu | .................... | H01L 23/467 |
| | | | | 165/96 |
| 2011/0149518 A1 | 6/2011 | Salamon | | |
| 2011/0220328 A1 | 9/2011 | Huang | | |
| 2014/0321059 A1* | 10/2014 | Hung | .................. | H01L 23/4006 |
| | | | | 361/700 |
| 2016/0165757 A1* | 6/2016 | Norton | .................. | H01L 23/467 |
| | | | | 165/80.4 |
| 2018/0031329 A1* | 2/2018 | Wang | .................. | F28D 15/0266 |
| 2019/0045663 A1* | 2/2019 | Shia | .................. | H05K 7/20409 |
| 2019/0297748 A1* | 9/2019 | Chen | .................. | H05K 7/20809 |

OTHER PUBLICATIONS

Combined Search and Examination Report for Application No. GB2103222.2, dated Oct. 20, 2021, 8 pages.
Combined Search and Examination Report for Application No. GB2210720.5, dated Dec. 19, 2022, 8 pages.

* cited by examiner

CONFIGURABLE HEATSINK

FIELD

At least one embodiment pertains to heatsinks used to cool one or more processors. For example, at least one embodiment pertains to a heatsink used to cool one or more graphics processing units.

BACKGROUND

Computer processors generate significant amounts of heat. The efficiency of techniques used to cool computer processors can be improved.

DETAILED DESCRIPTION

Figure 1:
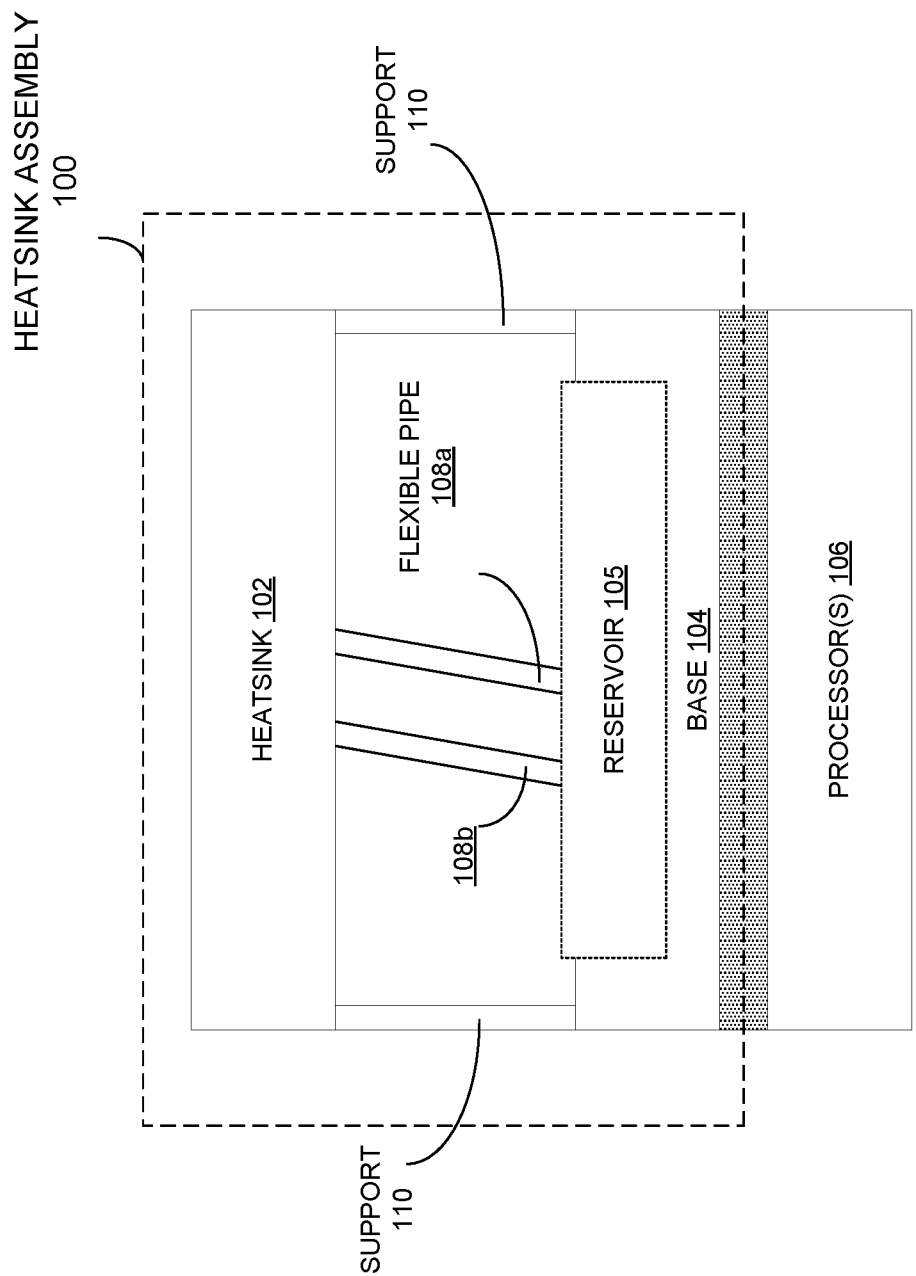
FIG. 1 illustrates a configurable heatsink assembly with a loop thermosiphon, according to at least one embodiment.

FIG. 1 illustrates a configurable heatsink assembly with a loop thermosiphon, according to at least one embodiment. In at least one embodiment, a heatsink assembly 100 is attached to one or more processors 106 to dissipate heat generated by said one or more processors 106. In at least one embodiment heatsink assembly 100 comprises a heatsink 102 whose position is adjustable. In at least one embodiment, said adjustment improves airflow to heatsink 102, and thereby increases heat dissipation. In at least one embodiment, said adjustment improves airflow to another heatsink, other than heatsink 102, that is installed with said heatsink 102 in a shared chassis. In at least one embodiment, improvement to airflow comprises one or more of increasing airflow pressure, increasing airflow velocity, reducing pre-heating of air by other components, and increasing utilization of airflow.

In at least one embodiment, a heatsink 102 comprises a thermally-conductive material, such as aluminum alloys, copper, copper-tungsten alloys or pseudo-alloys, various other metal alloys, various composite materials, diamond and diamond-based materials, and so forth. In at least one embodiment, heatsink 102 is shaped to facilitate efficient transfer or dissipation of heat. In at least one embodiment, heatsink 102 comprises fins or protuberances to facilitate efficient transfer or dissipation of heat. In at least one embodiment, heatsink 102 is a component of a loop siphon system. In at least one embodiment, heatsink 102 comprises a condenser. In at least one embodiment, heatsink 102 comprises a loop-siphon condenser. In at least one embodiment, a heatsink 102 comprises a heat exchanger. In at least one embodiment, a heatsink 102 comprises a radiator.

In at least one embodiment, heatsink assembly 100 comprises a base 104. In at least one embodiment, said heatsink assembly 100 is attached to said one or more processors via base 104. In at least one embodiment, base 104 is attached to one or more processors 106 using a material facilitating a thermal interface between said base 104 and said one or more processors 106. In at least one embodiment, said thermal interface comprises a thermal adhesive, a thermal grease, a thermally conductive pad, or some other attachment mechanism or facilitator that is compatible with or promotes thermal conductivity. In at least one embodiment, connection or attachment between a heatsink 102 and one or more processors 106 refers to thermal connection, such that heat can be transferred from processors 106 to heatsink 102.

In at least one embodiment, base 104 comprises a reservoir 105 for a material that may be heated by heat emitted by operation of the one or more processors 106. In at least one embodiment, the material is a liquid, gas, vapor, or some combination thereof. In at least one embodiment, reservoir 105 is an evaporator of a loop siphon system.

In at least one embodiment, base 104 is connected to a flexible heat conduit, such as flexible pipes 108a,b. In at least one embodiment, a flexible heat conduit, such as flexible pipes 108a,b, may be bent, twisted, or otherwise reoriented while attached to base 104 and heatsink 102, so that a position of heatsink 102 can be adjusted. In at least one embodiment, a flexible heat conduit, such as flexible pipes 108a,b, has flexibility sufficient to permit adjustment of a heatsink's position within a desired range of adjustment.

In at least one embodiment, connection between base 104 and flexible pipes 108a,b is by an outlet on base 104. In at least one embodiment, flexible pipe 108a carries material (e.g., a gas, liquid, vapor, or combination thereof) from a reservoir 105 of base 104 to heatsink 102. In at least one embodiment, flexible pipe 108b is connected to an inlet on base 104. In at least one embodiment, flexible pipe 108b carries material from heatsink 102 to reservoir 105. In at least one embodiment, operation of one or more processors 104 causes material in reservoir 105 to be heated by heat generated by operation of said one or more processors 106. Said material is conveyed through a flexible pipe 108a to heatsink 102, where said material is then cooled. Said material is then returned to base 104 via another flexible pipe 108b.

In at least one embodiment, flexible pipes 108a,b are connected to heatsink 102. In at least one embodiment, said flexible pipes 108a,b are connected to respective inlets and outlets of heatsink 102. Material from a flexible pipe 108a enters through an inlet, is circulated through heatsink 102 and cooled, and is then returned through an outlet.

In at least one embodiment, a position of heatsink 102 is adjustable. In at least one embodiment, a position of heatsink 102 is diagonally, horizontally, vertically, or rotationally adjustable. For example, in at least one embodiment, heatsink 102 can be raised or lowered in a vertical adjustment. In at least one embodiment, heatsink 102 can be shifted, in a horizontal adjustment, to the left, right, forwards, or backwards. In at least one embodiment, one end of heatsink 102 can be raised relative to another end, in a diagonal adjustment. In at least one embodiment, heatsink 102 can be rotated about an axis, in a rotational adjustment. In at least one embodiment, horizontal and vertical adjustments are with respect to a plane defined by a surface on which one or more processors are mounted. In such an embodiment, vertical adjustments are perpendicular to said plane, and horizontal adjustments are parallel to said plan.

In at least one embodiment, heatsink 102 and base 104 are attached to each other via one or more supports 110. In at least one embodiment, support 110 facilitates adjustment of a heatsink's 102 position. In at least one embodiment, said adjustment may be made while heatsink 102 is connected, via flexible pipes 108a,b, to base 104. In at least one embodiment, heatsink assembly 100 may be provided as an integrated unit that can be installed and adjusted according to a particular chassis configuration. For example, in at least one embodiment, a position of a heatsink assembly 100 can be adjusted during or after installation on a chassis, to accommodate placement constraints imposed by other components on said chassis, to optimize airflow to heatsink 102, or to optimize airflow to other components.

In at least one embodiment, heatsink 102, flexible pipes 108a,b, and base 104 are components of a loop thermosiphon system. In at embodiment, material is a reservoir or evaporator in base 104 is heated by heat generated by operation of one or more processors 106. In at least one embodiment, said material may be whole or partially converted, by heating, to a gas or vapor. In at least one embodiment, said material is then conveyed by flexible pipe 108a to heatsink 102. In at least one embodiment, heatsink 102 comprises a condenser or a plate heat exchanger. In at least one embodiment, said material is circulated through heatsink 102 and cooled. In at least one embodiment, heat from said material is transferred to heatsink 102 and dissipated.

In at least one embodiment, airflow over a heatsink 102 assists heat dissipation. In at least one embodiment, increased airflow over heatsink 102 improves heat dissipation. In at least one embodiment, lower temperature air, in airflow over heatsink 102, improves heat dissipation. In at least one embodiment, airflow from heatsink 102 may have increased temperature due to heat dissipation, such that airflow to other components, including other heatsinks, may have increased temperature.

Figure 2:
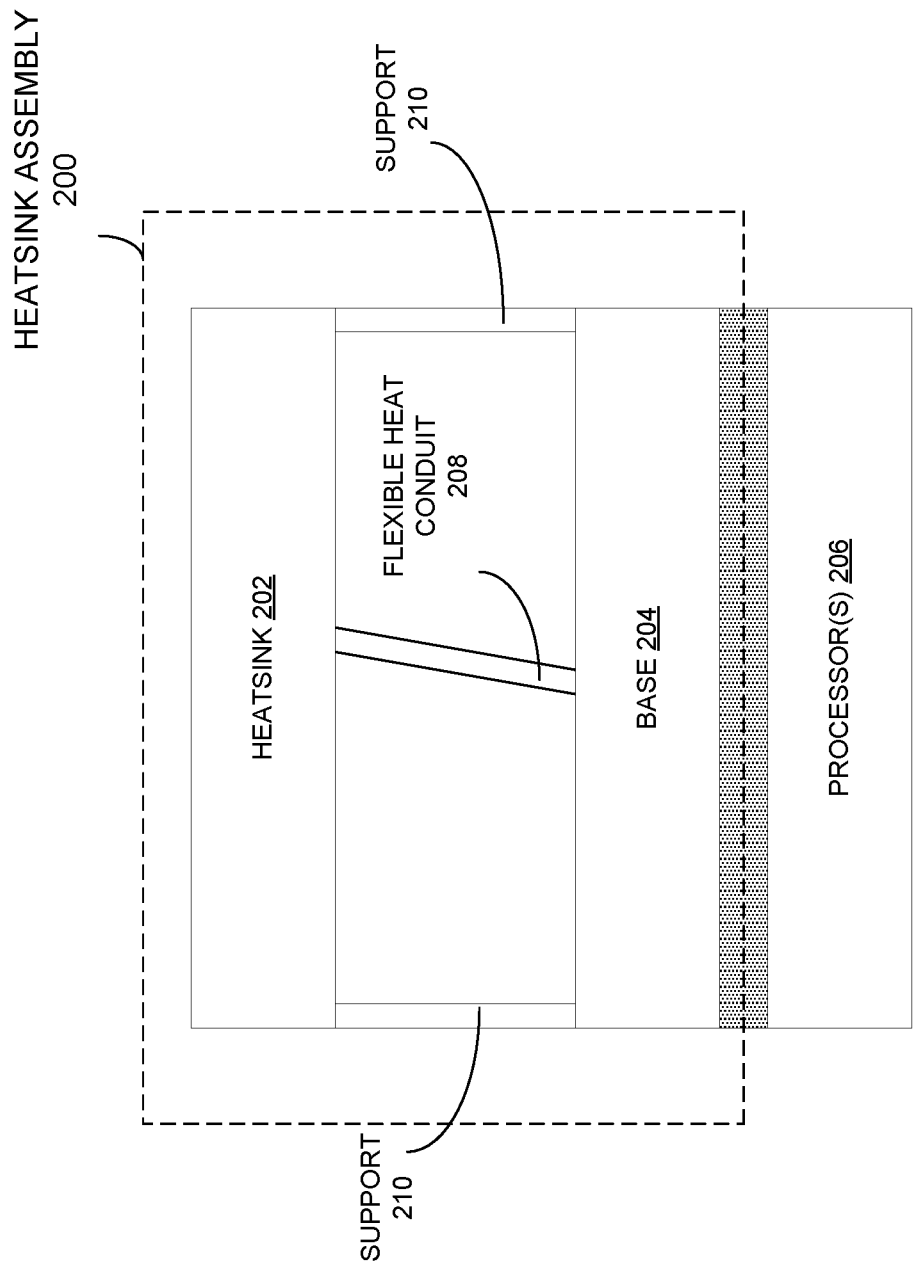
FIG. 2 illustrates a configurable heatsink assembly, according to at least one embodiment.

FIG. 2 illustrates a configurable heatsink assembly, according to at least one embodiment. In at least one embodiment, a heatsink assembly 200 comprises a heatsink 202, a flexible heat conduit 208, and a base 204. In at least one embodiment, heatsink assembly 200 further comprises a support 210.

In at least one embodiment, a heatsink 202 is designed to transfer or dissipate heat. In at least one embodiment, heatsink 202 comprises a thermally-conductive material, such as aluminum alloys, copper, copper-tungsten alloys or pseudo-alloys, various other metal alloys, various composite materials, diamond and diamond-based materials, and so forth. In at least one embodiment, heatsink 202 is shaped to facilitate efficient transfer or dissipation of heat. In at least one embodiment, heatsink 202 comprises fins or protuberances to facilitate efficient transfer or dissipation of heat.

In at least one embodiment, heatsink assembly 200 comprises a base 204. In at least one embodiment, a heatsink 202 is attached to said one or more processors via base 204. In at least one embodiment, base 204 is attached to one or more processors 206 using a material facilitating a thermal interface between said base 204 and said one or more processors 206. In at least one embodiment, said thermal interface comprises a thermal adhesive, a thermal grease, a thermally conductive pad, or some other attachment mechanism or facilitator that is compatible with or promotes thermal conductivity. In at least one embodiment, base 204 is a component of a loop siphon system.

In at least one embodiment, base 204 is heated by heat emitted by operation of the one or more processors 206. In at least one embodiment, said heat is transferred to a flexible heat conduit 208. In at least one embodiment, flexible heat conduit 208 is attached to base 204. In at least one embodiment, flexible heat conduit 208 is attached to base 204 using a material facilitating a thermal interface between base 204 and one or more processors 106. In at least one embodiment, said thermal interface comprises thermal adhesive, thermal grease, a thermally conductive pad, or some other attachment mechanism or facilitator that is compatible with or promotes thermal conductivity.

In at least one embodiment, flexible heat conduit 208 may be bent, twisted, or otherwise reoriented while attached to base 204 and heatsink 202, so that heatsink 102 can be configured in various positions. In at least one embodiment, flexible heat conduit 208 has flexibility sufficient to permit a desired range of adjustment of heatsink 202.

In at least one embodiment, flexible heat conduit 208 is attached to heatsink 202. In at least one embodiment, flexible heat conduits 208 is attached to heatsink 202 using a material facilitating a thermal interface between said base 104 and said one or more processors 106. In at least one embodiment, said thermal interface comprises thermal adhesive, thermal grease, a thermally conductive pad, or some other attachment mechanism or facilitator that is compatible with or promotes thermal conductivity.

In at least one embodiment, heatsink 202 is adjustable by position. In at least one embodiment, a position of heatsink 202 is diagonally, horizontally, vertically, or rotationally adjustable. For example, in at least one embodiment, heatsink 202 can be raised or lowered in a vertical adjustment. In at least one embodiment, heatsink 202 can be shifted, in a horizontal adjustment, to the left, right, forwards, or backwards. In at least one embodiment, one end of heatsink 202 can be raised relative to another end, in a diagonal adjustment. In at least one embodiment, heatsink 202 can be rotated about an axis, in a rotational adjustment. In at least one embodiment, horizontal and vertical adjustments are with respect to a plane defined by a surface on which one or more processors 206 are mounted. In such an embodiment, vertical adjustments are perpendicular to said plane, and horizontal adjustments are parallel to said plan.

In at least one embodiment, heatsink 202 and base 204 are attached to each other via one or more supports 210. In at least one embodiment, support 210 facilitates adjustment of heatsink's 202 position. In at least one embodiment, said adjustment may be made while heatsink 202 is connected, via flexible heat conduit 208, to base 204. In at least one embodiment, heatsink assembly 200 may be provided as an integrated unit that can be installed and adjusted to accommodate a particular chassis configuration. For example, in at least one embodiment, heatsink assembly 200 can be adjusted during or after installation on a chassis, so that it's positioning can accommodate constraints imposed by other components on said chassis. In at least one embodiment, positioning of heatsink 202 is adjusted to optimize airflow to heatsink 202, or to optimize airflow to another component in said chassis, such as another heatsink.

Figure 3:
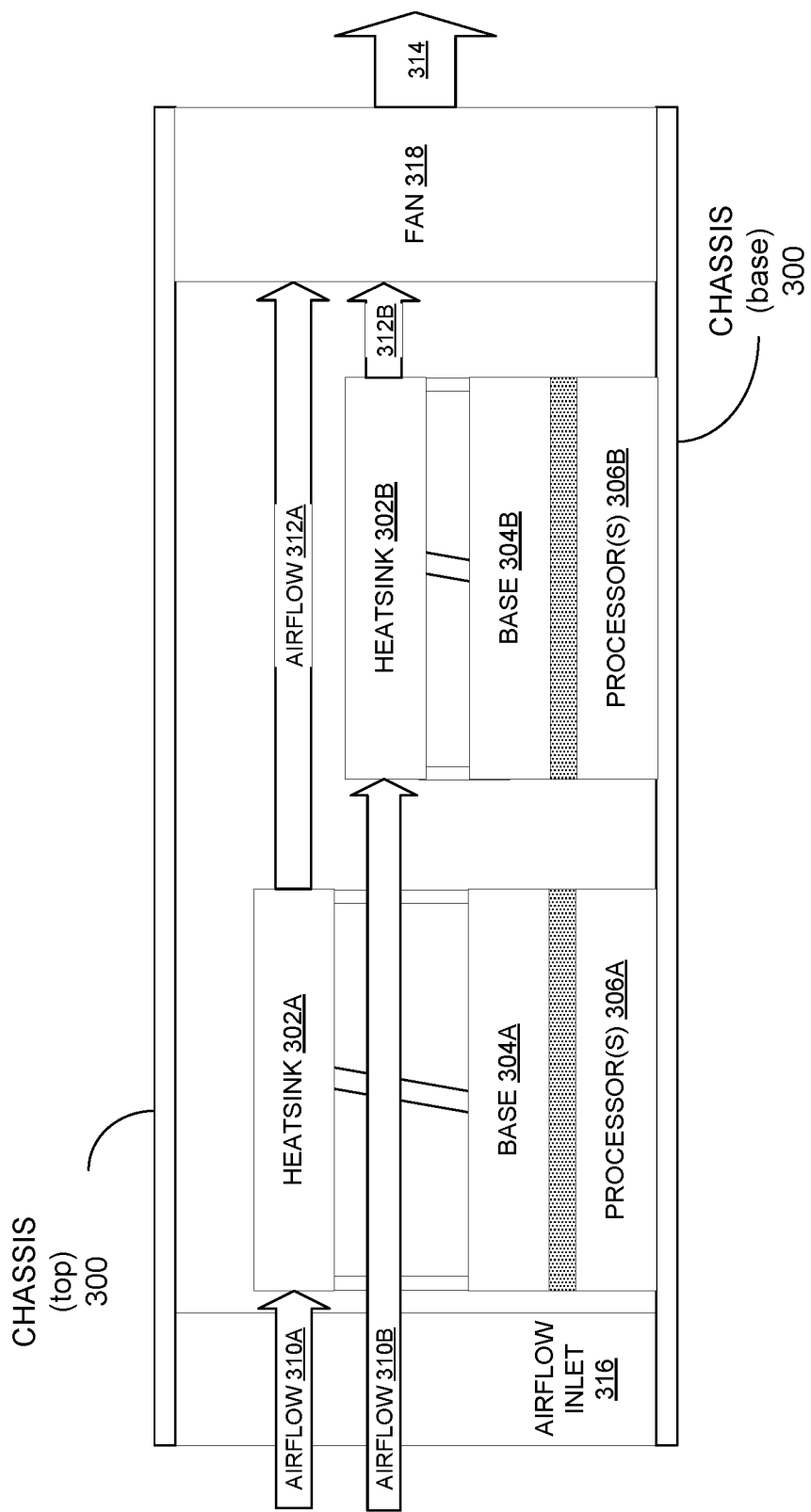
FIG. 3 illustrates a system comprising two or more configurable heatsink assemblies, according to at least one embodiment.

FIG. 3 illustrates a system comprising two or more configurable heatsink assemblies, according to at least one embodiment. In at least one embodiment, a chassis 300 comprises two or more heatsink assemblies, each comprising a heatsink 302 attached to a base 304 by a flexible heat conduit and one or more supports. In at least one embodiment, a chassis 300 is a case or other enclosure. In at least one embodiment, a chassis 300 is a motherboard or other circuit board.

In at least one embodiment, airflow 310 over a chassis 300 is facilitated by a fan 318. In at least one embodiment, airflow 310 over a chassis 300 is facilitated by an airflow inlet 316 and a fan 318.

In at least one embodiment, airflow 310A is drawn through airflow inlet 316 and into chassis 300 by fan 318. In at least one embodiment, airflow 310A flows around, over, or through heatsink 302A, where it is heated. Heated airflow 312A from heatsink 302A is drawn by fan 318 out of the chassis 300 as airflow 314.

In at least one embodiment, airflow 310B is drawn through airflow inlet 316 and into chassis 300 by fan 318. In at least one embodiment, a substantial portion of airflow 310B is under heatsink 302A. In at least one embodiment, airflow 310B is not significantly heated by said heatsink 302, and is delivered to a second heatsink 302B with a cooler temperature. Said second heatsink 302B dissipates heat into airflow 310B, as heated airflow 312B. Said heated airflow 312B is then drawn by fan 318 out of chassis 300. In at least one embodiment, lower temperature of said airflow 310 improves heat dissipation of said second heatsink 302B.

In at least one embodiment, respective positions of heatsinks 302A,B can be adjusted to accommodate a wide variety of chassis configurations. In at least one embodiment, said adjustments can be made during or after installation of processors 306 and heatsink assemblies into chassis 300. In at least one embodiment, positions of processors 306A,B is fixed, as are positions of corresponding bases 304A,B. However, in at least one embodiment, positions of heatsinks 302A,B can be adjusted, e.g., to improve airflow or to accommodate placement within chassis 300, even where other components might otherwise prevent such placement. In at least one embodiment, heatsinks 302A,B may be made larger than would otherwise be practical, based on said adjustments making positioning of said heatsinks 302A,B more flexible.

Figure 4:
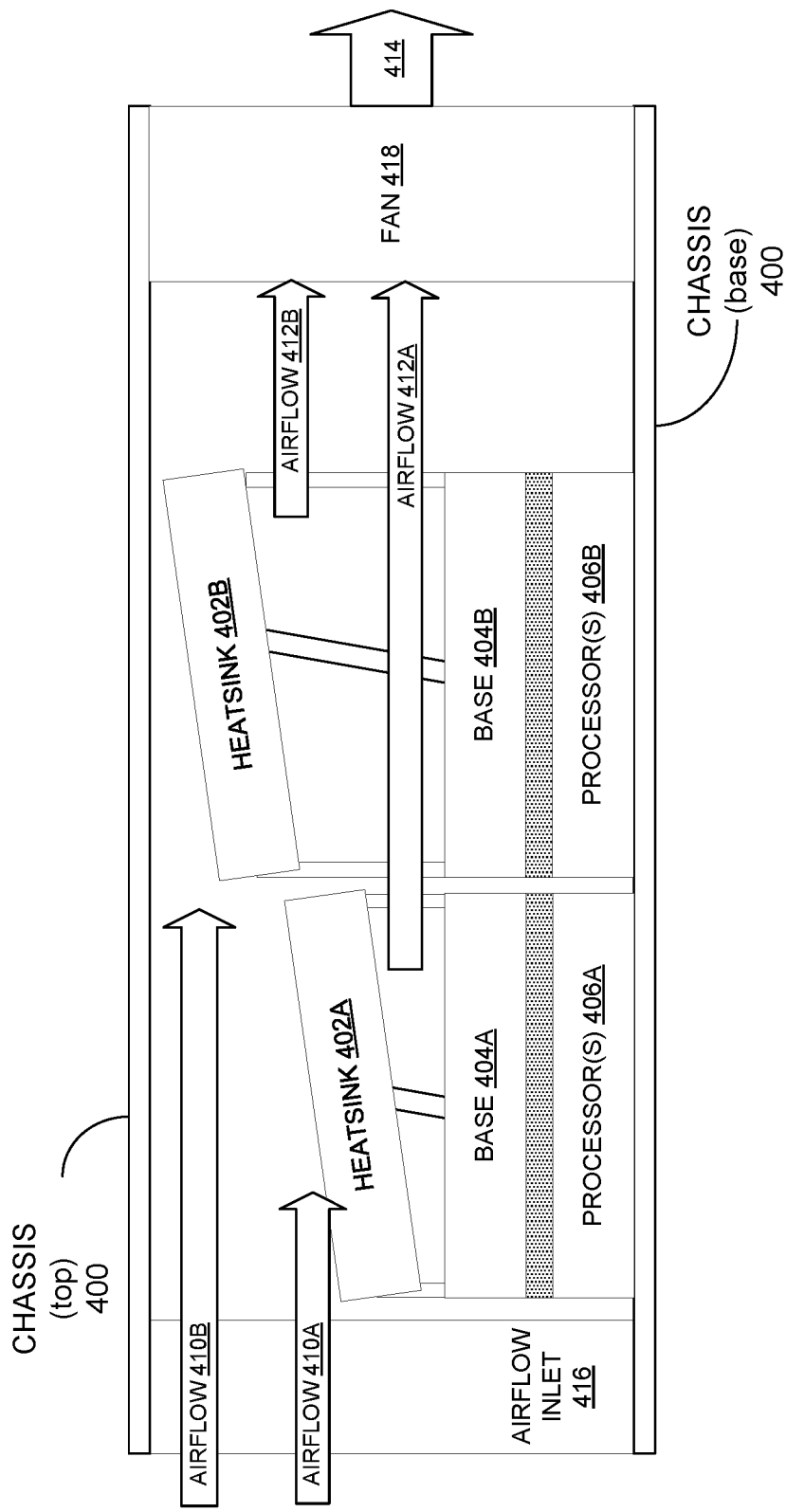
FIG. 4 illustrates a system comprising two or more angularly configurable heatsink assemblies, according to at least one embodiment.

FIG. 4 illustrates a system comprising two or more angularly configurable heatsink assemblies, according to at least one embodiment. In at least one embodiment, a chassis 400 comprises two or more heatsink assemblies, each comprising a heatsink 402 attached to a base 404 by a flexible heat conduit and one or more supports.

In at least one embodiment, airflow 410 over a chassis 400 is facilitated by a fan 418. In at least one embodiment, airflow 410 over a chassis 400 is facilitated by an airflow inlet 416 and a fan 418.

In at least one embodiment, airflow 410B is drawn through airflow inlet 416 and into chassis 400 by fan 418. In at least one embodiment, airflow 410B flows over a first heatsink 402A, at a distance such that its temperature is not substantially affected by said heatsink 402A. In at least one embodiment, said airflow 410B is received by a second heatsink 402B, aiding heat dissipation by said second heatsink 402B. Heated airflow 412B from heatsink 402B may then be ejected from underneath heatsink 402B, and drawn by fan 418 out of chassis 400 as airflow 414.

In at least one embodiment, airflow 410A is drawn through airflow inlet 416 and into chassis 400 by fan 418. In at least one embodiment, said airflow 410A is received by a heatsink 402A, aiding heat dissipation by said heatsink 402A. In at least one embodiment, heated airflow 412A is then ejected from underneath said heatsink 402A, as airflow 412A, and drawn from chassis 400 as airflow 414. In at least one embodiment, second heatsink 402B is raised, relative to first heatsink 402A, so that airflow 412A does not substantially affect operation of said second heatsink 402B. In at least one embodiment, said adjustments may be made during or after installation of respective heatsink assemblies into chassis 400.

In at least one embodiment, respective positions of heatsinks 402A,B can be adjusted to accommodate a variety of chassis configurations. In at least one embodiment, said adjustments can be made during or after installation of processors 406, heatsink assemblies, and other components into a chassis 400. For example, in at least one embodiment, positions of processors 406A,B are fixed, as are positions of corresponding bases 304A,B since these are attached to respective processors 406A,B. However, in at least one embodiment, positions of heatsinks 402A,B can be adjusted to improve airflow or to accommodate placement within chassis 400, even if components installed in said chassis 400 might otherwise prevent such placement. In at least one embodiment, heatsinks 402A,B may be larger than would otherwise be practical.

In at least one embodiment, baffles are added to chassis 400 to further optimize or tune airflow. In at least one embodiment, a baffle comprise a material to obstruct airflow. In at least one embodiment, a baffles is inserted to seal a gap between an adjusted heatsink position and a chassis wall or divider.

In at least one embodiment, heatsink positions 402A,B are adjusted to increase airflow utilization. In at least one embodiment, airflow utilization includes utilization of airflow generated by a fan 418. For example, in at least one embodiment, a fan generates airflow, a portion of which is directed to heatsinks 402A,B. In at least one embodiment, increasing the size of this portion may improve heat dissipation by heatsinks 402A,B. In at least one embodiment, this improvement may occur even if some percentage of this airflow comprises pre-heated air.

Figure 5:
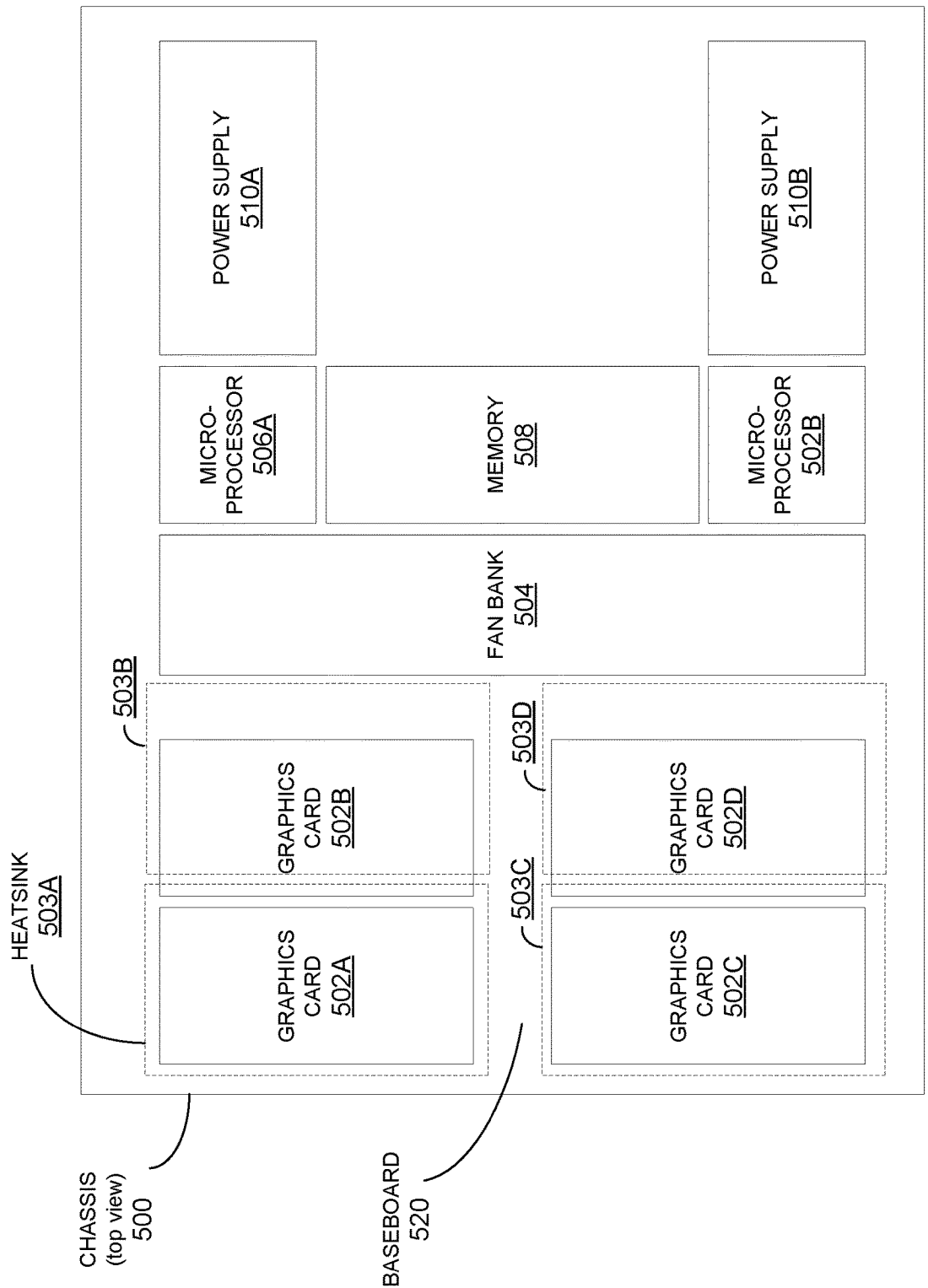
FIG. 5 illustrates an example of a graphics-processing unit with adjustable heatsink, according to at least one embodiment.

FIG. 5 illustrates an example of a graphics-processing unit with adjustable heatsink, according to at least one embodiment. In at least one embodiment, a chassis 500 comprises a baseboard 520 on which a variety of components are mounted. In at least one embodiment, baseboard 520 is a motherboard. In at least one embodiments, components mounted to a baseboard 520 comprise power supplies 510, microprocessors 506, memory 508, and a fan bank 504. In at least one embodiment, baseboard 520 comprises one or more slots for installing hardware, such as graphics cards, which comprise graphics processing units (GPUs). In at least one embodiment, said slots are peripheral component interface ("PCI") slots. In at least one embodiment, said slots are high-speed PCI slots, such as PCI-E and PCI-X slots.

In at least one embodiment, configuration of components, such as power supplies 510, microprocessors 506, memory 508, and fan bank 504, is finalized prior to identifying graphics cards to be installed in chassis 500. For example, in at least one embodiment, a chassis 500 configuration is determined without identifying which graphics card, or graphics cards, will be installed. In at least one embodiment, baseboard 520 comprises one or more slots for installing graphics cards, such as PCI, PCI-E, or PCI-X slots. In at least one embodiment, configuration of said slots is finalized prior to identifying graphics cards to be installed in chassis 500.

In at least one embodiment, graphics cards 502A-D are installed on baseboard 520. In at least one embodiment, a graphics card, such as any of graphics cards 502A-D, comprises a heatsink assembly, such as the heatsink assemblies depicted in FIG. 1 or 2, and one or more processors, such as graphics processing units.

In at least one embodiment, heatsinks 503A-D of graphics cards 502A-D are adjusted to allow graphics cards 502A-D to be placed within chassis 500, or to fit on baseboard 520. In at least one embodiment, said placement is enabled by adjustment of heatsink position(s). For example, in at least one embodiment, a component such as fan bank 504 might prevent installation of a graphics card with a non-configurable heatsink, particularly if that heatsink is sized larger than standard-sized. In at least one embodiment, graphics cards 502A-D comprise larger than-standard sized heatsinks 503A-D, but may be fit into a chassis designed for standard-sized heatsinks by adjustment of heatsink positioning. In at least one embodiment, a graphics card with an enlarged heatsink is capable of more efficient heat dissipation than a corresponding graphics card with a standard-sized heatsink, due to having greater surface area than a standard-sized heatsink.

Figure 6:
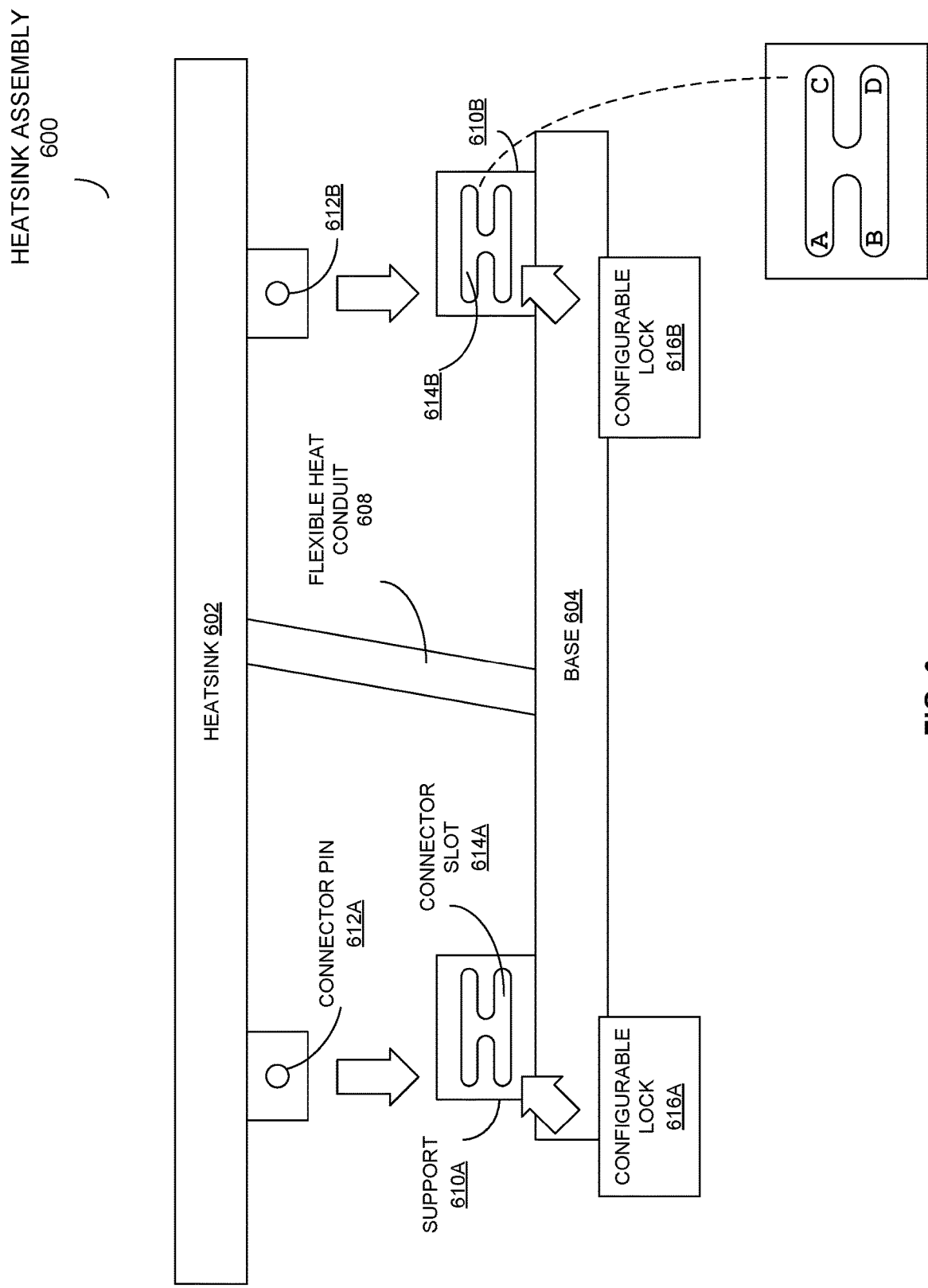
FIG. 6 illustrates a heatsink assembly with multi-position supports, according to at least one embodiment.

FIG. 6 illustrates a heatsink assembly with multi-position supports, according to at least one embodiment. In at least one embodiment, a heatsink assembly 600 comprises a heatsink 602 connected to a base 604 by a flexible heat conduit 608. In at least one embodiment, flexible heat conduit 608 corresponds to a flexible heat conduit depicted in FIG. 1 or 2. In at least one embodiment, heatsink assembly further comprises supports 610A,B attached to base 604. In at least one embodiment, connector pins 612A,B on heatsink 602 connect to supports 610A,B. In at least one embodiment, connector pins 612A,B are inserted through slots 614A,B of supports 610A,B. In at least one embodiment, a configurable lock 616A may be placed on support 610A to secure connector pin 612A to a location in slot 614A, and thereby secure heatsink 602 to a particular position. In at least one embodiment, a configurable lock 616A,B does not require tools when used to secure heatsink 602 to a position. In at least one embodiment, configuration of a configurable lock 616A,B comprises attachment of said lock to a connector pin 612A,B at a position on said lock that secures heatsink 602 in one of a plurality of possible positions.

In at least one embodiment, slots 614A,B and configurable locks 616A,B are capable of fixing each connector pin 612A,B to one of four positions A, B, C, D on a respective slot 614A,B. In at least one embodiment, a left-side connector pin 612A may be placed in positions A or B on a left-side support 610A, and right-side connector pin 614B may be placed in positions A or B on a right-side support 610B. Likewise, in at least one embodiment, a left-side connector pin 612A may be placed in positions C or D on a left-side support 610A, and right-side connector pin 614B may be placed in positions C or D on a right-side support 610B. Placement in these various positions allows heatsink 602 to be adjusted horizontally, vertically, and diagonally.

Figure 7:
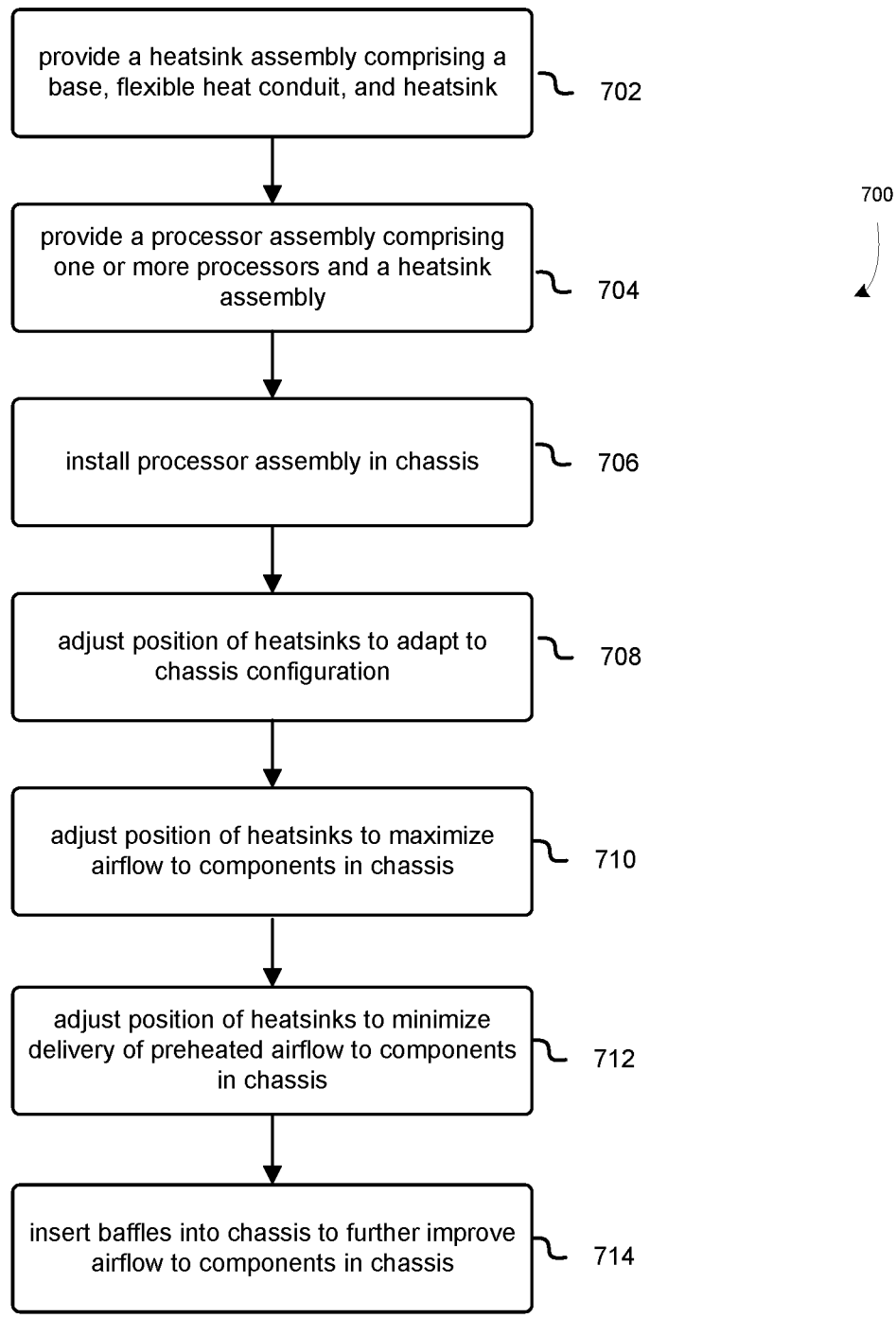
FIG. 7 illustrates an example process of configuring a heatsink assembly, according to at least one embodiment.

FIG. 7 illustrates an example process 700 of configuring a heatsink assembly, according to at least one embodiment. Although FIG. 7 is depicted as a sequence of steps, the depicted sequence should not be construed as limiting the scope of potential embodiments to only those embodiments which conform to a depicted sequence. For example, except where logically required, depicted steps may be re-ordered or performed in parallel. In at least some embodiments, certain steps may be omitted. In at least some embodiments, additional steps may be added.

At 702, in at least one embodiment, a heatsink assembly is provided. In at least one embodiment, said heatsink assembly comprises a base, a flexible heat conduit, and a heatsink.

In at least one embodiment, a heatsink assembly is provided as a unit and then attached, by an original equipment manufacturer, end-user, or other entity, to one or more processors. In at least one embodiment, said one or more processors comprise graphics processing units. In at least one embodiment, said one or more processors are central processing units ("CPUs").

At 704, in at least one embodiment, a processor assembly is provided. In at least one embodiment, said processor assembly comprises one or more processors and a heatsink assembly attached to said one or more processors. In at least one embodiment, said one or more processors comprise graphics processing units. In at least one embodiment, said one or more processors are CPUs. In at least one embodiment, a processor assembly is a graphics card.

At 706, in at least one embodiment, a processor assembly is installed in a chassis. In at least one embodiment, a processor assembly, such as a graphics card, is installed by electronically connecting said processor assembly to a motherboard. In at least one embodiment, installation of a processor assembly comprises inserting a connector of a processor assembly into a slot on a motherboard, such as into a PCI, PCI-E, or PCI-X slot.

At 708, in at least one embodiment, a position of a heatsink is adapted to a chassis configuration. In at least one embodiment, said adaptation comprises positioning said heatsink to fit within a particular chassis configuration. For example, in at least one embodiment, said heatsink is oversized, and its position is manipulated to fit within a chassis designed for processor assemblies whose heatsinks are of a smaller size. In at least one embodiment, said heatsink is adjusted so that it's position does not interfere with placement of other components within a chassis.

At 710, in at least one embodiment, a position of a heatsink is adapted to maximize airflow to components in a chassis. In at least one embodiment, a heatsink is raised or lowered to improve airflow to another component, such as another heatsink. In at least one embodiment, a heatsink is angled to improve airflow to another component. In at least one embodiment, a heatsink is shifted horizontally, vertically, or in some other direction, to improve airflow to another component. In at least one embodiment, a heatsink is raised, lowered, angled, or shifted horizontally, vertically, or in some other direction, to improve airflow to said heatsink.

At 712, in at least one embodiment, a position of a heatsink is adapted to minimize delivery of preheated airflow to components in a chassis. In at least one embodiment, a heatsink is raised or lowered to avoid preheating air delivered to another component, such as another heatsink. In at least one embodiment, a heatsink is angled to avoid delivering preheated air to another component. In at least one embodiment, a heatsink is shifted horizontally, vertically, or in some other direction, to avoid delivering preheated air to another component. In at least one embodiment, preheated air is avoided by moving said heatsink out of a path by which airflow is delivered to a component.

At 714, in at least one embodiment, baffles are added to a chassis to further improve airflow to components in a chassis. For example, in at least one embodiment, baffles are added to improve airflow pressure, to prevent leakage of preheated air, to redirect airflow to areas or compartments, and so forth. In at least one embodiment, baffles are added to areas between an adjusted position of a heatsink and a chassis wall or divider.

In at least one embodiment, a method of manufacturing a computing device comprises installing a heatsink assembly, such as any of those depicted in FIGS. 1-6, in a computing device chassis, and then adjusting a position of a heatsink of said assembly. In at least one embodiment, said adjusting is to improve airflow to one of more of said heatsink, other heatsinks, or other components in said chassis. In at least one embodiment, said adjustment does not require tools.

In at least one embodiment, a method of providing a graphics card comprises providing a graphics card with a heatsink assembly, such as any of those depicted in FIGS. 1-6, attached to one or more processors. In at least one embodiment, a heatsink of said graphics card can be adjusted by a manufacturer of a computing device that is to comprise the graphics card.

In at least one embodiment, a card comprising parallel processing units is provided with a heatsink assembly, such as any of those depicted in FIGS. 1-6, attached to said parallel processing units.

In the following description, numerous specific details are set forth to provide a more thorough understanding of at least one embodiment. However, it will be apparent to one skilled in the art that the inventive concepts may be practiced without one or more of these specific details.

Data Center

Figure 8:
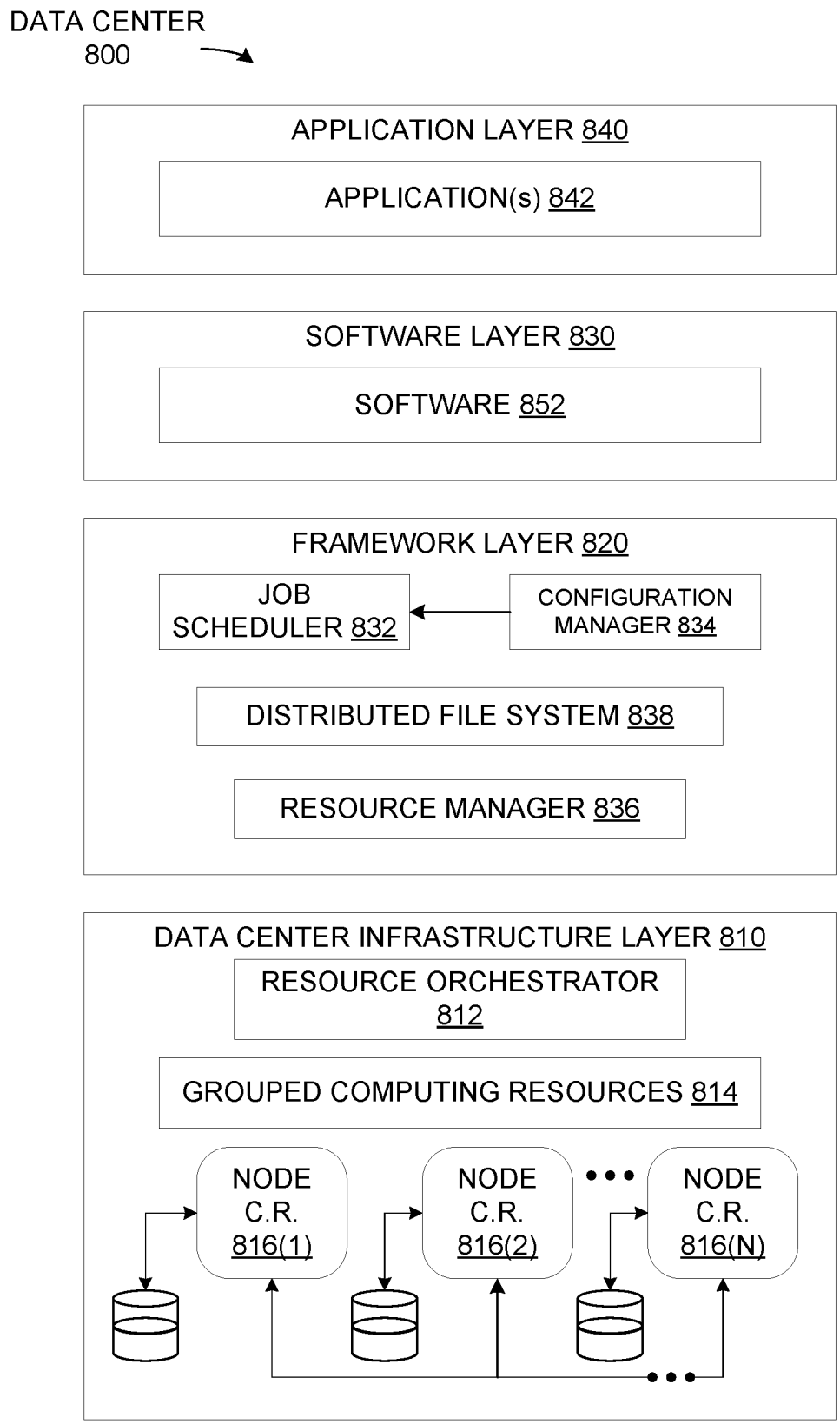
FIG. 8 illustrates an exemplary data center, in accordance with at least one embodiment.

FIG. 8 illustrates an exemplary data center 800, in accordance with at least one embodiment. In at least one embodiment, data center 800 includes, without limitation, a data center infrastructure layer 810, a framework layer 820, a software layer 830 and an application layer 840.

In at least one embodiment, as shown in FIG. 8, data center infrastructure layer 810 may include a resource orchestrator 812, grouped computing resources 814, and node computing resources ("node C.R.s") 816(1)-816(N), where "N" represents any whole, positive integer. In at least one embodiment, node C.R.s 816(1)-816(N) may include, but are not limited to, any number of central processing units ("CPUs") or other processors (including accelerators, field programmable gate arrays ("FPGAs"), graphics processors, etc.), memory devices (e.g., dynamic read-only memory), storage devices (e.g., solid state or disk drives), network input/output ("NW I/O") devices, network switches, virtual machines ("VMs"), power modules, and cooling modules, etc. In at least one embodiment, one or more node C.R.s from among node C.R.s 816(1)-816(N) may be a server having one or more of above-mentioned computing resources.

In at least one embodiment, grouped computing resources 814 may include separate groupings of node C.R.s housed within one or more racks (not shown), or many racks housed in data centers at various geographical locations (also not shown). Separate groupings of node C.R.s within grouped computing resources 814 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 812 may configure or otherwise control one or more node C.R.s 816(1)-816(N) and/or grouped computing resources 814. In at least one embodiment, resource orchestrator 812 may include a software design infrastructure ("SDI") management entity for data center 800. In at least one embodiment, resource orchestrator 812 may include hardware, software or some combination thereof.

In at least one embodiment, as shown in FIG. 8, framework layer 820 includes, without limitation, a job scheduler 832, a configuration manager 834, a resource manager 836 and a distributed file system 838. In at least one embodiment, framework layer 820 may include a framework to support software 852 of software layer 830 and/or one or more application(s) 842 of application layer 840. In at least one embodiment, software 852 or application(s) 842 may respectively include web-based service software or applications, such as those provided by Amazon Web Services, Google Cloud and Microsoft Azure. In at least one embodiment, framework layer 820 may be, but is not limited to, a type of free and open-source software web application framework such as Apache Spark™ (hereinafter "Spark") that may utilize distributed file system 838 for large-scale data processing (e.g., "big data"). In at least one embodiment, job scheduler 832 may include a Spark driver to facilitate scheduling of workloads supported by various layers of data center 800. In at least one embodiment, configuration manager 834 may be capable of configuring different layers such as software layer 830 and framework layer 820, including Spark and distributed file system 838 for supporting large-scale data processing. In at least one embodiment, resource manager 836 may be capable of managing clustered or grouped computing resources mapped to or allocated for support of distributed file system 838 and job scheduler 832. In at least one embodiment, clustered or grouped computing resources may include grouped computing resource 814 at data center infrastructure layer 810. In at least one embodiment, resource manager 836 may coordinate with resource orchestrator 812 to manage these mapped or allocated computing resources.

In at least one embodiment, software 852 included in software layer 830 may include software used by at least portions of node C.R.s 816(1)-816(N), grouped computing resources 814, and/or distributed file system 838 of framework layer 820. One or more types of software may include, but are not limited to, Internet web page search software, e-mail virus scan software, database software, and streaming video content software.

In at least one embodiment, application(s) 842 included in application layer 840 may include one or more types of applications used by at least portions of node C.R.s 816(1)-816(N), grouped computing resources 814, and/or distributed file system 838 of framework layer 820. In at least one or more types of applications may include, without limitation, CUDA applications.

In at least one embodiment, any of configuration manager 834, resource manager 836, and resource orchestrator 812 may implement any number and type of self-modifying actions based on any amount and type of data acquired in any technically feasible fashion. In at least one embodiment, self-modifying actions may relieve a data center operator of data center 800 from making possibly bad configuration decisions and possibly avoiding underutilized and/or poor performing portions of a data center.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Computer-Based Systems

The following FIGS. set forth, without limitation, exemplary computer-based systems that can be used to implement at least one embodiment.

Figure 9:
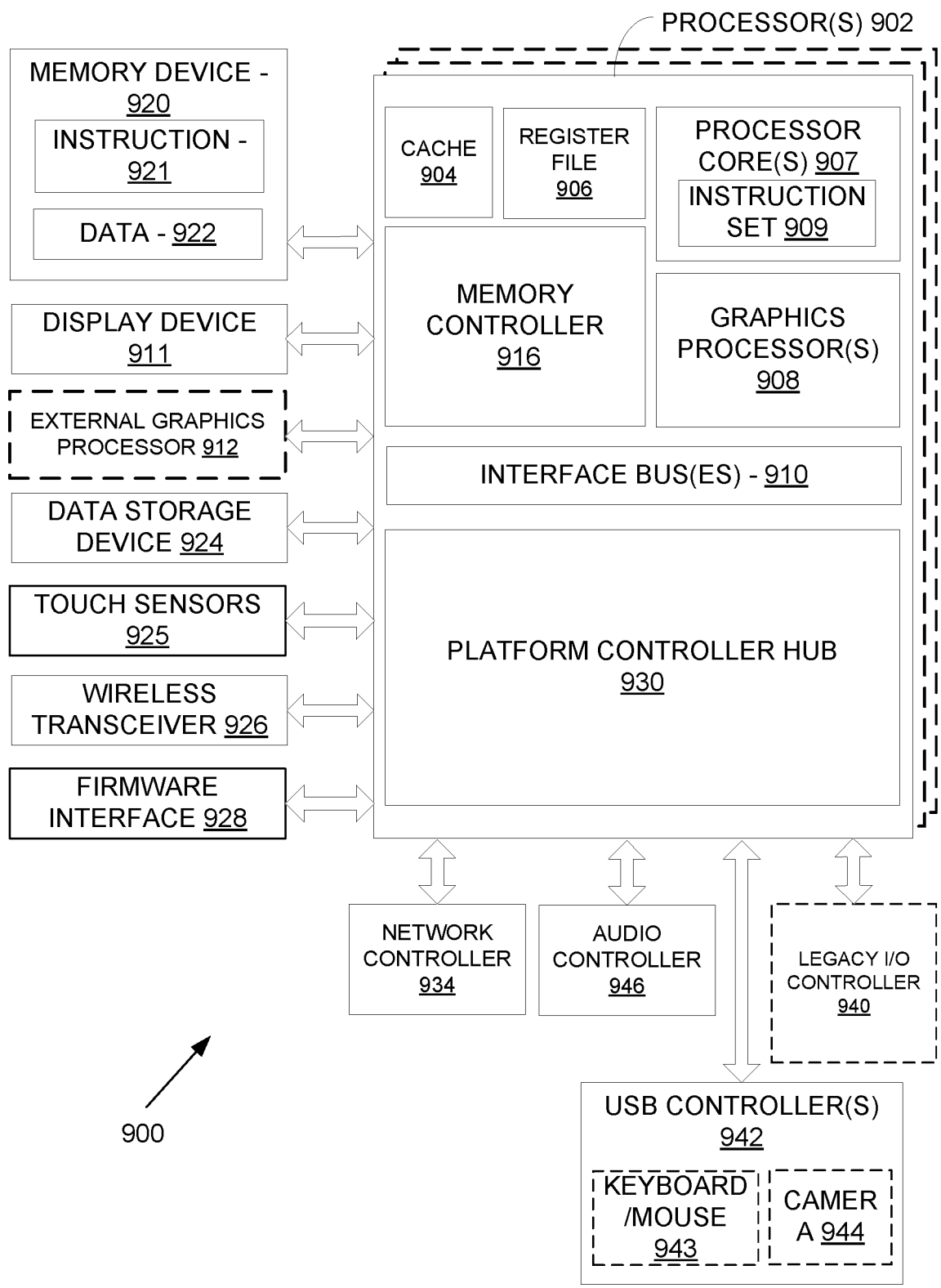
FIG. 9 illustrates a processing system, in accordance with at least one embodiment.

FIG. 9 illustrates a processing system 900, in accordance with at least one embodiment. In at least one embodiment, processing system 900 includes one or more processors 902 and one or more graphics processors 908, and may be a single processor desktop system, a multiprocessor workstation system, or a server system having a large number of processors 902 or processor cores 907. In at least one embodiment, processing system 900 is a processing platform incorporated within a system-on-a-chip ("SoC") integrated circuit for use in mobile, handheld, or embedded devices.

In at least one embodiment, processing system 900 can include, or be incorporated within a server-based gaming platform, a game console, a media console, a mobile gaming console, a handheld game console, or an online game console. In at least one embodiment, processing system 900 is a mobile phone, smart phone, tablet computing device or mobile Internet device. In at least one embodiment, processing system 900 can also include, couple with, or be integrated within a wearable device, such as a smart watch wearable device, smart eyewear device, augmented reality device, or virtual reality device. In at least one embodiment, processing system 900 is a television or set top box device having one or more processors 902 and a graphical interface generated by one or more graphics processors 908.

In at least one embodiment, one or more processors 902 each include one or more processor cores 907 to process instructions which, when executed, perform operations for system and user software. In at least one embodiment, each of one or more processor cores 907 is configured to process a specific instruction set 909. In at least one embodiment, instruction set 909 may facilitate Complex Instruction Set Computing ("CISC"), Reduced Instruction Set Computing ("RISC"), or computing via a Very Long Instruction Word ("VLIW"). In at least one embodiment, processor cores 907 may each process a different instruction set 909, which may include instructions to facilitate emulation of other instruction sets. In at least one embodiment, processor core 907 may also include other processing devices, such as a digital signal processor ("DSP").

In at least one embodiment, processor 902 includes cache memory ("cache") 904. In at least one embodiment, processor 902 can have a single internal cache or multiple levels of internal cache. In at least one embodiment, cache memory is shared among various components of processor 902. In at least one embodiment, processor 902 also uses an external cache (e.g., a Level 3 ("L3") cache or Last Level Cache ("LLC")) (not shown), which may be shared among processor cores 907 using known cache coherency techniques. In at least one embodiment, register file 906 is additionally included in processor 902 which may include different types of registers for storing different types of data (e.g., integer registers, floating point registers, status registers, and an instruction pointer register). In at least one embodiment, register file 906 may include general-purpose registers or other registers.

In at least one embodiment, one or more processor(s) 902 are coupled with one or more interface bus(es) 910 to transmit communication signals such as address, data, or control signals between processor 902 and other components in processing system 900. In at least one embodiment interface bus 910, in one embodiment, can be a processor bus, such as a version of a Direct Media Interface ("DMI") bus. In at least one embodiment, interface bus 910 is not limited to a DMI bus, and may include one or more Peripheral Component Interconnect buses (e.g., "PCI," PCI Express ("PCIe")), memory buses, or other types of interface buses. In at least one embodiment processor(s) 902 include an integrated memory controller 916 and a platform controller hub 930. In at least one embodiment, memory controller 916 facilitates communication between a memory device and other components of processing system 900, while platform controller hub ("PCH") 930 provides connections to Input/Output ("I/O") devices via a local I/O bus.

In at least one embodiment, memory device 920 can be a dynamic random access memory ("DRAM") device, a static random access memory ("SRAM") device, flash memory device, phase-change memory device, or some other memory device having suitable performance to serve as processor memory. In at least one embodiment memory device 920 can operate as system memory for processing system 900, to store data 922 and instructions 921 for use when one or more processors 902 executes an application or process. In at least one embodiment, memory controller 916 also couples with an optional external graphics processor 912, which may communicate with one or more graphics processors 908 in processors 902 to perform graphics and media operations. In at least one embodiment, a display device 911 can connect to processor(s) 902. In at least one embodiment display device 911 can include one or more of an internal display device, as in a mobile electronic device or a laptop device or an external display device attached via a display interface (e.g., DisplayPort, etc.). In at least one embodiment, display device 911 can include a head mounted display ("HMD") such as a stereoscopic display device for use in virtual reality ("VR") applications or augmented reality ("AR") applications.

In at least one embodiment, platform controller hub 930 enables peripherals to connect to memory device 920 and processor 902 via a high-speed I/O bus. In at least one embodiment, I/O peripherals include, but are not limited to, an audio controller 946, a network controller 934, a firmware interface 928, a wireless transceiver 926, touch sensors 925, a data storage device 924 (e.g., hard disk drive, flash memory, etc.). In at least one embodiment, data storage device 924 can connect via a storage interface (e.g., SATA) or via a peripheral bus, such as PCI, or PCIe. In at least one embodiment, touch sensors 925 can include touch screen sensors, pressure sensors, or fingerprint sensors. In at least one embodiment, wireless transceiver 926 can be a Wi-Fi transceiver, a Bluetooth transceiver, or a mobile network transceiver such as a 3G, 4G, or Long Term Evolution ("LTE") transceiver. In at least one embodiment, firmware interface 928 enables communication with system firmware, and can be, for example, a unified extensible firmware interface ("UEFI"). In at least one embodiment, network controller 934 can enable a network connection to a wired network. In at least one embodiment, a high-performance network controller (not shown) couples with interface bus 910. In at least one embodiment, audio controller 946 is a multi-channel high definition audio controller. In at least one embodiment, processing system 900 includes an optional legacy I/O controller 940 for coupling legacy (e.g., Personal System 2 ("PS/2")) devices to processing system 900. In at least one embodiment, platform controller hub 930 can also connect to one or more Universal Serial Bus ("USB") controllers 942 connect input devices, such as keyboard and mouse 943 combinations, a camera 944, or other USB input devices.

In at least one embodiment, an instance of memory controller 916 and platform controller hub 930 may be integrated into a discreet external graphics processor, such as external graphics processor 912. In at least one embodiment, platform controller hub 930 and/or memory controller 916 may be external to one or more processor(s) 902. For example, in at least one embodiment, processing system 900 can include an external memory controller 916 and platform controller hub 930, which may be configured as a memory controller hub and peripheral controller hub within a system chipset that is in communication with processor(s) 902.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 10:
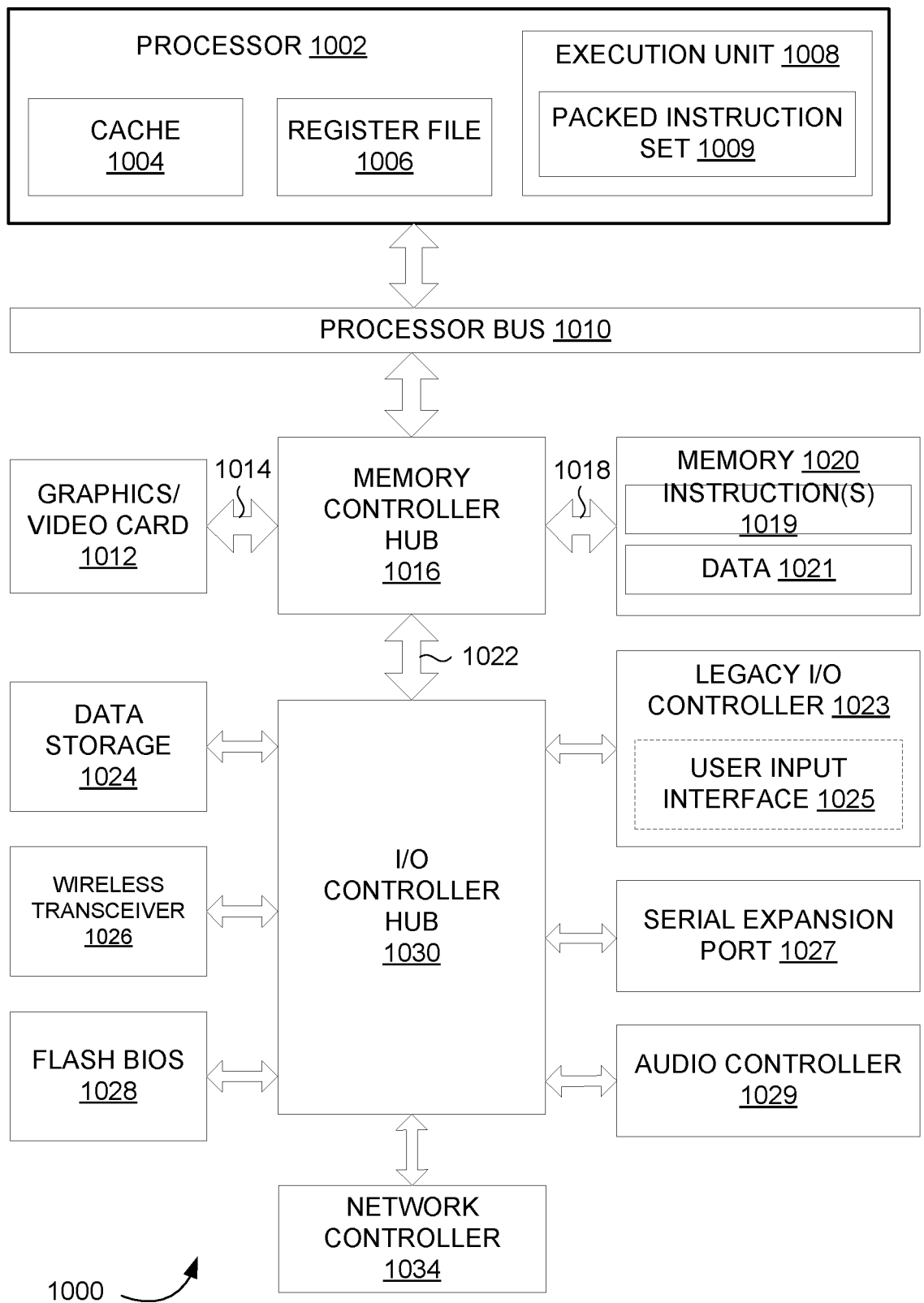
FIG. 10 illustrates a computer system, in accordance with at least one embodiment.

FIG. 10 illustrates a computer system 1000, in accordance with at least one embodiment. In at least one embodiment, computer system 1000 may be a system with interconnected devices and components, an SOC, or some combination. In at least on embodiment, computer system 1000 is formed with a processor 1002 that may include execution units to execute an instruction. In at least one embodiment, computer system 1000 may include, without limitation, a component, such as processor 1002 to employ execution units including logic to perform algorithms for processing data. In at least one embodiment, computer system 1000 may include processors, such as PENTIUM® Processor family, Xeon™, Itanium®, XScale™ and/or StrongARM™, Intel® Core™, or Intel® Nervana™ microprocessors available from Intel Corporation of Santa Clara, Calif., although other systems (including PCs having other microprocessors, engineering workstations, set-top boxes and like) may also be used. In at least one embodiment, computer system 1000 may execute a version of WINDOWS' operating system available from Microsoft Corporation of Redmond, Wash., although other operating systems (UNIX and Linux for example), embedded software, and/or graphical user interfaces, may also be used.

In at least one embodiment, computer system 1000 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions.

In at least one embodiment, computer system 1000 may include, without limitation, processor 1002 that may include, without limitation, one or more execution units 1008 that may be configured to execute a Compute Unified Device Architecture ("CUDA") (CUDA® is developed by NVIDIA Corporation of Santa Clara, Calif.) program. In at least one embodiment, a CUDA program is at least a portion of a software application written in a CUDA programming language. In at least one embodiment, computer system 1000 is a single processor desktop or server system. In at least one embodiment, computer system 1000 may be a multiprocessor system. In at least one embodiment, processor 1002 may include, without limitation, a CISC microprocessor, a RISC microprocessor, a VLIW microprocessor, a processor implementing a combination of instruction sets, or any other processor device, such as a digital signal processor, for example. In at least one embodiment, processor 1002 may be coupled to a processor bus 1010 that may transmit data signals between processor 1002 and other components in computer system 1000.

In at least one embodiment, processor 1002 may include, without limitation, a Level 1 ("L1") internal cache memory ("cache") 1004. In at least one embodiment, processor 1002 may have a single internal cache or multiple levels of internal cache. In at least one embodiment, cache memory may reside external to processor 1002. In at least one embodiment, processor 1002 may also include a combination of both internal and external caches. In at least one embodiment, a register file 1006 may store different types of data in various registers including, without limitation, integer registers, floating point registers, status registers, and instruction pointer register.

In at least one embodiment, execution unit 1008, including, without limitation, logic to perform integer and floating point operations, also resides in processor 1002. Processor 1002 may also include a microcode ("ucode") read only memory ("ROM") that stores microcode for certain macro instructions. In at least one embodiment, execution unit 1008 may include logic to handle a packed instruction set 1009. In at least one embodiment, by including packed instruction set 1009 in an instruction set of a general-purpose processor 1002, along with associated circuitry to execute instructions, operations used by many multimedia applications may be performed using packed data in a general-purpose processor 1002. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, execution unit 1008 may also be used in microcontrollers, embedded processors, graphics devices, DSPs, and other types of logic circuits. In at least one embodiment, computer system 1000 may include, without limitation, a memory 1020. In at least one embodiment, memory 1020 may be implemented as a DRAM device, an SRAM device, flash memory device, or other memory device. Memory 1020 may store instruction(s) 1019 and/or data 1021 represented by data signals that may be executed by processor 1002.

In at least one embodiment, a system logic chip may be coupled to processor bus 1010 and memory 1020. In at least one embodiment, the system logic chip may include, without limitation, a memory controller hub ("MCH") 1016, and processor 1002 may communicate with MCH 1016 via processor bus 1010. In at least one embodiment, MCH 1016 may provide a high bandwidth memory path 1018 to memory 1020 for instruction and data storage and for storage of graphics commands, data and textures. In at least one embodiment, MCH 1016 may direct data signals between processor 1002, memory 1020, and other components in computer system 1000 and to bridge data signals between processor bus 1010, memory 1020, and a system I/O 1022. In at least one embodiment, system logic chip may provide a graphics port for coupling to a graphics controller. In at least one embodiment, MCH 1016 may be coupled to memory 1020 through high bandwidth memory path 1018 and graphics/video card 1012 may be coupled to MCH 1016 through an Accelerated Graphics Port ("AGP") interconnect 1014.

In at least one embodiment, computer system 1000 may use system I/O 1022 that is a proprietary hub interface bus to couple MCH 1016 to I/O controller hub ("ICH") 1030. In at least one embodiment, ICH 1030 may provide direct connections to some I/O devices via a local I/O bus. In at least one embodiment, local I/O bus may include, without limitation, a high-speed I/O bus for connecting peripherals to memory 1020, a chipset, and processor 1002. Examples may include, without limitation, an audio controller 1029, a firmware hub ("flash BIOS") 1028, a wireless transceiver 1026, a data storage 1024, a legacy I/O controller 1023 containing a user input interface 1025 and a keyboard interface, a serial expansion port 1027, such as a USB, and a network controller 1034. Data storage 1024 may comprise a hard disk drive, a floppy disk drive, a CD-ROM device, a flash memory device, or other mass storage device.

In at least one embodiment, FIG. 10 illustrates a system, which includes interconnected hardware devices or "chips." In at least one embodiment, FIG. 10 may illustrate an exemplary SoC. In at least one embodiment, devices illustrated in FIG. 10 may be interconnected with proprietary interconnects, standardized interconnects (e.g., PCIe), or some combination thereof. In at least one embodiment, one or more components of system 1000 are interconnected using compute express link ("CXL") interconnects.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 11:
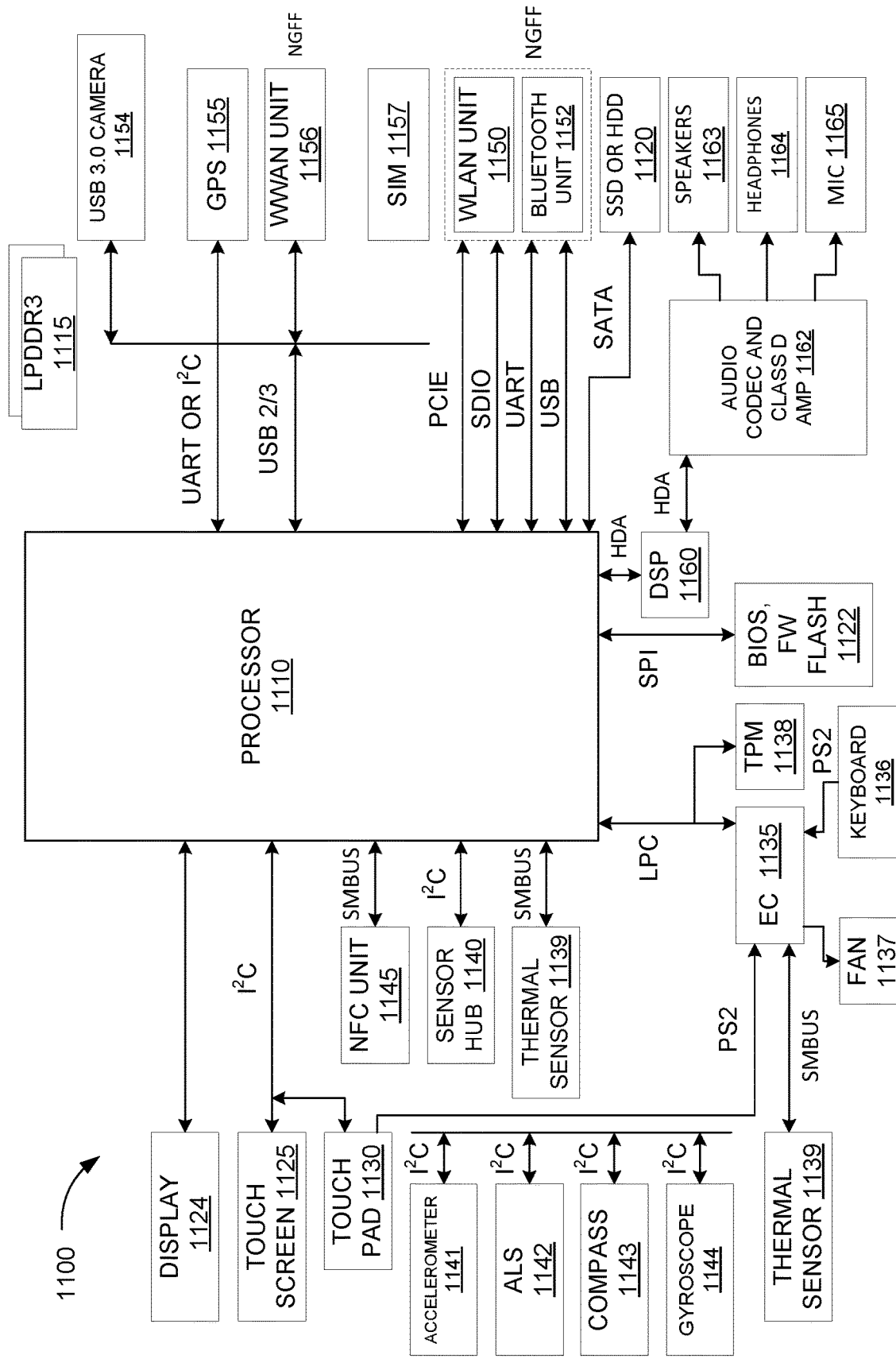
FIG. 11 illustrates a system, in accordance with at least one embodiment.

FIG. 11 illustrates a system 1100, in accordance with at least one embodiment. In at least one embodiment, system 1100 is an electronic device that utilizes a processor 1110. In at least one embodiment, system 1100 may be, for example and without limitation, a notebook, a tower server, a rack server, a blade server, a laptop, a desktop, a tablet, a mobile device, a phone, an embedded computer, or any other suitable electronic device.

In at least one embodiment, system 1100 may include, without limitation, processor 1110 communicatively coupled to any suitable number or kind of components, peripherals, modules, or devices. In at least one embodiment, processor 1110 is coupled using a bus or interface, such as an $I^2C$ bus, a System Management Bus ("SMBus"), a Low Pin Count ("LPC") bus, a Serial Peripheral Interface ("SPI"), a High Definition Audio ("HDA") bus, a Serial Advance Technology Attachment ("SATA") bus, a USB (versions 1, 2, 3), or a Universal Asynchronous Receiver/Transmitter ("UART") bus. In at least one embodiment, FIG. 11 illustrates a system which includes interconnected hardware devices or "chips." In at least one embodiment, FIG. 11 may illustrate an exemplary SoC. In at least one embodiment, devices illustrated in FIG. 11 may be interconnected with proprietary interconnects, standardized interconnects (e.g., PCIe) or some combination thereof. In at least one embodiment, one or more components of FIG. 11 are interconnected using CXL interconnects.

In at least one embodiment, FIG. 11 may include a display 1124, a touch screen 1125, a touch pad 1130, a Near Field Communications unit ("NFC") 1145, a sensor hub 1140, a thermal sensor 1146, an Express Chipset ("EC") 1135, a Trusted Platform Module ("TPM") 1138, BIOS/firmware/flash memory ("BIOS, FW Flash") 1122, a DSP 1160, a Solid State Disk ("SSD") or Hard Disk Drive ("HDD") 1120, a wireless local area network unit ("WLAN") 1150, a Bluetooth unit 1152, a Wireless Wide Area Network unit ("WWAN") 1156, a Global Positioning System ("GPS") 1155, a camera ("USB 3.0 camera") 1154 such as a USB 3.0 camera, or a Low Power Double Data Rate ("LPDDR") memory unit ("LPDDR3") 1115 implemented in, for example, LPDDR3 standard. These components may each be implemented in any suitable manner.

In at least one embodiment, other components may be communicatively coupled to processor 1110 through components discussed above. In at least one embodiment, an accelerometer 1141, an Ambient Light Sensor ("ALS") 1142, a compass 1143, and a gyroscope 1144 may be communicatively coupled to sensor hub 1140. In at least one embodiment, a thermal sensor 1139, a fan 1137, a keyboard 1146, and a touch pad 1130 may be communicatively coupled to EC 1135. In at least one embodiment, a speaker 1163, a headphones 1164, and a microphone ("mic") 1165 may be communicatively coupled to an audio unit ("audio codec and class d amp") 1164, which may in turn be communicatively coupled to DSP 1160. In at least one embodiment, audio unit 1164 may include, for example and without limitation, an audio coder/decoder ("codec") and a class D amplifier. In at least one embodiment, a SIM card ("SIM") 1157 may be communicatively coupled to WWAN unit 1156. In at least one embodiment, components such as WLAN unit 1150 and Bluetooth unit 1152, as well as WWAN unit 1156 may be implemented in a Next Generation Form Factor ("NGFF").

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 12:
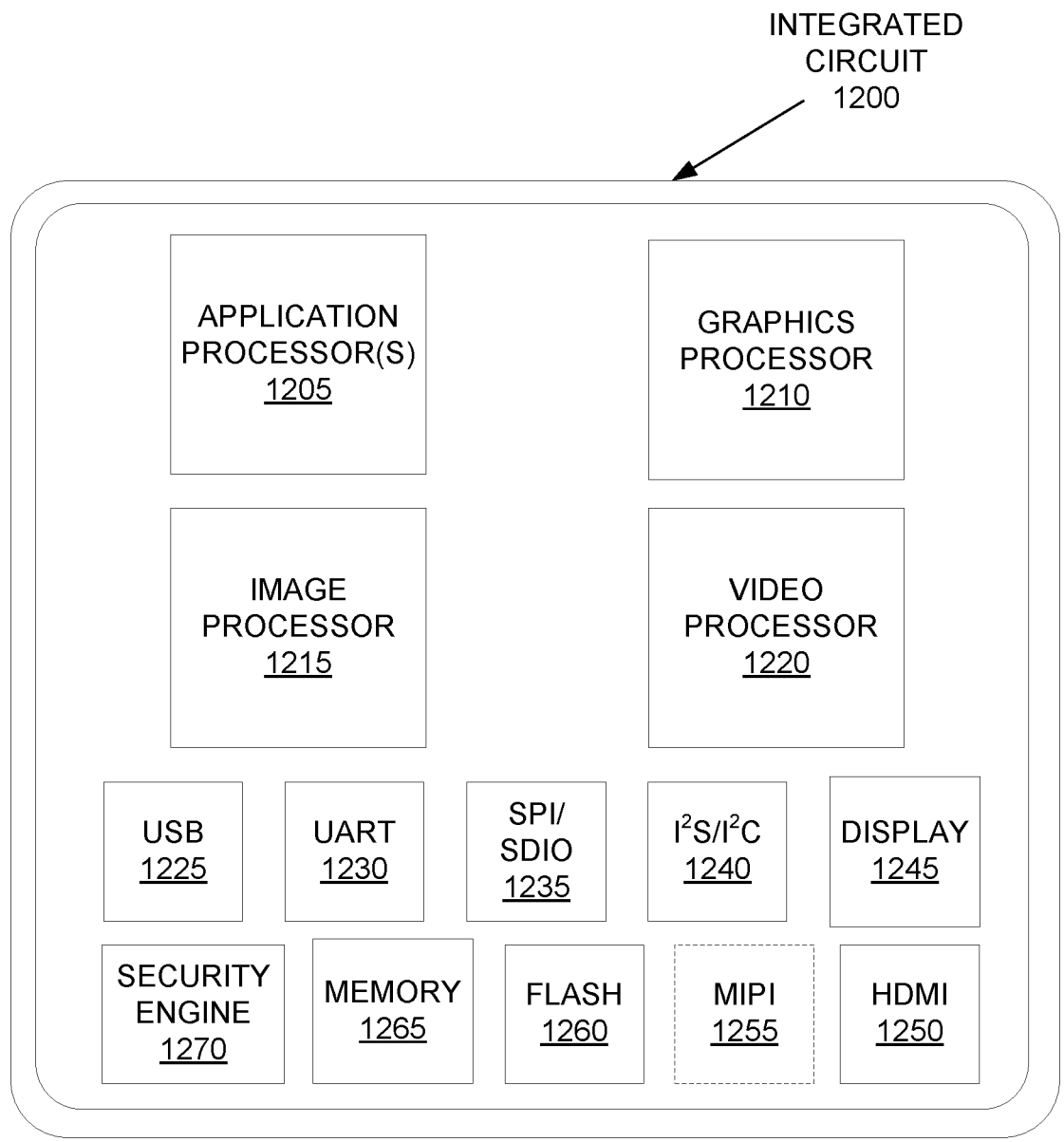
FIG. 12 illustrates an exemplary integrated circuit, in accordance with at least one embodiment.

FIG. 12 illustrates an exemplary integrated circuit 1200, in accordance with at least one embodiment. In at least one embodiment, exemplary integrated circuit 1200 is an SoC that may be fabricated using one or more IP cores. In at least one embodiment, integrated circuit 1200 includes one or more application processor(s) 1205 (e.g., CPUs), at least one graphics processor 1210, and may additionally include an image processor 1215 and/or a video processor 1220, any of which may be a modular IP core. In at least one embodiment, integrated circuit 1200 includes peripheral or bus logic including a USB controller 1225, a UART controller 1230, an SPI/SDIO controller 1235, and an $I^2S/I^2C$ controller 1240. In at least one embodiment, integrated circuit 1200 can include a display device 1245 coupled to one or more of a high-definition multimedia interface ("HDMI") controller 1250 and a mobile industry processor interface ("MIPI") display interface 1255. In at least one embodiment, storage may be provided by a flash memory subsystem 1260 including flash memory and a flash memory controller. In at least one embodiment, a memory interface may be provided via a memory controller 1265 for access to SDRAM or SRAM memory devices. In at least one embodiment, some integrated circuits additionally include an embedded security engine 1270.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 13:
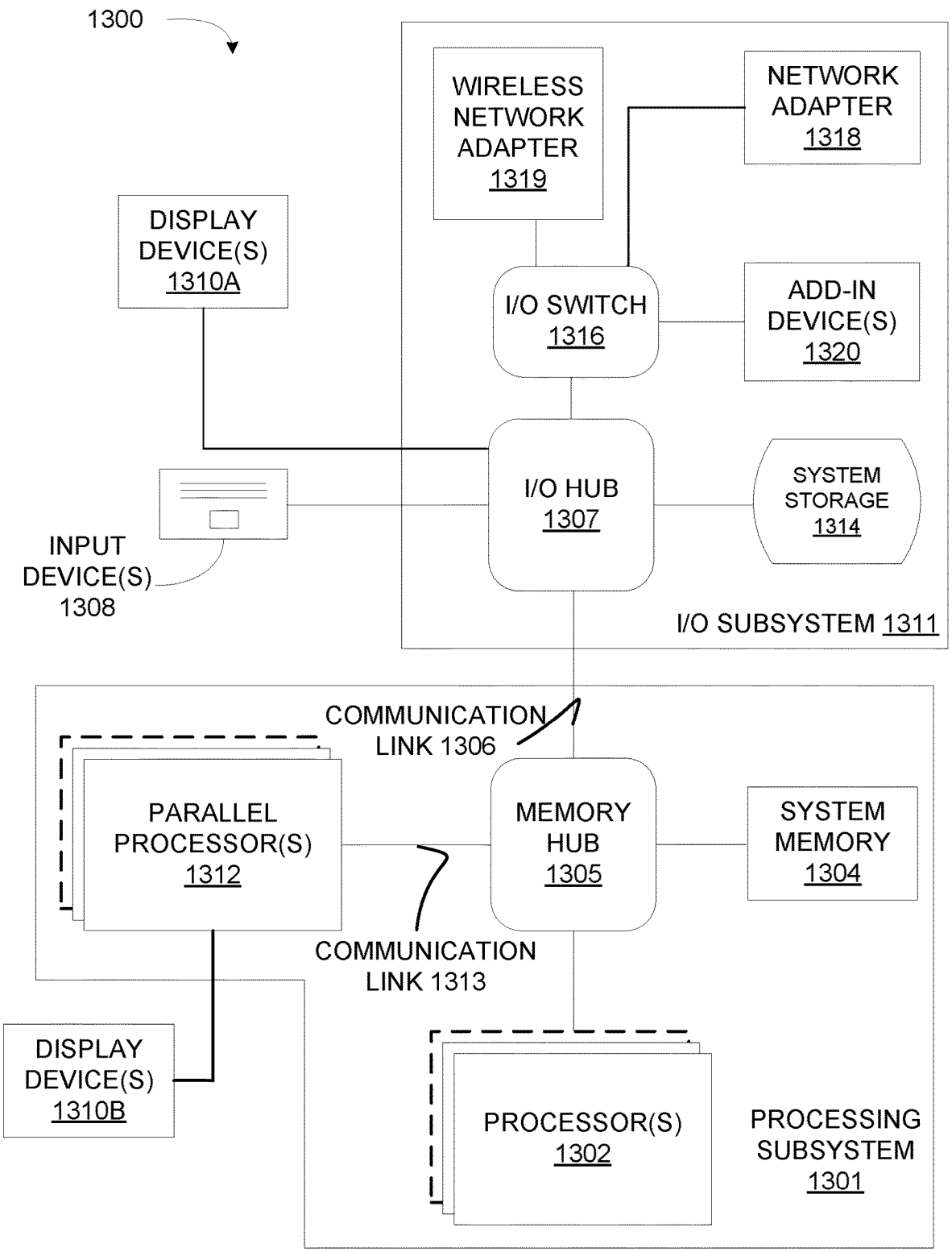
FIG. 13 illustrates a computing system, according to at least one embodiment.

FIG. 13 illustrates a computing system 1300, according to at least one embodiment. In at least one embodiment, computing system 1300 includes a processing subsystem 1301 having one or more processor(s) 1302 and a system memory 1304 communicating via an interconnection path that may include a memory hub 1305. In at least one embodiment, memory hub 1305 may be a separate component within a chipset component or may be integrated within one or more processor(s) 1302. In at least one embodiment, memory hub 1305 couples with an I/O subsystem 1311 via a communication link 1306. In at least one embodiment, I/O subsystem 1311 includes an I/O hub 1307 that can enable computing system 1300 to receive input from one or more input device(s) 1308. In at least one embodiment, I/O hub 1307 can enable a display controller, which may be included in one or more processor(s) 1302, to provide outputs to one or more display device(s) 1310A. In at least one embodiment, one or more display device(s) 1310A coupled with I/O hub 1307 can include a local, internal, or embedded display device.

In at least one embodiment, processing subsystem 1301 includes one or more parallel processor(s) 1312 coupled to memory hub 1305 via a bus or other communication link 1313. In at least one embodiment, communication link 1313 may be one of any number of standards based communication link technologies or protocols, such as, but not limited to PCIe, or may be a vendor specific communications interface or communications fabric. In at least one embodiment, one or more parallel processor(s) 1312 form a computationally focused parallel or vector processing system that can include a large number of processing cores and/or processing clusters, such as a many integrated core processor. In at least one embodiment, one or more parallel processor(s) 1312 form a graphics processing subsystem that can output pixels to one of one or more display device(s) 1310A coupled via I/O Hub 1307. In at least one embodiment, one or more parallel processor(s) 1312 can also include a display controller and display interface (not shown) to enable a direct connection to one or more display device(s) 1310B.

In at least one embodiment, a system storage unit 1314 can connect to I/O hub 1307 to provide a storage mechanism for computing system 1300. In at least one embodiment, an I/O switch 1316 can be used to provide an interface mechanism to enable connections between I/O hub 1307 and other components, such as a network adapter 1318 and/or wireless network adapter 1319 that may be integrated into a platform, and various other devices that can be added via one or more add-in device(s) 1320. In at least one embodiment, network adapter 1318 can be an Ethernet adapter or another wired network adapter. In at least one embodiment, wireless network adapter 1319 can include one or more of a Wi-Fi, Bluetooth, NFC, or other network device that includes one or more wireless radios.

In at least one embodiment, computing system 1300 can include other components not explicitly shown, including USB or other port connections, optical storage drives, video capture devices, and the like, that may also be connected to I/O hub 1307. In at least one embodiment, communication paths interconnecting various components in FIG. 13 may be implemented using any suitable protocols, such as PCI based protocols (e.g., PCIe), or other bus or point-to-point communication interfaces and/or protocol(s), such as NVLink high-speed interconnect, or interconnect protocols.

In at least one embodiment, one or more parallel processor(s) 1312 incorporate circuitry optimized for graphics and video processing, including, for example, video output circuitry, and constitutes a graphics processing unit ("GPU"). In at least one embodiment, one or more parallel processor(s) 1312 incorporate circuitry optimized for general purpose processing. In at least embodiment, components of computing system 1300 may be integrated with one or more other system elements on a single integrated circuit. For example, in at least one embodiment, one or more parallel processor(s) 1312, memory hub 1305, processor(s) 1302, and I/O hub 1307 can be integrated into an SoC integrated circuit. In at least one embodiment, components of computing system 1300 can be integrated into a single package to form a system in package ("SIP") configuration. In at least one embodiment, at least a portion of the components of computing system 1300 can be integrated into a multi-chip module ("MCM"), which can be interconnected with other multi-chip modules into a modular computing system. In at least one embodiment, I/O subsystem 1311 and display devices 1310B are omitted from computing system 1300.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Processing Systems

The following FIGS. set forth, without limitation, exemplary processing systems that can be used to implement at least one embodiment.

Figure 14:
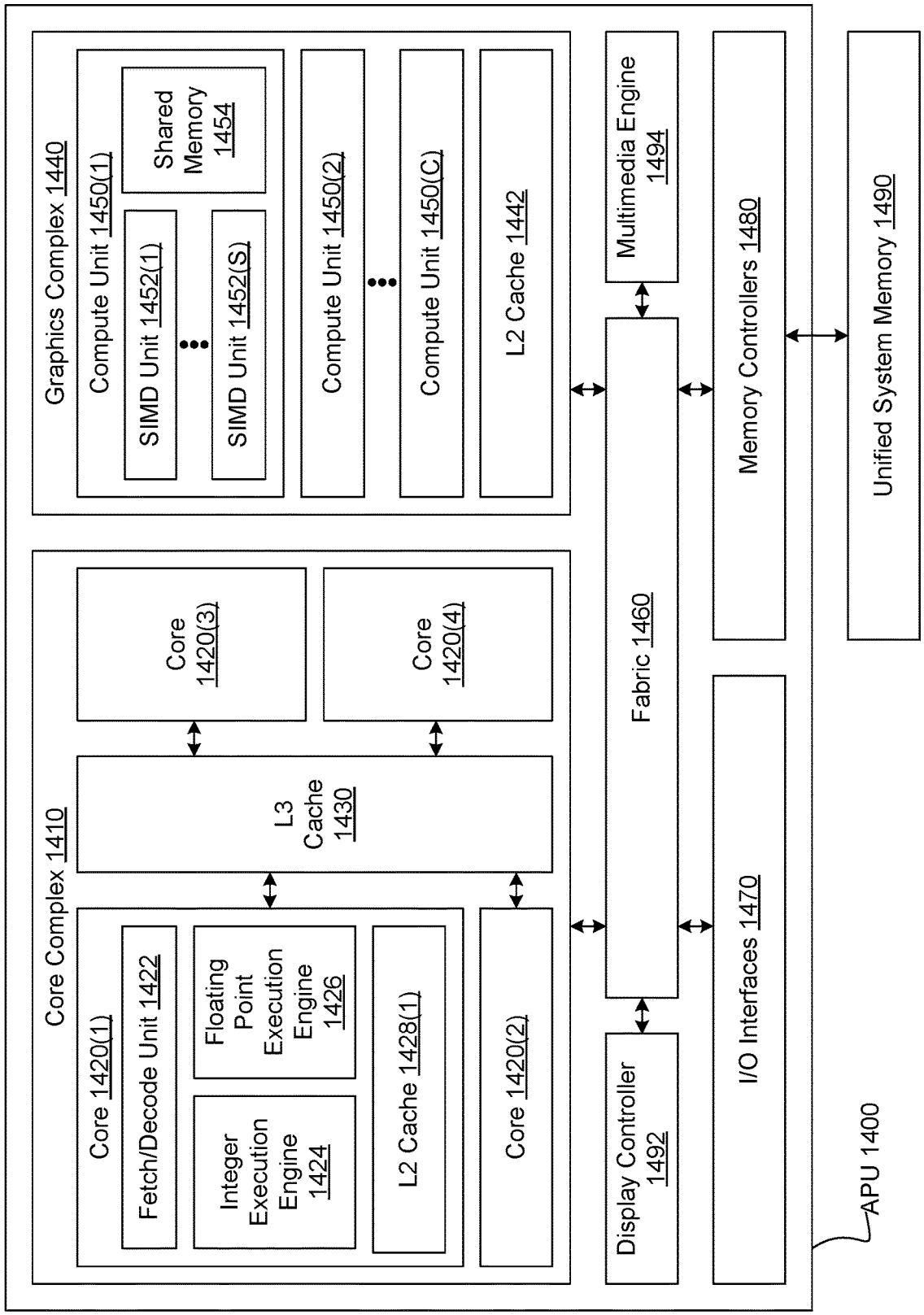
FIG. 14 illustrates an APU, in accordance with at least one embodiment.

FIG. 14 illustrates an accelerated processing unit ("APU") 1400, in accordance with at least one embodiment. In at least one embodiment, APU 1400 is developed by AMD Corporation of Santa Clara, Calif. In at least one embodiment, APU 1400 can be configured to execute an application program, such as a CUDA program. In at least one embodiment, APU 1400 includes, without limitation, a core complex 1410, a graphics complex 1440, fabric 1460, I/O interfaces 1470, memory controllers 1480, a display controller 1492, and a multimedia engine 1494. In at least one embodiment, APU 1400 may include, without limitation, any number of core complexes 1410, any number of graphics complexes 1450, any number of display controllers 1492, and any number of multimedia engines 1494 in any combination. For explanatory purposes, multiple instances of like objects are denoted herein with reference numbers identifying the object and parenthetical numbers identifying the instance where needed.

In at least one embodiment, core complex 1410 is a CPU, graphics complex 1440 is a GPU, and APU 1400 is a processing unit that integrates, without limitation, 1410 and 1440 onto a single chip. In at least one embodiment, some tasks may be assigned to core complex 1410 and other tasks may be assigned to graphics complex 1440. In at least one embodiment, core complex 1410 is configured to execute main control software associated with APU 1400, such as an operating system. In at least one embodiment, core complex 1410 is the master processor of APU 1400, controlling and coordinating operations of other processors. In at least one embodiment, core complex 1410 issues commands that control the operation of graphics complex 1440. In at least one embodiment, core complex 1410 can be configured to execute host executable code derived from CUDA source code, and graphics complex 1440 can be configured to execute device executable code derived from CUDA source code.

In at least one embodiment, core complex 1410 includes, without limitation, cores 1420(1)-1420(4) and an L3 cache 1430. In at least one embodiment, core complex 1410 may include, without limitation, any number of cores 1420 and any number and type of caches in any combination. In at least one embodiment, cores 1420 are configured to execute instructions of a particular instruction set architecture ("ISA"). In at least one embodiment, each core 1420 is a CPU core.

In at least one embodiment, each core 1420 includes, without limitation, a fetch/decode unit 1422, an integer execution engine 1424, a floating point execution engine 1426, and an L2 cache 1428. In at least one embodiment, fetch/decode unit 1422 fetches instructions, decodes such instructions, generates micro-operations, and dispatches separate micro-instructions to integer execution engine 1424 and floating point execution engine 1426. In at least one embodiment, fetch/decode unit 1422 can concurrently dispatch one micro-instruction to integer execution engine 1424 and another micro-instruction to floating point execution engine 1426. In at least one embodiment, integer execution engine 1424 executes, without limitation, integer and memory operations. In at least one embodiment, floating point engine 1426 executes, without limitation, floating point and vector operations. In at least one embodiment, fetch-decode unit 1422 dispatches micro-instructions to a single execution engine that replaces both integer execution engine 1424 and floating point execution engine 1426.

In at least one embodiment, each core 1420(*i*), where i is an integer representing a particular instance of core 1420, may access L2 cache 1428(*i*) included in core 1420(*i*). In at least one embodiment, each core 1420 included in core complex 1410(*j*), where j is an integer representing a particular instance of core complex 1410, is connected to other cores 1420 included in core complex 1410(*j*) via L3 cache 1430(*j*) included in core complex 1410(*j*). In at least one embodiment, cores 1420 included in core complex 1410(*j*), where j is an integer representing a particular instance of core complex 1410, can access all of L3 cache 1430(*j*) included in core complex 1410(*j*). In at least one embodiment, L3 cache 1430 may include, without limitation, any number of slices.

In at least one embodiment, graphics complex 1440 can be configured to perform compute operations in a highly-parallel fashion. In at least one embodiment, graphics complex 1440 is configured to execute graphics pipeline operations such as draw commands, pixel operations, geometric computations, and other operations associated with rendering an image to a display. In at least one embodiment, graphics complex 1440 is configured to execute operations unrelated to graphics. In at least one embodiment, graphics complex 1440 is configured to execute both operations related to graphics and operations unrelated to graphics.

In at least one embodiment, graphics complex 1440 includes, without limitation, any number of compute units 1450 and an L2 cache 1442. In at least one embodiment, compute units 1450 share L2 cache 1442. In at least one embodiment, L2 cache 1442 is partitioned. In at least one embodiment, graphics complex 1440 includes, without limitation, any number of compute units 1450 and any number (including zero) and type of caches. In at least one embodiment, graphics complex 1440 includes, without limitation, any amount of dedicated graphics hardware.

In at least one embodiment, each compute unit 1450 includes, without limitation, any number of SIMD units 1452 and a shared memory 1454. In at least one embodiment, each SIMD unit 1452 implements a SIMD architecture and is configured to perform operations in parallel. In at least one embodiment, each compute unit 1450 may execute any number of thread blocks, but each thread block executes on a single compute unit 1450. In at least one embodiment, a thread block includes, without limitation, any number of threads of execution. In at least one embodiment, a workgroup is a thread block. In at least one embodiment, each SIMD unit 1452 executes a different warp. In at least one embodiment, a warp is a group of threads (e.g., 16 threads), where each thread in the warp belongs to a single thread block and is configured to process a different set of data based on a single set of instructions. In at least one embodiment, predication can be used to disable one or more threads in a warp. In at least one embodiment, a lane is a thread. In at least one embodiment, a work item is a thread. In at least one embodiment, a wavefront is a warp. In at least one embodiment, different wavefronts in a thread block may synchronize together and communicate via shared memory 1454.

In at least one embodiment, fabric 1460 is a system interconnect that facilitates data and control transmissions across core complex 1410, graphics complex 1440, I/O interfaces 1470, memory controllers 1480, display controller 1492, and multimedia engine 1494. In at least one embodiment, APU 1400 may include, without limitation, any amount and type of system interconnect in addition to or instead of fabric 1460 that facilitates data and control transmissions across any number and type of directly or indirectly linked components that may be internal or external to APU 1400. In at least one embodiment, I/O interfaces 1470 are representative of any number and type of I/O interfaces (e.g., PCI, PCI-Extended ("PCI-X"), PCIe, gigabit Ethernet ("GBE"), USB, etc.). In at least one embodiment, various types of peripheral devices are coupled to I/O interfaces 1470 In at least one embodiment, peripheral devices that are coupled to I/O interfaces 1470 may include, without limitation, keyboards, mice, printers, scanners, joysticks or other types of game controllers, media recording devices, external storage devices, network interface cards, and so forth.

In at least one embodiment, display controller AMD92 displays images on one or more display device(s), such as a liquid crystal display ("LCD") device. In at least one embodiment, multimedia engine 240 includes, without limitation, any amount and type of circuitry that is related to multimedia, such as a video decoder, a video encoder, an image signal processor, etc. In at least one embodiment, memory controllers 1480 facilitate data transfers between APU 1400 and a unified system memory 1490. In at least one embodiment, core complex 1410 and graphics complex 1440 share unified system memory 1490.

In at least one embodiment, APU 1400 implements a memory subsystem that includes, without limitation, any amount and type of memory controllers 1480 and memory devices (e.g., shared memory 1454) that may be dedicated to one component or shared among multiple components. In at least one embodiment, APU 1400 implements a cache subsystem that includes, without limitation, one or more cache memories (e.g., L2 caches 1528, L3 cache 1430, and L2 cache 1442) that may each be private to or shared between any number of components (e.g., cores 1420, core complex 1410, SIMD units 1452, compute units 1450, and graphics complex 1440).

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 15:
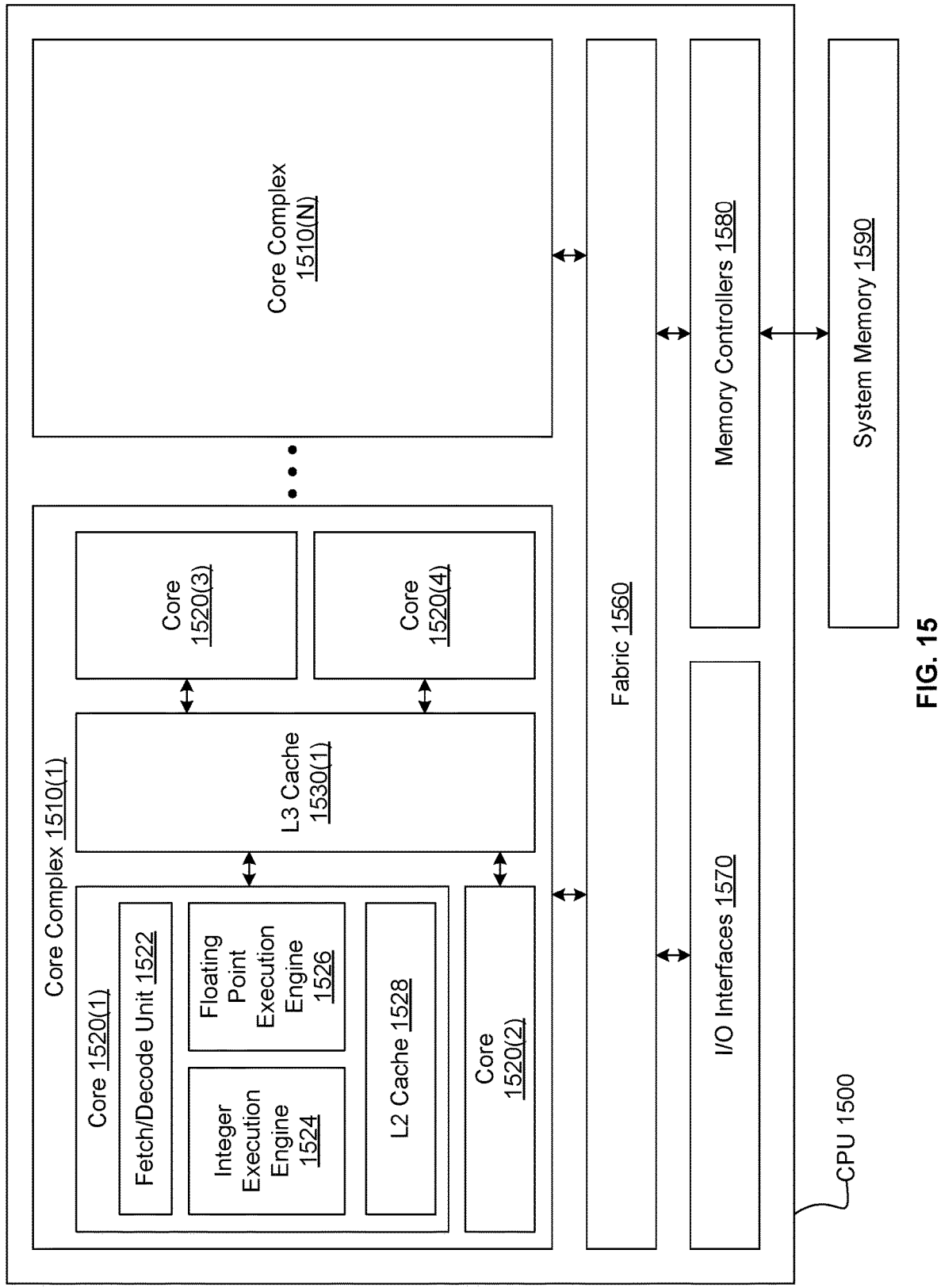
FIG. 15 illustrates a CPU, in accordance with at least one embodiment.

FIG. 15 illustrates a CPU 1500, in accordance with at least one embodiment. In at least one embodiment, CPU 1500 is developed by AMD Corporation of Santa Clara, Calif. In at least one embodiment, CPU 1500 can be configured to execute an application program. In at least one embodiment, CPU 1500 is configured to execute main control software, such as an operating system. In at least one embodiment, CPU 1500 issues commands that control the operation of an external GPU (not shown). In at least one embodiment, CPU 1500 can be configured to execute host executable code derived from CUDA source code, and an external GPU can be configured to execute device executable code derived from such CUDA source code. In at least one embodiment, CPU 1500 includes, without limitation, any number of core complexes 1510, fabric 1560, I/O interfaces 1570, and memory controllers 1580.

In at least one embodiment, core complex 1510 includes, without limitation, cores 1520(1)-1520(4) and an L3 cache 1530. In at least one embodiment, core complex 1510 may include, without limitation, any number of cores 1520 and any number and type of caches in any combination. In at least one embodiment, cores 1520 are configured to execute instructions of a particular ISA. In at least one embodiment, each core 1520 is a CPU core.

In at least one embodiment, each core 1520 includes, without limitation, a fetch/decode unit 1522, an integer execution engine 1524, a floating point execution engine 1526, and an L2 cache 1528. In at least one embodiment, fetch/decode unit 1522 fetches instructions, decodes such instructions, generates micro-operations, and dispatches separate micro-instructions to integer execution engine 1524 and floating point execution engine 1526. In at least one embodiment, fetch/decode unit 1522 can concurrently dispatch one micro-instruction to integer execution engine 1524 and another micro-instruction to floating point execution engine 1526. In at least one embodiment, integer execution engine 1524 executes, without limitation, integer and memory operations. In at least one embodiment, floating point engine 1526 executes, without limitation, floating point and vector operations. In at least one embodiment, fetch-decode unit 1522 dispatches micro-instructions to a single execution engine that replaces both integer execution engine 1524 and floating point execution engine 1526.

In at least one embodiment, each core 1520(*i*), where i is an integer representing a particular instance of core 1520, may access L2 cache 1528(*i*) included in core 1520(*i*). In at least one embodiment, each core 1520 included in core complex 1510(*j*), where j is an integer representing a particular instance of core complex 1510, is connected to other cores 1520 in core complex 1510(*j*) via L3 cache 1530(*j*) included in core complex 1510(*j*). In at least one embodiment, cores 1520 included in core complex 1510(*j*), where j is an integer representing a particular instance of core complex 1510, can access all of L3 cache 1530(*j*) included in core complex 1510(*j*). In at least one embodiment, L3 cache 1530 may include, without limitation, any number of slices.

In at least one embodiment, fabric 1560 is a system interconnect that facilitates data and control transmissions across core complexes 1510(1)-1510(N) (where N is an integer greater than zero), I/O interfaces 1570, and memory controllers 1580. In at least one embodiment, CPU 1500 may include, without limitation, any amount and type of system interconnect in addition to or instead of fabric 1560 that facilitates data and control transmissions across any number and type of directly or indirectly linked components that may be internal or external to CPU 1500. In at least one embodiment, I/O interfaces 1570 are representative of any number and type of I/O interfaces (e.g., PCI, PCI-X, PCIe, GBE, USB, etc.). In at least one embodiment, various types of peripheral devices are coupled to I/O interfaces 1570 In at least one embodiment, peripheral devices that are coupled to I/O interfaces 1570 may include, without limitation, displays, keyboards, mice, printers, scanners, joysticks or other types of game controllers, media recording devices, external storage devices, network interface cards, and so forth.

In at least one embodiment, memory controllers 1580 facilitate data transfers between CPU 1500 and a system memory 1590. In at least one embodiment, core complex 1510 and graphics complex 1540 share system memory 1590. In at least one embodiment, CPU 1500 implements a memory subsystem that includes, without limitation, any amount and type of memory controllers 1580 and memory devices that may be dedicated to one component or shared among multiple components. In at least one embodiment, CPU 1500 implements a cache subsystem that includes, without limitation, one or more cache memories (e.g., L2 caches 1528 and L3 caches 1530) that may each be private to or shared between any number of components (e.g., cores 1520 and core complexes 1510).

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 16:
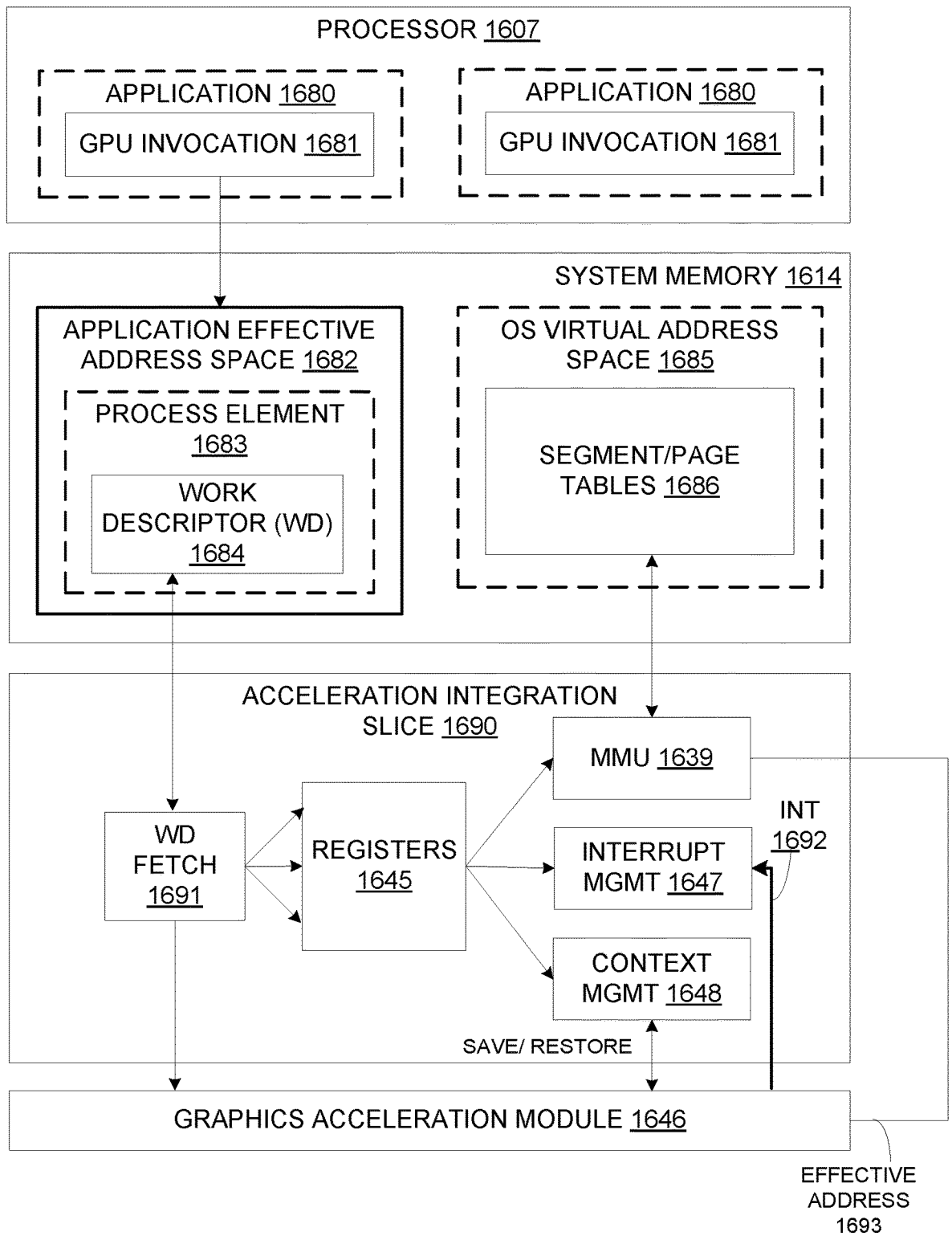
FIG. 16 illustrates an exemplary accelerator integration slice, in accordance with at least one embodiment.

FIG. 16 illustrates an exemplary accelerator integration slice 1690, in accordance with at least one embodiment. As used herein, a "slice" comprises a specified portion of processing resources of an accelerator integration circuit. In at least one embodiment, the accelerator integration circuit provides cache management, memory access, context management, and interrupt management services on behalf of multiple graphics processing engines included in a graphics acceleration module. The graphics processing engines may each comprise a separate GPU. Alternatively, the graphics processing engines may comprise different types of graphics processing engines within a GPU such as graphics execution units, media processing engines (e.g., video encoders/decoders), samplers, and blit engines. In at least one embodiment, the graphics acceleration module may be a GPU with multiple graphics processing engines. In at least one embodiment, the graphics processing engines may be individual GPUs integrated on a common package, line card, or chip.

An application effective address space 1682 within system memory 1614 stores process elements 1683. In one embodiment, process elements 1683 are stored in response to GPU invocations 1681 from applications 1680 executed on processor 1607. A process element 1683 contains process state for corresponding application 1680. A work descriptor ("WD") 1684 contained in process element 1683 can be a single job requested by an application or may contain a pointer to a queue of jobs. In at least one embodiment, WD 1684 is a pointer to a job request queue in application effective address space 1682.

Graphics acceleration module 1646 and/or individual graphics processing engines can be shared by all or a subset of processes in a system. In at least one embodiment, an infrastructure for setting up process state and sending WD 1684 to graphics acceleration module 1646 to start a job in a virtualized environment may be included.

In at least one embodiment, a dedicated-process programming model is implementation-specific. In this model, a single process owns graphics acceleration module 1646 or an individual graphics processing engine. Because graphics acceleration module 1646 is owned by a single process, a hypervisor initializes an accelerator integration circuit for an owning partition and an operating system initializes accelerator integration circuit for an owning process when graphics acceleration module 1646 is assigned.

In operation, a WD fetch unit 1691 in accelerator integration slice 1690 fetches next WD 1684 which includes an indication of work to be done by one or more graphics processing engines of graphics acceleration module 1646. Data from WD 1684 may be stored in registers 1645 and used by a memory management unit ("MMU") 1639, interrupt management circuit 1647 and/or context management circuit 1648 as illustrated. For example, one embodiment of MMU 1639 includes segment/page walk circuitry for accessing segment/page tables 1686 within OS virtual address space 1685. Interrupt management circuit 1647 may process interrupt events ("INT") 1692 received from graphics acceleration module 1646. When performing graphics operations, an effective address 1693 generated by a graphics processing engine is translated to a real address by MMU 1639.

In one embodiment, a same set of registers 1645 are duplicated for each graphics processing engine and/or graphics acceleration module 1646 and may be initialized by a hypervisor or operating system. Each of these duplicated registers may be included in accelerator integration slice 1690. Exemplary registers that may be initialized by a hypervisor are shown in Table 1.

TABLE 1

Hypervisor Initialized Registers

| | |
|---|---|
| 1 | Slice Control Register |
| 2 | Real Address (RA) Scheduled Processes Area Pointer |
| 3 | Authority Mask Override Register |
| 4 | Interrupt Vector Table Entry Offset |
| 5 | Interrupt Vector Table Entry Limit |
| 6 | State Register |
| 7 | Logical Partition ID |
| 8 | Real address (RA) Hypervisor Accelerator Utilization Record Pointer |
| 9 | Storage Description Register |

Exemplary registers that may be initialized by an operating system are shown in Table 2.

TABLE 2

Operating System Initialized Registers

| | |
|---|---|
| 1 | Process and Thread Identification |
| 2 | Effective Address (EA) Context Save/Restore Pointer |
| 3 | Virtual Address (VA) Accelerator Utilization Record Pointer |
| 4 | Virtual Address (VA) Storage Segment Table Pointer |
| 5 | Authority Mask |
| 6 | Work descriptor |

In one embodiment, each WD 1684 is specific to a particular graphics acceleration module 1646 and/or a particular graphics processing engine. It contains all information required by a graphics processing engine to do work or it can be a pointer to a memory location where an application has set up a command queue of work to be completed.

Figure 17A:
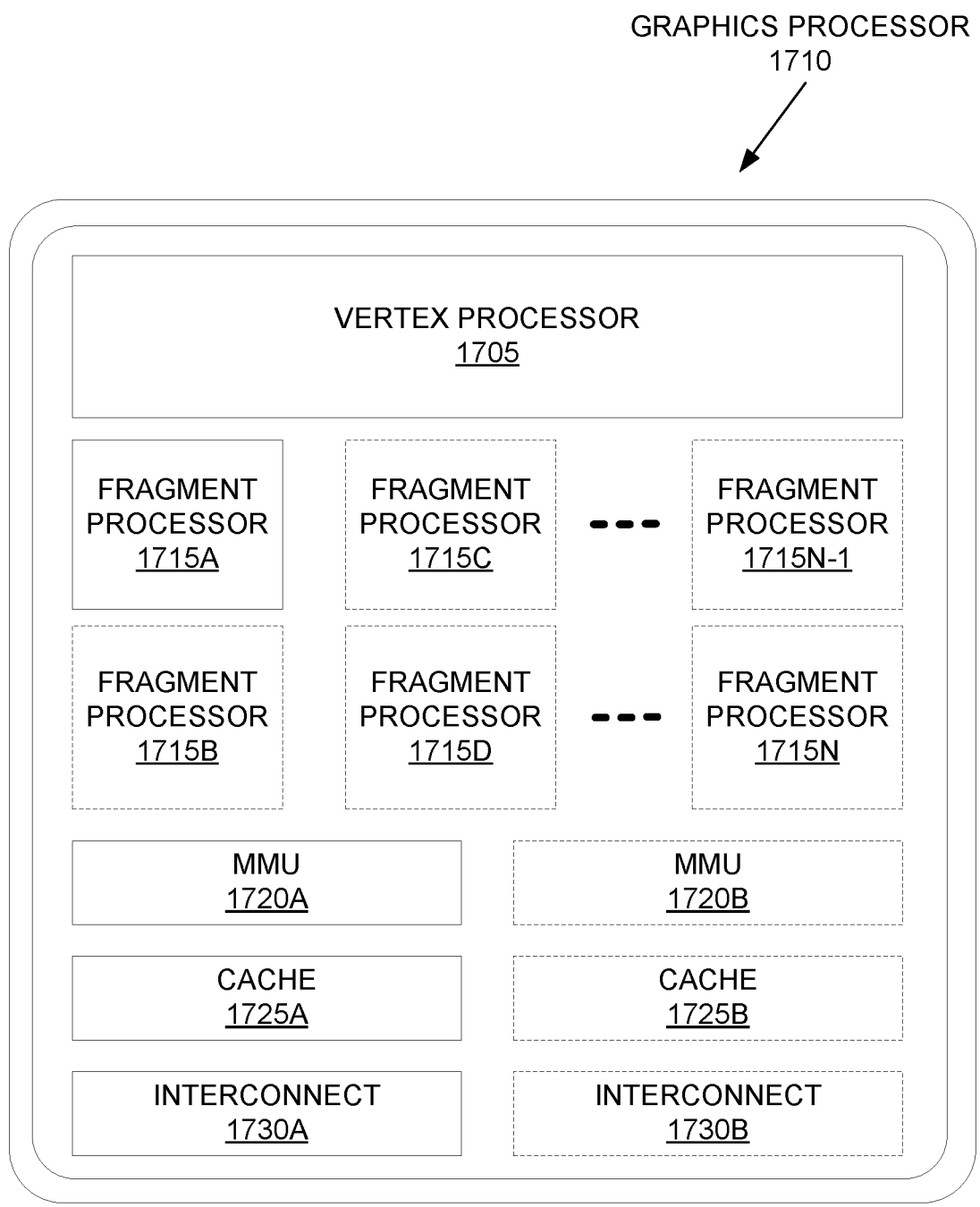
FIGS. 17A and 17B illustrate exemplary graphics processors, in accordance with at least one embodiment.
Figure 17B:
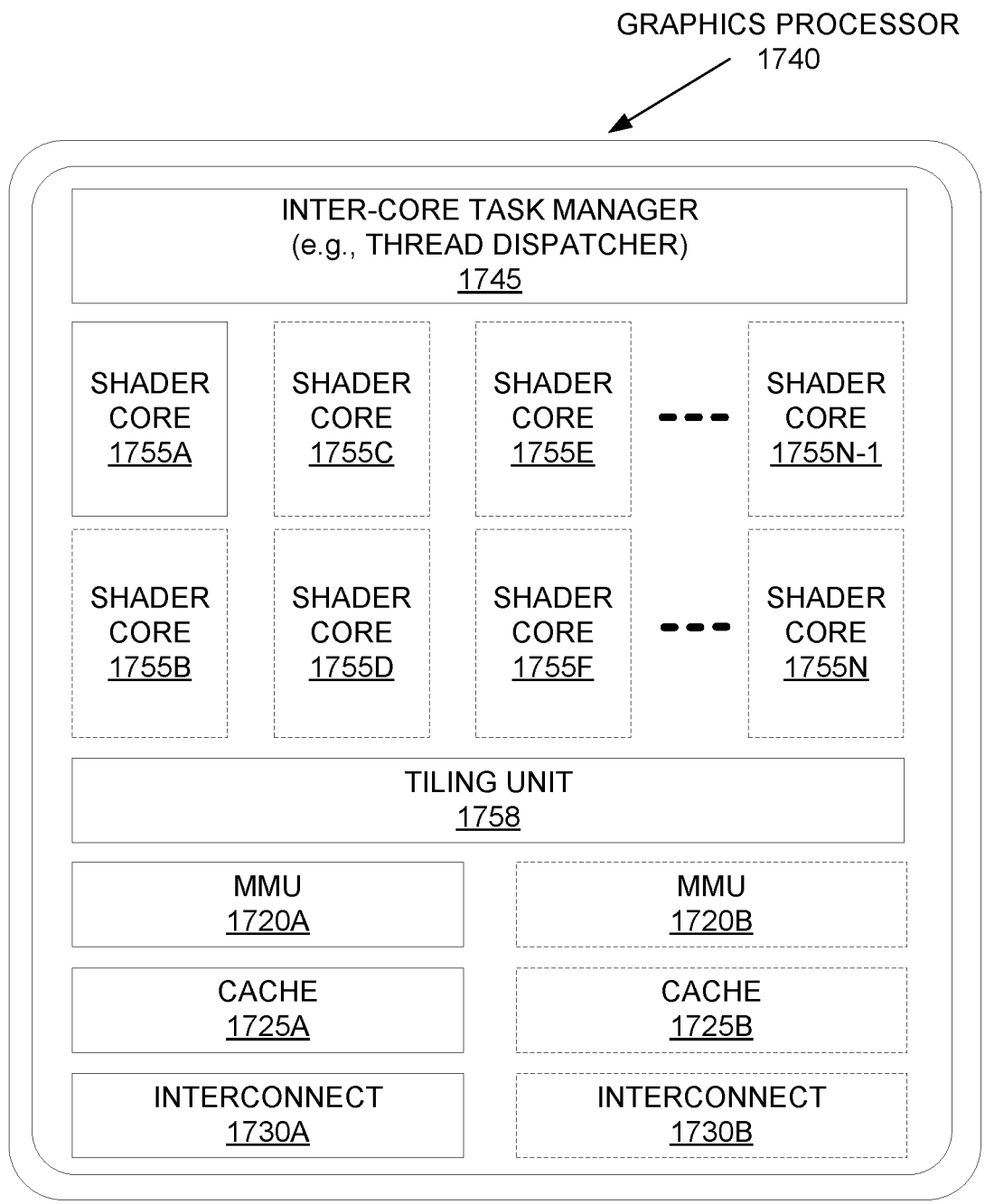

FIGS. 17A and 17B illustrate exemplary graphics processors, in accordance with at least one embodiment. In at least one embodiment, any of the exemplary graphics processors may be fabricated using one or more IP cores. In addition to what is illustrated, other logic and circuits may be included in at least one embodiment, including additional graphics processors/cores, peripheral interface controllers, or general-purpose processor cores. In at least one embodiment, the exemplary graphics processors are for use within an SoC.

FIG. 17A illustrates an exemplary graphics processor 1710 of an SoC integrated circuit that may be fabricated using one or more IP cores, in accordance with at least one embodiment. FIG. 17B illustrates an additional exemplary graphics processor 1740 of an SoC integrated circuit that may be fabricated using one or more IP cores, in accordance with at least one embodiment. In at least one embodiment, graphics processor 1710 of FIG. 17A is a low power graphics processor core. In at least one embodiment, graphics processor 1740 of FIG. 17B is a higher performance graphics processor core. In at least one embodiment, each of graphics processors 1710, 1740 can be variants of graphics processor 1210 of FIG. 12.

In at least one embodiment, graphics processor 1710 includes a vertex processor 1705 and one or more fragment processor(s) 1715A-1715N (e.g., 1715A, 1715B, 1715C, 1715D, through 1715N-1, and 1715N). In at least one embodiment, graphics processor 1710 can execute different shader programs via separate logic, such that vertex processor 1705 is optimized to execute operations for vertex shader programs, while one or more fragment processor(s) 1715A-1715N execute fragment (e.g., pixel) shading operations for fragment or pixel shader programs. In at least one embodiment, vertex processor 1705 performs a vertex processing stage of a 3D graphics pipeline and generates primitives and vertex data. In at least one embodiment, fragment processor(s) 1715A-1715N use primitive and vertex data generated by vertex processor 1705 to produce a framebuffer that is displayed on a display device. In at least one embodiment, fragment processor(s) 1715A-1715N are optimized to execute fragment shader programs as provided for in an OpenGL API, which may be used to perform similar operations as a pixel shader program as provided for in a Direct 3D API.

In at least one embodiment, graphics processor 1710 additionally includes one or more MMU(s) 1720A-1720B, cache(s) 1725A-1725B, and circuit interconnect(s) 1730A-1730B. In at least one embodiment, one or more MMU(s) 1720A-1720B provide for virtual to physical address mapping for graphics processor 1710, including for vertex processor 1705 and/or fragment processor(s) 1715A-1715N, which may reference vertex or image/texture data stored in memory, in addition to vertex or image/texture data stored in one or more cache(s) 1725A-1725B. In at least one embodiment, one or more MMU(s) 1720A-1720B may be synchronized with other MMUs within a system, including one or more MMUs associated with one or more application processor(s) 1205, image processors 1215, and/or video processors 1220 of FIG. 12, such that each processor 1205-1220 can participate in a shared or unified virtual memory system. In at least one embodiment, one or more circuit interconnect(s) 1730A-1730B enable graphics processor 1710 to interface with other IP cores within an SoC, either via an internal bus of the SoC or via a direct connection.

In at least one embodiment, graphics processor 1740 includes one or more MMU(s) 1720A-1720B, caches 1725A-1725B, and circuit interconnects 1730A-1730B of graphics processor 1710 of FIG. 17A. In at least one embodiment, graphics processor 1740 includes one or more shader core(s) 1755A-1755N (e.g., 1755A, 1755B, 1755C, 1755D, 1755E, 1755F, through 1755N-1, and 1755N), which provides for a unified shader core architecture in which a single core or type or core can execute all types of programmable shader code, including shader program code to implement vertex shaders, fragment shaders, and/or compute shaders. In at least one embodiment, a number of shader cores can vary. In at least one embodiment, graphics processor 1740 includes an inter-core task manager 1745, which acts as a thread dispatcher to dispatch execution threads to one or more shader cores 1755A-1755N and a tiling unit 1758 to accelerate tiling operations for tile-based rendering, in which rendering operations for a scene are subdivided in image space, for example to exploit local spatial coherence within a scene or to optimize use of internal caches.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 18A:
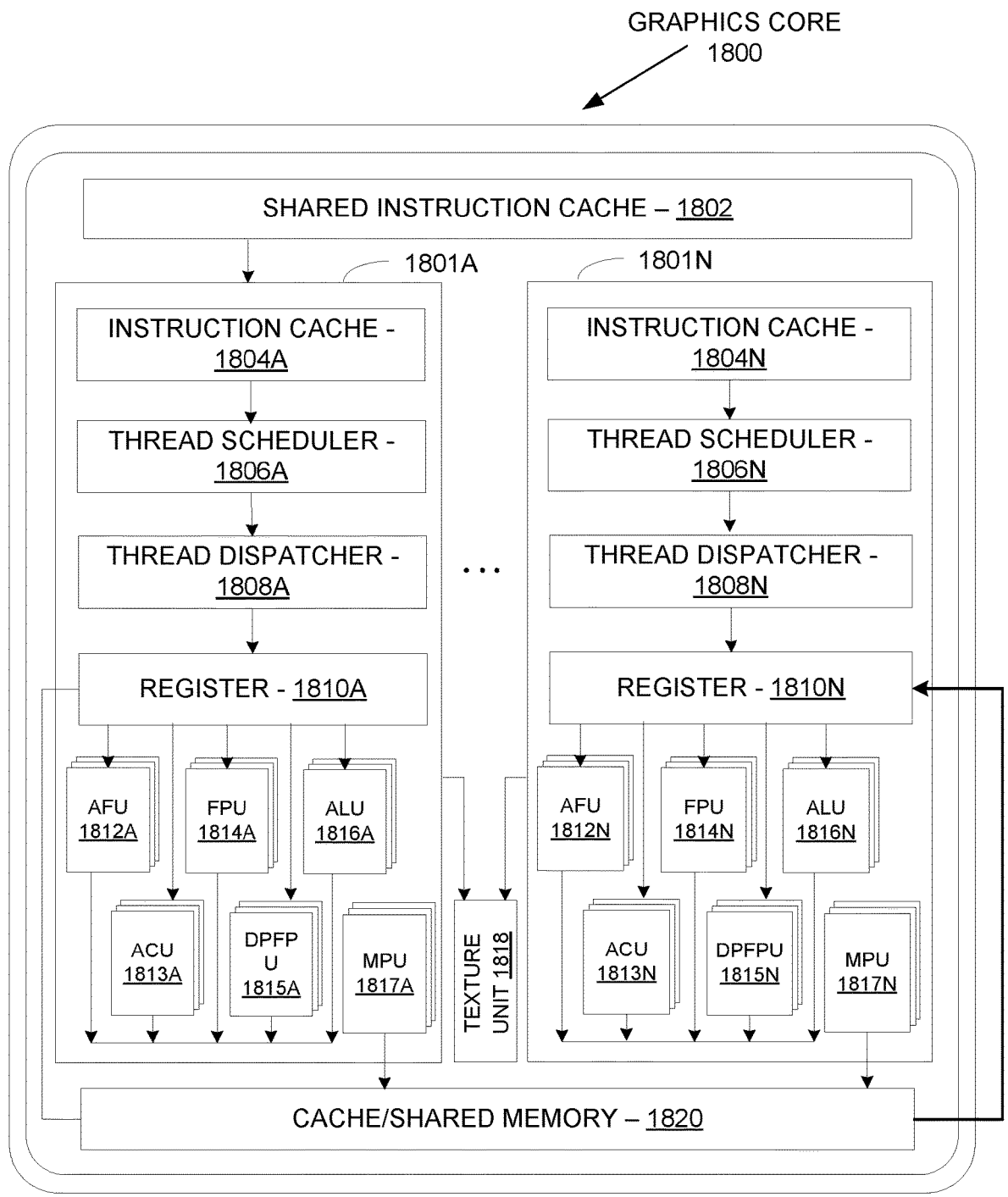
FIG. 18A illustrates a graphics core, in accordance with at least one embodiment.

FIG. 18A illustrates a graphics core 1800, in accordance with at least one embodiment. In at least one embodiment, graphics core 1800 may be included within graphics processor 1210 of FIG. 12. In at least one embodiment, graphics core 1800 may be a unified shader core 1755A-1755N as in FIG. 17B. In at least one embodiment, graphics core 1800 includes a shared instruction cache 1802, a texture unit 1818, and a cache/shared memory 1820 that are common to execution resources within graphics core 1800. In at least one embodiment, graphics core 1800 can include multiple slices 1801A-1801N or partition for each core, and a graphics processor can include multiple instances of graphics core 1800. Slices 1801A-1801N can include support logic including a local instruction cache 1804A-1804N, a thread scheduler 1806A-1806N, a thread dispatcher 1808A-1808N, and a set of registers 1810A-1810N. In at least one embodiment, slices 1801A-1801N can include a set of additional function units ("AFUs") 1812A-1812N, floating-point units ("FPUs") 1814A-1814N, integer arithmetic logic units ("ALUs") 1816-1816N, address computational units ("ACUs") 1813A-1813N, double-precision floating-point units ("DPFPUs") 1815A-1815N, and matrix processing units ("MPUs") 1817A-1817N.

In at least one embodiment, FPUs 1814A-1814N can perform single-precision (32-bit) and half-precision (16-bit) floating point operations, while DPFPUs 1815A-1815N perform double precision (64-bit) floating point operations. In at least one embodiment, ALUs 1816A-1816N can perform variable precision integer operations at 8-bit, 16-bit, and 32-bit precision, and can be configured for mixed precision operations. In at least one embodiment, MPUs 1817A-1817N can also be configured for mixed precision matrix operations, including half-precision floating point and 8-bit integer operations. In at least one embodiment, MPUs 1817-1817N can perform a variety of matrix operations to accelerate CUDA programs, including enabling support for accelerated general matrix to matrix multiplication ("GEMM"). In at least one embodiment, AFUs 1812A-1812N can perform additional logic operations not supported by floating-point or integer units, including trigonometric operations (e.g., Sine, Cosine, etc.).

Figure 18B:
FIG. 18B illustrates a GPGPU, in accordance with at least one embodiment.

FIG. 18B illustrates a general-purpose graphics processing unit ("GPGPU") 1830, in accordance with at least one embodiment. In at least one embodiment, GPGPU 1830 is highly-parallel and suitable for deployment on a multi-chip module. In at least one embodiment, GPGPU 1830 can be configured to enable highly-parallel compute operations to be performed by an array of GPUs. In at least one embodiment, GPGPU 1830 can be linked directly to other instances of GPGPU 1830 to create a multi-GPU cluster to improve execution time for CUDA programs. In at least one embodiment, GPGPU 1830 includes a host interface 1832 to enable a connection with a host processor. In at least one embodiment, host interface 1832 is a PCIe interface. In at least one embodiment, host interface 1832 can be a vendor specific communications interface or communications fabric. In at least one embodiment, GPGPU 1830 receives commands from a host processor and uses a global scheduler 1834 to distribute execution threads associated with those commands to a set of compute clusters 1836A-1836H. In at least one embodiment, compute clusters 1836A-1836H share a cache memory 1838. In at least one embodiment, cache memory 1838 can serve as a higher-level cache for cache memories within compute clusters 1836A-1836H.

In at least one embodiment, GPGPU 1830 includes memory 1844A-1844B coupled with compute clusters 1836A-1836H via a set of memory controllers 1842A-1842B. In at least one embodiment, memory 1844A-1844B can include various types of memory devices including DRAM or graphics random access memory, such as synchronous graphics random access memory ("SGRAM"), including graphics double data rate ("GDDR") memory.

In at least one embodiment, compute clusters 1836A-1836H each include a set of graphics cores, such as graphics core 1800 of FIG. 18A, which can include multiple types of integer and floating point logic units that can perform computational operations at a range of precisions including suited for computations associated with CUDA programs. For example, in at least one embodiment, at least a subset of floating point units in each of compute clusters 1836A-1836H can be configured to perform 16-bit or 32-bit floating point operations, while a different subset of floating point units can be configured to perform 64-bit floating point operations.

In at least one embodiment, multiple instances of GPGPU 1830 can be configured to operate as a compute cluster. Compute clusters 1836A-1836H may implement any technically feasible communication techniques for synchronization and data exchange. In at least one embodiment, multiple instances of GPGPU 1830 communicate over host interface 1832. In at least one embodiment, GPGPU 1830 includes an I/O hub 1839 that couples GPGPU 1830 with a GPU link 1840 that enables a direct connection to other instances of GPGPU 1830. In at least one embodiment, GPU link 1840 is coupled to a dedicated GPU-to-GPU bridge that enables communication and synchronization between multiple instances of GPGPU 1830. In at least one embodiment GPU link 1840 couples with a high speed interconnect to transmit and receive data to other GPGPUs 1830 or parallel processors. In at least one embodiment, multiple instances of GPGPU 1830 are located in separate data processing systems and communicate via a network device that is accessible via host interface 1832. In at least one embodiment GPU link 1840 can be configured to enable a connection to a host processor in addition to or as an alternative to host interface 1832. In at least one embodiment, GPGPU 1830 can be configured to execute a CUDA program.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 19A:
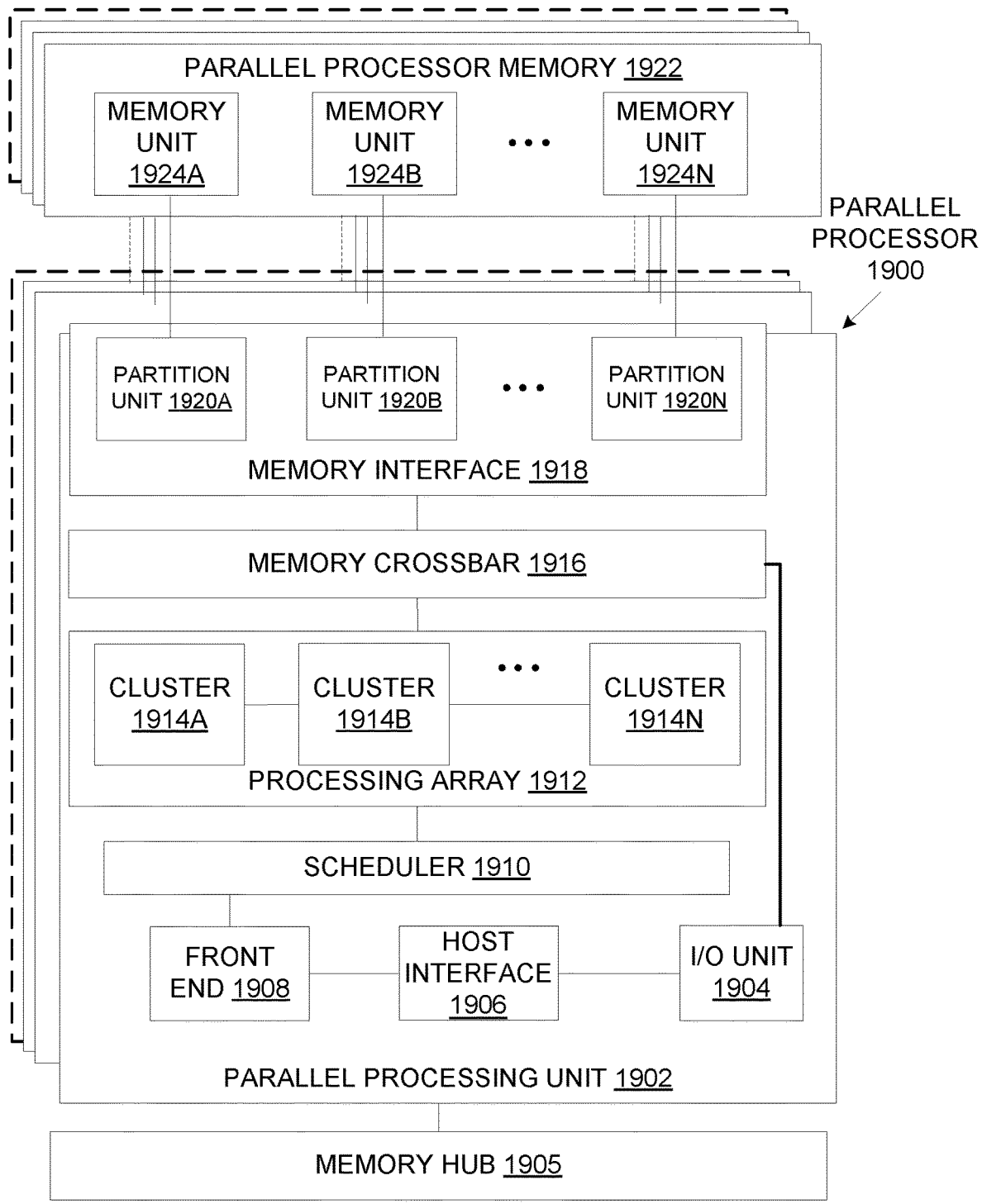
FIG. 19A illustrates a parallel processor, in accordance with at least one embodiment.

FIG. 19A illustrates a parallel processor 1900, in accordance with at least one embodiment. In at least one embodiment, various components of parallel processor 1900 may be implemented using one or more integrated circuit devices, such as programmable processors, application specific integrated circuits ("ASICs"), or FPGAs.

In at least one embodiment, parallel processor 1900 includes a parallel processing unit 1902. In at least one embodiment, parallel processing unit 1902 includes an I/O unit 1904 that enables communication with other devices, including other instances of parallel processing unit 1902. In at least one embodiment, I/O unit 1904 may be directly connected to other devices. In at least one embodiment, I/O unit 1904 connects with other devices via use of a hub or switch interface, such as memory hub 1305. In at least one embodiment, connections between memory hub 1305 and I/O unit 1904 form a communication link. In at least one embodiment, I/O unit 1904 connects with a host interface 1906 and a memory crossbar 1916, where host interface 1906 receives commands directed to performing processing operations and memory crossbar 1916 receives commands directed to performing memory operations.

In at least one embodiment, when host interface 1906 receives a command buffer via I/O unit 1904, host interface 1906 can direct work operations to perform those commands to a front end 1908. In at least one embodiment, front end 1908 couples with a scheduler 1910, which is configured to distribute commands or other work items to a processing array 1912. In at least one embodiment, scheduler 1910 ensures that processing array 1912 is properly configured and in a valid state before tasks are distributed to processing array 1912. In at least one embodiment, scheduler 1910 is implemented via firmware logic executing on a microcontroller. In at least one embodiment, microcontroller implemented scheduler 1910 is configurable to perform complex scheduling and work distribution operations at coarse and fine granularity, enabling rapid preemption and context switching of threads executing on processing array 1912. In at least one embodiment, host software can prove workloads for scheduling on processing array 1912 via one of multiple graphics processing doorbells. In at least one embodiment, workloads can then be automatically distributed across processing array 1912 by scheduler 1910 logic within a microcontroller including scheduler 1910.

In at least one embodiment, processing array 1912 can include up to "N" clusters (e.g., cluster 1914A, cluster 1914B, through cluster 1914N). In at least one embodiment, each cluster 1914A-1914N of processing array 1912 can execute a large number of concurrent threads. In at least one embodiment, scheduler 1910 can allocate work to clusters 1914A-1914N of processing array 1912 using various scheduling and/or work distribution algorithms, which may vary depending on the workload arising for each type of program or computation. In at least one embodiment, scheduling can be handled dynamically by scheduler 1910, or can be assisted in part by compiler logic during compilation of program logic configured for execution by processing array 1912. In at least one embodiment, different clusters 1914A-1914N of processing array 1912 can be allocated for processing different types of programs or for performing different types of computations.

In at least one embodiment, processing array 1912 can be configured to perform various types of parallel processing operations. In at least one embodiment, processing array 1912 is configured to perform general-purpose parallel compute operations. For example, in at least one embodiment, processing array 1912 can include logic to execute processing tasks including filtering of video and/or audio data, performing modeling operations, including physics operations, and performing data transformations.

In at least one embodiment, processing array 1912 is configured to perform parallel graphics processing operations. In at least one embodiment, processing array 1912 can include additional logic to support execution of such graphics processing operations, including, but not limited to texture sampling logic to perform texture operations, as well as tessellation logic and other vertex processing logic. In at least one embodiment, processing array 1912 can be configured to execute graphics processing related shader programs such as, but not limited to vertex shaders, tessellation shaders, geometry shaders, and pixel shaders. In at least one embodiment, parallel processing unit 1902 can transfer data from system memory via I/O unit 1904 for processing. In at least one embodiment, during processing, transferred data can be stored to on-chip memory (e.g., a parallel processor memory 1922) during processing, then written back to system memory.

In at least one embodiment, when parallel processing unit 1902 is used to perform graphics processing, scheduler 1910 can be configured to divide a processing workload into approximately equal sized tasks, to better enable distribution of graphics processing operations to multiple clusters 1914A-1914N of processing array 1912. In at least one embodiment, portions of processing array 1912 can be configured to perform different types of processing. For example, in at least one embodiment, a first portion may be configured to perform vertex shading and topology generation, a second portion may be configured to perform tessellation and geometry shading, and a third portion may be configured to perform pixel shading or other screen space operations, to produce a rendered image for display. In at least one embodiment, intermediate data produced by one or more of clusters 1914A-1914N may be stored in buffers to allow intermediate data to be transmitted between clusters 1914A-1914N for further processing.

In at least one embodiment, processing array 1912 can receive processing tasks to be executed via scheduler 1910, which receives commands defining processing tasks from front end 1908. In at least one embodiment, processing tasks can include indices of data to be processed, e.g., surface (patch) data, primitive data, vertex data, and/or pixel data, as well as state parameters and commands defining how data is to be processed (e.g., what program is to be executed). In at least one embodiment, scheduler 1910 may be configured to fetch indices corresponding to tasks or may receive indices from front end 1908. In at least one embodiment, front end 1908 can be configured to ensure processing array 1912 is configured to a valid state before a workload specified by incoming command buffers batch-buffers, push buffers, etc.) is initiated.

In at least one embodiment, each of one or more instances of parallel processing unit 1902 can couple with parallel processor memory 1922. In at least one embodiment, parallel processor memory 1922 can be accessed via memory crossbar 1916, which can receive memory requests from processing array 1912 as well as I/O unit 1904. In at least one embodiment, memory crossbar 1916 can access parallel processor memory 1922 via a memory interface 1918. In at least one embodiment, memory interface 1918 can include multiple partition units (e.g., a partition unit 1920A, partition unit 1920B, through partition unit 1920N) that can each couple to a portion (e.g., memory unit) of parallel processor memory 1922. In at least one embodiment, a number of partition units 1920A-1920N is configured to be equal to a number of memory units, such that a first partition unit 1920A has a corresponding first memory unit 1924A, a second partition unit 1920B has a corresponding memory unit 1924B, and an Nth partition unit 1920N has a corresponding Nth memory unit 1924N. In at least one embodiment, a number of partition units 1920A-1920N may not be equal to a number of memory devices.

In at least one embodiment, memory units 1924A-1924N can include various types of memory devices, including DRAM or graphics random access memory, such as SGRAM, including GDDR memory. In at least one embodiment, memory units 1924A-1924N may also include 3D stacked memory, including but not limited to high bandwidth memory ("HBM"). In at least one embodiment, render targets, such as frame buffers or texture maps may be stored across memory units 1924A-1924N, allowing partition units 1920A-1920N to write portions of each render target in parallel to efficiently use available bandwidth of parallel processor memory 1922. In at least one embodiment, a local instance of parallel processor memory 1922 may be excluded in favor of a unified memory design that utilizes system memory in conjunction with local cache memory.

In at least one embodiment, any one of clusters 1914A-1914N of processing array 1912 can process data that will be written to any of memory units 1924A-1924N within parallel processor memory 1922. In at least one embodiment, memory crossbar 1916 can be configured to transfer an output of each cluster 1914A-1914N to any partition unit 1920A-1920N or to another cluster 1914A-1914N, which can perform additional processing operations on an output. In at least one embodiment, each cluster 1914A-1914N can communicate with memory interface 1918 through memory crossbar 1916 to read from or write to various external memory devices. In at least one embodiment, memory crossbar 1916 has a connection to memory interface 1918 to communicate with I/O unit 1904, as well as a connection to a local instance of parallel processor memory 1922, enabling processing units within different clusters 1914A-1914N to communicate with system memory or other memory that is not local to parallel processing unit 1902. In at least one embodiment, memory crossbar 1916 can use virtual channels to separate traffic streams between clusters 1914A-1914N and partition units 1920A-1920N.

In at least one embodiment, multiple instances of parallel processing unit 1902 can be provided on a single add-in card, or multiple add-in cards can be interconnected. In at least one embodiment, different instances of parallel processing unit 1902 can be configured to interoperate even if different instances have different numbers of processing cores, different amounts of local parallel processor memory, and/or other configuration differences. For example, in at least one embodiment, some instances of parallel processing unit 1902 can include higher precision floating point units relative to other instances. In at least one embodiment, systems incorporating one or more instances of parallel processing unit 1902 or parallel processor 1900 can be implemented in a variety of configurations and form factors, including but not limited to desktop, laptop, or handheld personal computers, servers, workstations, game consoles, and/or embedded systems.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 19B:
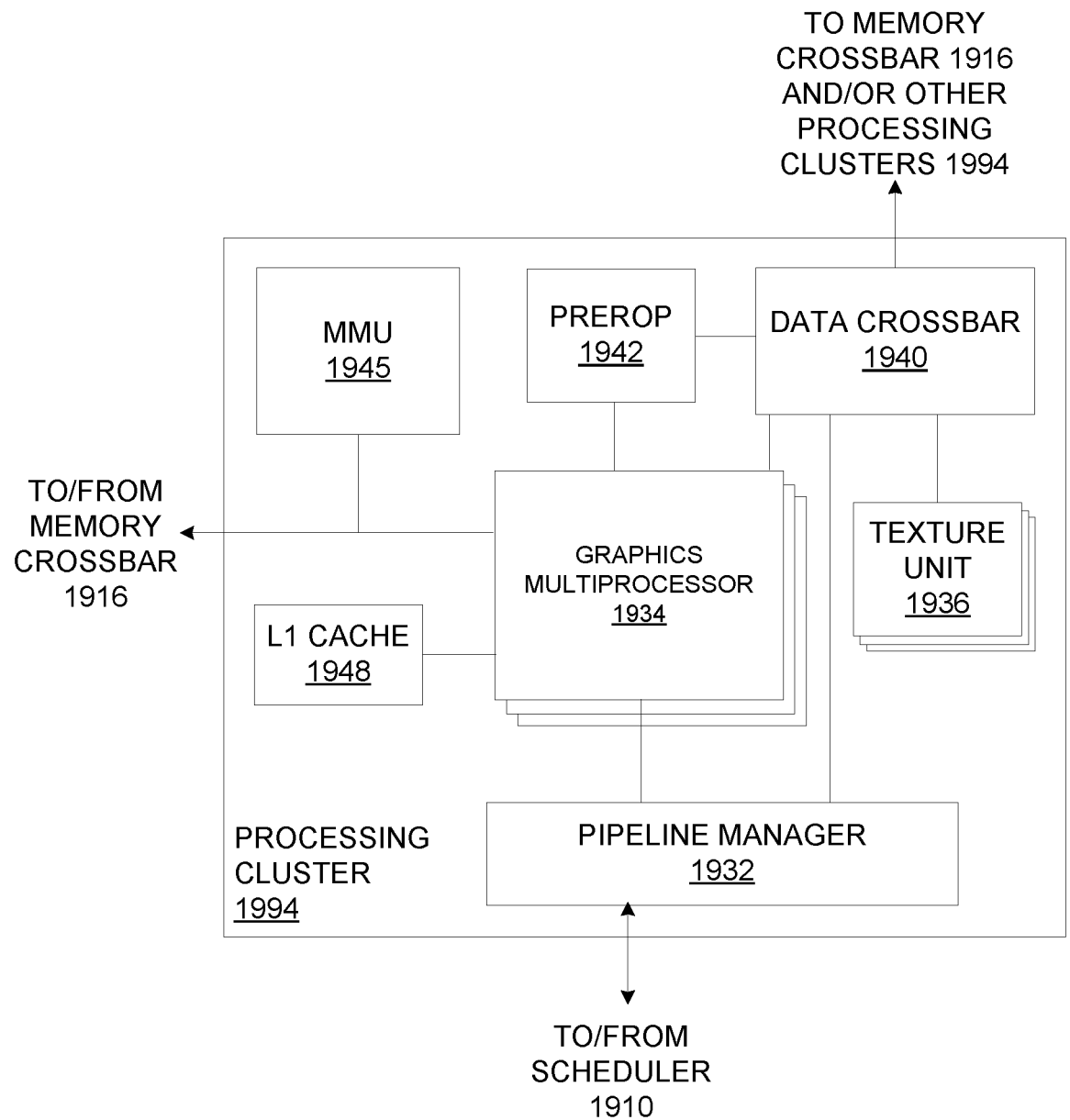
FIG. 19B illustrates a processing cluster, in accordance with at least one embodiment.

FIG. 19B illustrates a processing cluster 1994, in accordance with at least one embodiment. In at least one embodiment, processing cluster 1994 is included within a parallel processing unit. In at least one embodiment, processing cluster 1994 is one of processing clusters 1914A-1914N of FIG. 19A. In at least one embodiment, processing cluster 1994 can be configured to execute many threads in parallel, where the term "thread" refers to an instance of a particular program executing on a particular set of input data. In at least one embodiment, single instruction, multiple data ("SIMD") instruction issue techniques are used to support parallel execution of a large number of threads without providing multiple independent instruction units. In at least one embodiment, single instruction, multiple thread ("SIMT") techniques are used to support parallel execution of a large number of generally synchronized threads, using a common instruction unit configured to issue instructions to a set of processing engines within each processing cluster 1994.

In at least one embodiment, operation of processing cluster 1994 can be controlled via a pipeline manager 1932 that distributes processing tasks to SIMT parallel processors. In at least one embodiment, pipeline manager 1932 receives instructions from scheduler 1910 of FIG. 19 and manages execution of those instructions via a graphics multiprocessor 1934 and/or a texture unit 1936. In at least one embodiment, graphics multiprocessor 1934 is an exemplary instance of a SIMT parallel processor. However, in at least one embodiment, various types of SIMT parallel processors of differing architectures may be included within processing cluster 1994. In at least one embodiment, one or more instances of graphics multiprocessor 1934 can be included within processing cluster 1994. In at least one embodiment, graphics multiprocessor 1934 can process data and a data crossbar 1940 can be used to distribute processed data to one of multiple possible destinations, including other shader units. In at least one embodiment, pipeline manager 1932 can facilitate distribution of processed data by specifying destinations for processed data to be distributed via data crossbar 1940.

In at least one embodiment, each graphics multiprocessor 1934 within processing cluster 1994 can include an identical set of functional execution logic (e.g., arithmetic logic units, load/store units ("LSUs"), etc.). In at least one embodiment, functional execution logic can be configured in a pipelined manner in which new instructions can be issued before previous instructions are complete. In at least one embodiment, functional execution logic supports a variety of operations including integer and floating point arithmetic, comparison operations, Boolean operations, bit-shifting, and computation of various algebraic functions. In at least one embodiment, same functional-unit hardware can be leveraged to perform different operations and any combination of functional units may be present.

In at least one embodiment, instructions transmitted to processing cluster 1994 constitute a thread. In at least one embodiment, a set of threads executing across a set of parallel processing engines is a thread group. In at least one embodiment, a thread group executes a program on different input data. In at least one embodiment, each thread within a thread group can be assigned to a different processing engine within graphics multiprocessor 1934. In at least one embodiment, a thread group may include fewer threads than a number of processing engines within graphics multiprocessor 1934. In at least one embodiment, when a thread group includes fewer threads than a number of processing engines, one or more of the processing engines may be idle during cycles in which that thread group is being processed. In at least one embodiment, a thread group may also include more threads than a number of processing engines within graphics multiprocessor 1934. In at least one embodiment, when a thread group includes more threads than the number of processing engines within graphics multiprocessor 1934, processing can be performed over consecutive clock cycles. In at least one embodiment, multiple thread groups can be executed concurrently on graphics multiprocessor 1934.

In at least one embodiment, graphics multiprocessor 1934 includes an internal cache memory to perform load and store operations. In at least one embodiment, graphics multiprocessor 1934 can forego an internal cache and use a cache memory (e.g., L1 cache 1948) within processing cluster 1994. In at least one embodiment, each graphics multiprocessor 1934 also has access to Level 2 ("L2") caches within partition units (e.g., partition units 1920A-1920N of FIG. 19A) that are shared among all processing clusters 1994 and may be used to transfer data between threads. In at least one embodiment, graphics multiprocessor 1934 may also access off-chip global memory, which can include one or more of local parallel processor memory and/or system memory. In at least one embodiment, any memory external to parallel processing unit 1902 may be used as global memory. In at least one embodiment, processing cluster 1994 includes multiple instances of graphics multiprocessor 1934 that can share common instructions and data, which may be stored in L1 cache 1948.

In at least one embodiment, each processing cluster 1994 may include an MMU 1945 that is configured to map virtual addresses into physical addresses. In at least one embodiment, one or more instances of MMU 1945 may reside within memory interface 1918 of FIG. 19. In at least one embodiment, MMU 1945 includes a set of page table entries ("PTEs") used to map a virtual address to a physical address of a tile and optionally a cache line index. In at least one embodiment, MMU 1945 may include address translation lookaside buffers ("TLBs") or caches that may reside within graphics multiprocessor 1934 or L1 cache 1948 or processing cluster 1994. In at least one embodiment, a physical address is processed to distribute surface data access locality to allow efficient request interleaving among partition units. In at least one embodiment, a cache line index may be used to determine whether a request for a cache line is a hit or miss.

In at least one embodiment, processing cluster 1994 may be configured such that each graphics multiprocessor 1934 is coupled to a texture unit 1936 for performing texture mapping operations, e.g., determining texture sample positions, reading texture data, and filtering texture data. In at least one embodiment, texture data is read from an internal texture L1 cache (not shown) or from an L1 cache within graphics multiprocessor 1934 and is fetched from an L2 cache, local parallel processor memory, or system memory, as needed. In at least one embodiment, each graphics multiprocessor 1934 outputs a processed task to data crossbar 1940 to provide the processed task to another processing cluster 1994 for further processing or to store the processed task in an L2 cache, a local parallel processor memory, or a system memory via memory crossbar 1916. In at least one embodiment, a pre-raster operations unit ("preROP") 1942 is configured to receive data from graphics multiprocessor 1934, direct data to ROP units, which may be located with partition units as described herein (e.g., partition units 1920A-1920N of FIG. 19A). In at least one embodiment, PreROP 1942 can perform optimizations for color blending, organize pixel color data, and perform address translations.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 19C:
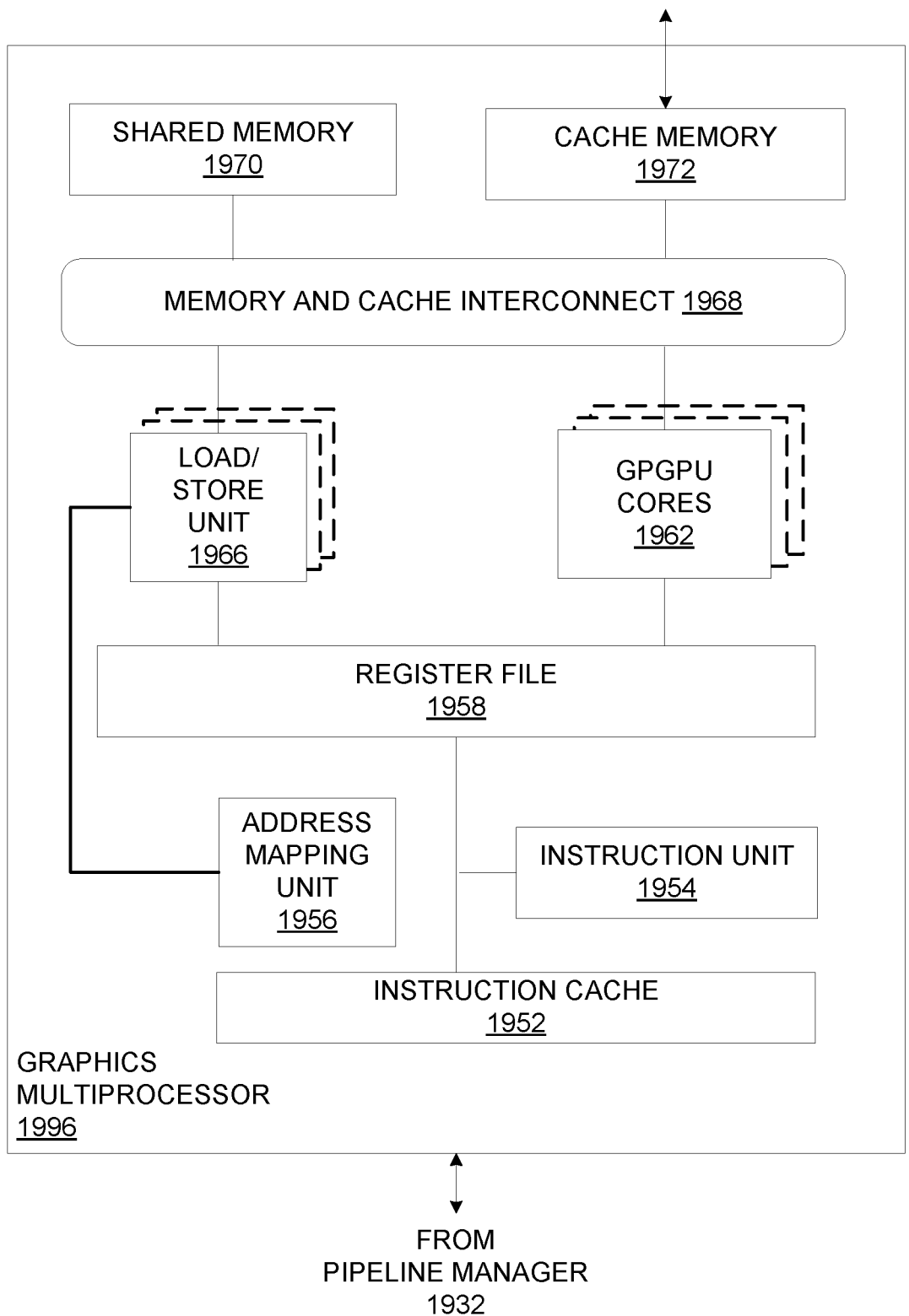
FIG. 19C illustrates a graphics multiprocessor, in accordance with at least one embodiment.

FIG. 19C illustrates a graphics multiprocessor 1996, in accordance with at least one embodiment. In at least one embodiment, graphics multiprocessor 1996 is graphics multiprocessor 1934 of FIG. 19B. In at least one embodiment, graphics multiprocessor 1996 couples with pipeline manager 1932 of processing cluster 1994. In at least one embodiment, graphics multiprocessor 1996 has an execution pipeline including but not limited to an instruction cache 1952, an instruction unit 1954, an address mapping unit 1956, a register file 1958, one or more GPGPU cores 1962, and one or more LSUs 1966. GPGPU cores 1962 and LSUs 1966 are coupled with cache memory 1972 and shared memory 1970 via a memory and cache interconnect 1968.

In at least one embodiment, instruction cache 1952 receives a stream of instructions to execute from pipeline manager 1932. In at least one embodiment, instructions are cached in instruction cache 1952 and dispatched for execution by instruction unit 1954. In at least one embodiment, instruction unit 1954 can dispatch instructions as thread groups (e.g., warps), with each thread of a thread group assigned to a different execution unit within GPGPU core 1962. In at least one embodiment, an instruction can access any of a local, shared, or global address space by specifying an address within a unified address space. In at least one embodiment, address mapping unit 1956 can be used to translate addresses in a unified address space into a distinct memory address that can be accessed by LSUs 1966.

In at least one embodiment, register file 1958 provides a set of registers for functional units of graphics multiprocessor 1996. In at least one embodiment, register file 1958 provides temporary storage for operands connected to data paths of functional units (e.g., GPGPU cores 1962, LSUs 1966) of graphics multiprocessor 1996. In at least one embodiment, register file 1958 is divided between each of functional units such that each functional unit is allocated a dedicated portion of register file 1958. In at least one embodiment, register file 1958 is divided between different thread groups being executed by graphics multiprocessor 1996.

In at least one embodiment, GPGPU cores 1962 can each include FPUs and/or integer ALUs that are used to execute instructions of graphics multiprocessor 1996. GPGPU cores 1962 can be similar in architecture or can differ in architecture. In at least one embodiment, a first portion of GPGPU cores 1962 include a single precision FPU and an integer ALU while a second portion of GPGPU cores 1962 include a double precision FPU. In at least one embodiment, FPUs can implement IEEE 754-2008 standard for floating point arithmetic or enable variable precision floating point arithmetic. In at least one embodiment, graphics multiprocessor 1996 can additionally include one or more fixed function or special function units to perform specific functions such as copy rectangle or pixel blending operations. In at least one embodiment one or more of GPGPU cores 1962 can also include fixed or special function logic.

In at least one embodiment, GPGPU cores 1962 include SIMD logic capable of performing a single instruction on multiple sets of data. In at least one embodiment GPGPU cores 1962 can physically execute SIMD4, SIMD8, and SIMD16 instructions and logically execute SIMD1, SIMD2, and SIMD32 instructions. In at least one embodiment, SIMD instructions for GPGPU cores 1962 can be generated at compile time by a shader compiler or automatically generated when executing programs written and compiled for single program multiple data ("SPMD") or SIMT architectures. In at least one embodiment, multiple threads of a program configured for an SIMT execution model can executed via a single SIMD instruction. For example, in at least one embodiment, eight SIMT threads that perform the same or similar operations can be executed in parallel via a single SIMD8 logic unit.

In at least one embodiment, memory and cache interconnect 1968 is an interconnect network that connects each functional unit of graphics multiprocessor 1996 to register file 1958 and to shared memory 1970. In at least one embodiment, memory and cache interconnect 1968 is a crossbar interconnect that allows LSU 1966 to implement load and store operations between shared memory 1970 and register file 1958. In at least one embodiment, register file 1958 can operate at a same frequency as GPGPU cores 1962, thus data transfer between GPGPU cores 1962 and register file 1958 is very low latency. In at least one embodiment, shared memory 1970 can be used to enable communication between threads that execute on functional units within graphics multiprocessor 1996. In at least one embodiment, cache memory 1972 can be used as a data cache for example, to cache texture data communicated between functional units and texture unit 1936. In at least one embodiment, shared memory 1970 can also be used as a program managed cached. In at least one embodiment, threads executing on GPGPU cores 1962 can programmatically store data within shared memory in addition to automatically cached data that is stored within cache memory 1972.

In at least one embodiment, a parallel processor or GPGPU as described herein is communicatively coupled to host/processor cores to accelerate graphics operations, machine-learning operations, pattern analysis operations, and various general purpose GPU (GPGPU) functions. In at least one embodiment, a GPU may be communicatively coupled to host processor/cores over a bus or other interconnect (e.g., a high speed interconnect such as PCIe or NVLink). In at least one embodiment, a GPU may be integrated on the same package or chip as cores and communicatively coupled to cores over a processor bus/interconnect that is internal to a package or a chip. In at least one embodiment, regardless of the manner in which a GPU is connected, processor cores may allocate work to the GPU in the form of sequences of commands/instructions contained in a WD. In at least one embodiment, the GPU then uses dedicated circuitry/logic for efficiently processing these commands/instructions.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 20:
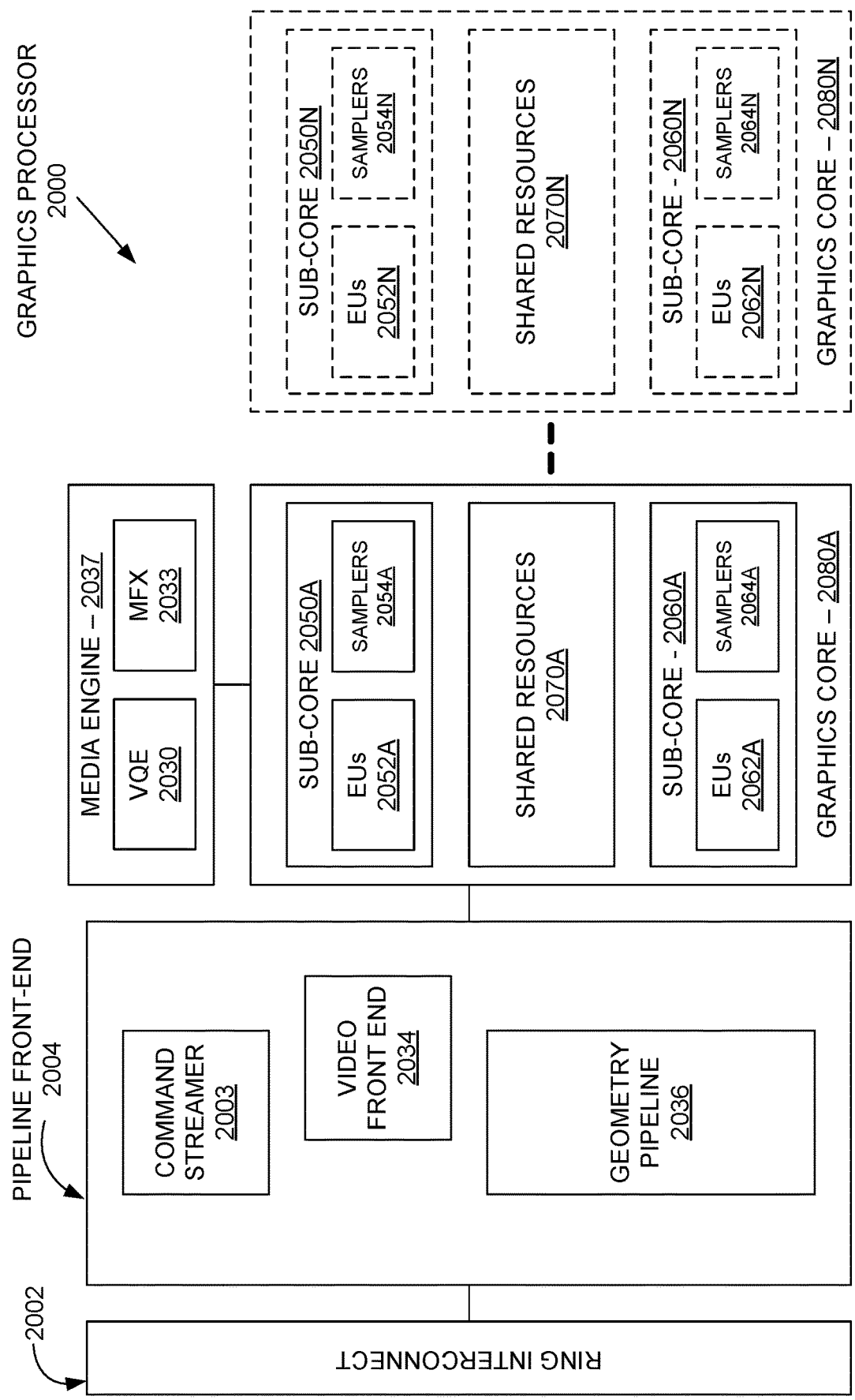
FIG. 20 illustrates a graphics processor, in accordance with at least one embodiment.

FIG. 20 illustrates a graphics processor 2000, in accordance with at least one embodiment. In at least one embodiment, graphics processor 2000 includes a ring interconnect 2002, a pipeline front-end 2004, a media engine 2037, and graphics cores 2080A-2080N. In at least one embodiment, ring interconnect 2002 couples graphics processor 2000 to other processing units, including other graphics processors or one or more general-purpose processor cores. In at least one embodiment, graphics processor 2000 is one of many processors integrated within a multi-core processing system.

In at least one embodiment, graphics processor 2000 receives batches of commands via ring interconnect 2002. In at least one embodiment, incoming commands are interpreted by a command streamer 2003 in pipeline front-end 2004. In at least one embodiment, graphics processor 2000 includes scalable execution logic to perform 3D geometry processing and media processing via graphics core(s) 2080A-2080N. In at least one embodiment, for 3D geometry processing commands, command streamer 2003 supplies commands to geometry pipeline 2036. In at least one embodiment, for at least some media processing commands, command streamer 2003 supplies commands to a video front end 2034, which couples with a media engine 2037. In at least one embodiment, media engine 2037 includes a Video Quality Engine ("VQE") 2030 for video and image post-processing and a multi-format encode/decode ("MFX") engine 2033 to provide hardware-accelerated media data encode and decode. In at least one embodiment, geometry pipeline 2036 and media engine 2037 each generate execution threads for thread execution resources provided by at least one graphics core 2080A.

In at least one embodiment, graphics processor 2000 includes scalable thread execution resources featuring modular graphics cores 2080A-2080N (sometimes referred to as core slices), each having multiple sub-cores 2050A-550N, 2060A-2060N (sometimes referred to as core sub-slices). In at least one embodiment, graphics processor 2000 can have any number of graphics cores 2080A through 2080N. In at least one embodiment, graphics processor 2000 includes a graphics core 2080A having at least a first sub-core 2050A and a second sub-core 2060A. In at least one embodiment, graphics processor 2000 is a low power processor with a single sub-core (e.g., sub-core 2050A). In at least one embodiment, graphics processor 2000 includes multiple graphics cores 2080A-2080N, each including a set of first sub-cores 2050A-2050N and a set of second sub-cores 2060A-2060N. In at least one embodiment, each sub-core in first sub-cores 2050A-2050N includes at least a first set of execution units ("EUs") 2052A-2052N and media/texture samplers 2054A-2054N. In at least one embodiment, each sub-core in second sub-cores 2060A-2060N includes at least a second set of execution units 2062A-2062N and samplers 2064A-2064N. In at least one embodiment, each sub-core 2050A-2050N, 2060A-2060N shares a set of shared resources 2070A-2070N. In at least one embodiment, shared resources 2070 include shared cache memory and pixel operation logic.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 21:
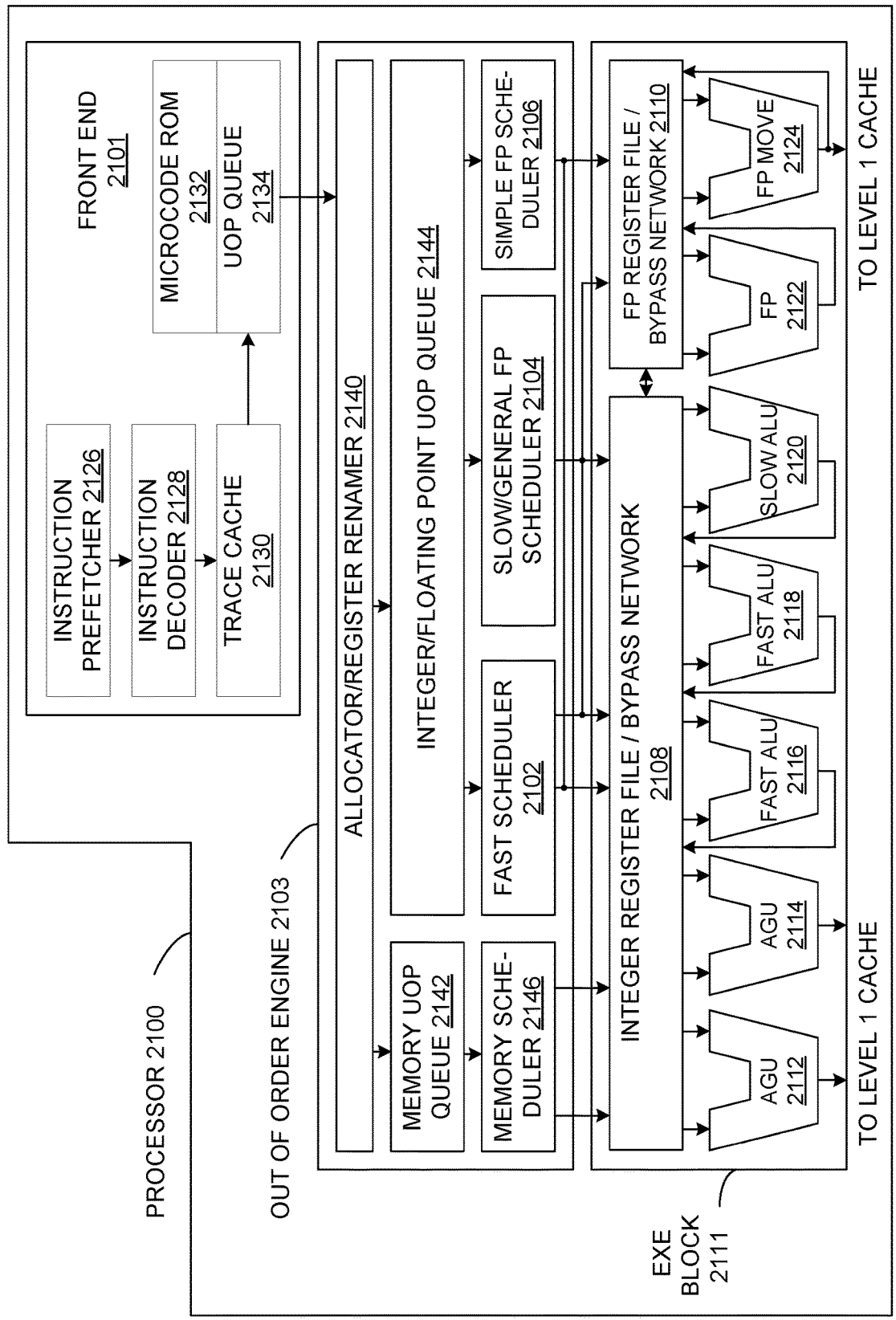
FIG. 21 illustrates a processor, in accordance with at least one embodiment.

FIG. 21 illustrates a processor 2100, in accordance with at least one embodiment. In at least one embodiment, processor 2100 may include, without limitation, logic circuits to perform instructions. In at least one embodiment, processor 2100 may perform instructions, including x86 instructions, ARM instructions, specialized instructions for ASICs, etc. In at least one embodiment, processor 2100 may include registers to store packed data, such as 64-bit wide MMX™ registers in microprocessors enabled with MMX technology from Intel Corporation of Santa Clara, Calif. In at least one embodiment, MMX registers, available in both integer and floating point forms, may operate with packed data elements that accompany SIMD and streaming SIMD extensions ("SSE") instructions. In at least one embodiment, 128-bit wide XMM registers relating to SSE2, SSE3, SSE4, AVX, or beyond (referred to generically as "SSEx") technology may hold such packed data operands. In at least one embodiment, processors 2110 may perform instructions to accelerate CUDA programs.

In at least one embodiment, processor 2100 includes an in-order front end ("front end") 2101 to fetch instructions to be executed and prepare instructions to be used later in processor pipeline. In at least one embodiment, front end 2101 may include several units. In at least one embodiment, an instruction prefetcher 2126 fetches instructions from memory and feeds instructions to an instruction decoder 2128 which in turn decodes or interprets instructions. For example, in at least one embodiment, instruction decoder 2128 decodes a received instruction into one or more operations called "micro-instructions" or "micro-operations" (also called "micro ops" or "uops") for execution. In at least one embodiment, instruction decoder 2128 parses instruction into an opcode and corresponding data and control fields that may be used by micro-architecture to perform operations. In at least one embodiment, a trace cache 2130 may assemble decoded uops into program ordered sequences or traces in a uop queue 2134 for execution. In at least one embodiment, when trace cache 2130 encounters a complex instruction, a microcode ROM 2132 provides uops needed to complete an operation.

In at least one embodiment, some instructions may be converted into a single micro-op, whereas others need several micro-ops to complete full operation. In at least one embodiment, if more than four micro-ops are needed to complete an instruction, instruction decoder 2128 may access microcode ROM 2132 to perform instruction. In at least one embodiment, an instruction may be decoded into a small number of micro-ops for processing at instruction decoder 2128. In at least one embodiment, an instruction may be stored within microcode ROM 2132 should a number of micro-ops be needed to accomplish operation. In at least one embodiment, trace cache 2130 refers to an entry point programmable logic array ("PLA") to determine a correct micro-instruction pointer for reading microcode sequences to complete one or more instructions from microcode ROM 2132. In at least one embodiment, after microcode ROM 2132 finishes sequencing micro-ops for an instruction, front end 2101 of machine may resume fetching micro-ops from trace cache 2130.

In at least one embodiment, out-of-order execution engine ("out of order engine") 2103 may prepare instructions for execution. In at least one embodiment, out-of-order execution logic has a number of buffers to smooth out and re-order the flow of instructions to optimize performance as they go down a pipeline and get scheduled for execution. Out-of-order execution engine 2103 includes, without limitation, an allocator/register renamer 2140, a memory uop queue 2142, an integer/floating point uop queue 2144, a memory scheduler 2146, a fast scheduler 2102, a slow/general floating point scheduler ("slow/general FP scheduler") 2104, and a simple floating point scheduler ("simple FP scheduler") 2106. In at least one embodiment, fast schedule 2102, slow/general floating point scheduler 2104, and simple floating point scheduler 2106 are also collectively referred to herein as "uop schedulers 2102, 2104, 2106." Allocator/register renamer 2140 allocates machine buffers and resources that each uop needs in order to execute. In at least one embodiment, allocator/register renamer 2140 renames logic registers onto entries in a register file. In at least one embodiment, allocator/register renamer 2140 also allocates an entry for each uop in one of two uop queues, memory uop queue 2142 for memory operations and integer/floating point uop queue 2144 for non-memory operations, in front of memory scheduler 2146 and uop schedulers 2102, 2104, 2106. In at least one embodiment, uop schedulers 2102, 2104, 2106, determine when a uop is ready to execute based on readiness of their dependent input register operand sources and availability of execution resources uops need to complete their operation. In at least one embodiment, fast scheduler 2102 of at least one embodiment may schedule on each half of main clock cycle while slow/general floating point scheduler 2104 and simple floating point scheduler 2106 may schedule once per main processor clock cycle. In at least one embodiment, uop schedulers 2102, 2104, 2106 arbitrate for dispatch ports to schedule uops for execution.

In at least one embodiment, execution block b 11 includes, without limitation, an integer register file/bypass network 2108, a floating point register file/bypass network ("FP register file/bypass network") 2110, address generation units ("AGUs") 2112 and 2114, fast ALUs 2116 and 2118, a slow ALU 2120, a floating point ALU ("FP") 2122, and a floating point move unit ("FP move") 2124. In at least one embodiment, integer register file/bypass network 2108 and floating point register file/bypass network 2110 are also referred to herein as "register files 2108, 2110." In at least one embodiment, AGUSs 2112 and 2114, fast ALUs 2116 and 2118, slow ALU 2120, floating point ALU 2122, and floating point move unit 2124 are also referred to herein as "execution units 2112, 2114, 2116, 2118, 2120, 2122, and 2124." In at least one embodiment, an execution block may include, without limitation, any number (including zero) and type of register files, bypass networks, address generation units, and execution units, in any combination.

In at least one embodiment, register files 2108, 2110 may be arranged between uop schedulers 2102, 2104, 2106, and execution units 2112, 2114, 2116, 2118, 2120, 2122, and 2124. In at least one embodiment, integer register file/bypass network 2108 performs integer operations. In at least one embodiment, floating point register file/bypass network 2110 performs floating point operations. In at least one embodiment, each of register files 2108, 2110 may include, without limitation, a bypass network that may bypass or forward just completed results that have not yet been written into register file to new dependent uops. In at least one embodiment, register files 2108, 2110 may communicate data with each other. In at least one embodiment, integer register file/bypass network 2108 may include, without limitation, two separate register files, one register file for low-order thirty-two bits of data and a second register file for high order thirty-two bits of data. In at least one embodiment, floating point register file/bypass network 2110 may include, without limitation, 128-bit wide entries because floating point instructions typically have operands from 64 to 128 bits in width.

In at least one embodiment, execution units 2112, 2114, 2116, 2118, 2120, 2122, 2124 may execute instructions. In at least one embodiment, register files 2108, 2110 store integer and floating point data operand values that micro-instructions need to execute. In at least one embodiment, processor 2100 may include, without limitation, any number and combination of execution units 2112, 2114, 2116, 2118, 2120, 2122, 2124. In at least one embodiment, floating point ALU 2122 and floating point move unit 2124 may execute floating point, MMX, SIMD, AVX and SSE, or other operations. In at least one embodiment, floating point ALU 2122 may include, without limitation, a 64-bit by 64-bit floating point divider to execute divide, square root, and remainder micro ops. In at least one embodiment, instructions involving a floating point value may be handled with floating point hardware. In at least one embodiment, ALU operations may be passed to fast ALUs 2116, 2118. In at least one embodiment, fast ALUS 2116, 2118 may execute fast operations with an effective latency of half a clock cycle. In at least one embodiment, most complex integer operations go to slow ALU 2120 as slow ALU 2120 may include, without limitation, integer execution hardware for long-latency type of operations, such as a multiplier, shifts, flag logic, and branch processing. In at least one embodiment, memory load/store operations may be executed by AGUs 2112, 2114. In at least one embodiment, fast ALU 2116, fast ALU 2118, and slow ALU 2120 may perform integer operations on 64-bit data operands. In at least one embodiment, fast ALU 2116, fast ALU 2118, and slow ALU 2120 may be implemented to support a variety of data bit sizes including sixteen, thirty-two, 128, 256, etc. In at least one embodiment, floating point ALU 2122 and floating point move unit 2124 may be implemented to support a range of operands having bits of various widths. In at least one embodiment, floating point ALU 2122 and floating point move unit 2124 may operate on 128-bit wide packed data operands in conjunction with SIMD and multimedia instructions.

In at least one embodiment, uop schedulers 2102, 2104, 2106 dispatch dependent operations before parent load has finished executing. In at least one embodiment, as uops may be speculatively scheduled and executed in processor 2100, processor 2100 may also include logic to handle memory misses. In at least one embodiment, if a data load misses in a data cache, there may be dependent operations in flight in pipeline that have left a scheduler with temporarily incorrect data. In at least one embodiment, a replay mechanism tracks and re-executes instructions that use incorrect data. In at least one embodiment, dependent operations might need to be replayed and independent ones may be allowed to complete. In at least one embodiment, schedulers and replay mechanisms of at least one embodiment of a processor may also be designed to catch instruction sequences for text string comparison operations.

In at least one embodiment, the term "registers" may refer to on-board processor storage locations that may be used as part of instructions to identify operands. In at least one embodiment, registers may be those that may be usable from outside of a processor (from a programmer's perspective). In at least one embodiment, registers might not be limited to a particular type of circuit. Rather, in at least one embodiment, a register may store data, provide data, and perform functions described herein. In at least one embodiment, registers described herein may be implemented by circuitry within a processor using any number of different techniques, such as dedicated physical registers, dynamically allocated physical registers using register renaming, combinations of dedicated and dynamically allocated physical registers, etc. In at least one embodiment, integer registers store 32-bit integer data. A register file of at least one embodiment also contains eight multimedia SIMD registers for packed data.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 22:
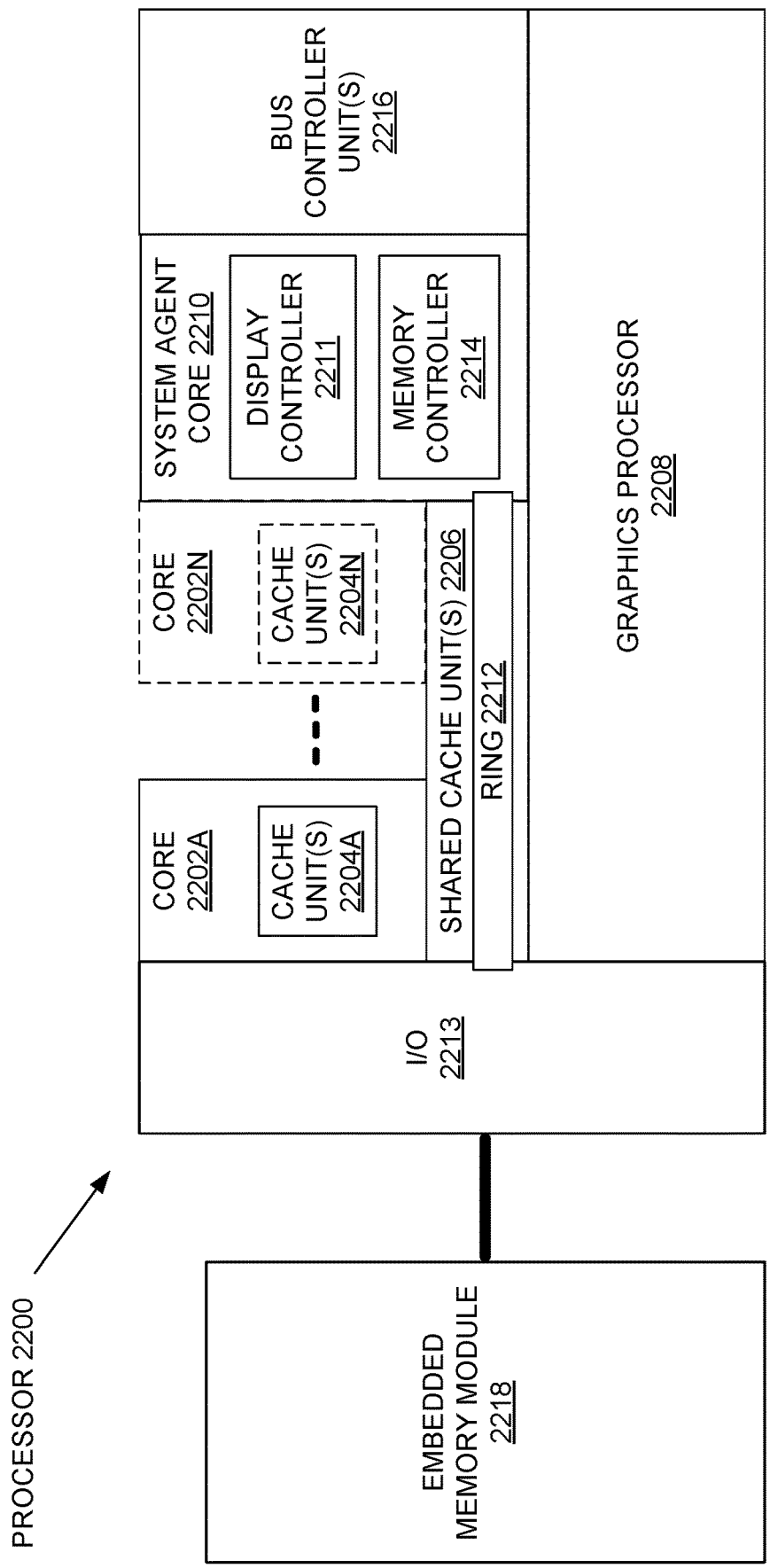
FIG. 22 illustrates a processor, in accordance with at least one embodiment.

FIG. 22 illustrates a processor 2200, in accordance with at least one embodiment. In at least one embodiment, processor 2200 includes, without limitation, one or more processor cores ("cores") 2202A-2202N, an integrated memory controller 2214, and an integrated graphics processor 2208. In at least one embodiment, processor 2200 can include additional cores up to and including additional processor core 2202N represented by dashed lined boxes. In at least one embodiment, each of processor cores 2202A-2202N includes one or more internal cache units 2204A-2204N. In at least one embodiment, each processor core also has access to one or more shared cached units 2206.

In at least one embodiment, internal cache units 2204A-2204N and shared cache units 2206 represent a cache memory hierarchy within processor 2200. In at least one embodiment, cache memory units 2204A-2204N may include at least one level of instruction and data cache within each processor core and one or more levels of shared mid-level cache, such as an L2, L3, Level 4 ("L4"), or other levels of cache, where a highest level of cache before external memory is classified as an LLC. In at least one embodiment, cache coherency logic maintains coherency between various cache units 2206 and 2204A-2204N.

In at least one embodiment, processor 2200 may also include a set of one or more bus controller units 2216 and a system agent core 2210. In at least one embodiment, one or more bus controller units 2216 manage a set of peripheral buses, such as one or more PCI or PCI express buses. In at least one embodiment, system agent core 2210 provides management functionality for various processor components. In at least one embodiment, system agent core 2210 includes one or more integrated memory controllers 2214 to manage access to various external memory devices (not shown).

In at least one embodiment, one or more of processor cores 2202A-2202N include support for simultaneous multi-threading. In at least one embodiment, system agent core 2210 includes components for coordinating and operating processor cores 2202A-2202N during multi-threaded processing. In at least one embodiment, system agent core 2210 may additionally include a power control unit ("PCU"), which includes logic and components to regulate one or more power states of processor cores 2202A-2202N and graphics processor 2208.

In at least one embodiment, processor 2200 additionally includes graphics processor 2208 to execute graphics processing operations. In at least one embodiment, graphics processor 2208 couples with shared cache units 2206, and system agent core 2210, including one or more integrated memory controllers 2214. In at least one embodiment, system agent core 2210 also includes a display controller 2211 to drive graphics processor output to one or more coupled displays. In at least one embodiment, display controller 2211 may also be a separate module coupled with graphics processor 2208 via at least one interconnect, or may be integrated within graphics processor 2208.

In at least one embodiment, a ring based interconnect unit 2212 is used to couple internal components of processor 2200. In at least one embodiment, an alternative interconnect unit may be used, such as a point-to-point interconnect, a switched interconnect, or other techniques. In at least one embodiment, graphics processor 2208 couples with ring interconnect 2212 via an I/O link 2213.

In at least one embodiment, I/O link 2213 represents at least one of multiple varieties of I/O interconnects, including an on package I/O interconnect which facilitates communication between various processor components and a high-performance embedded memory module 2218, such as an eDRAM module. In at least one embodiment, each of processor cores 2202A-2202N and graphics processor 2208 use embedded memory modules 2218 as a shared LLC.

In at least one embodiment, processor cores 2202A-2202N are homogeneous cores executing a common instruction set architecture. In at least one embodiment, processor cores 2202A-2202N are heterogeneous in terms of ISA, where one or more of processor cores 2202A-2202N execute a common instruction set, while one or more other cores of processor cores 2202A-2202N executes a subset of a common instruction set or a different instruction set. In at least one embodiment, processor cores 2202A-2202N are heterogeneous in terms of microarchitecture, where one or more cores having a relatively higher power consumption couple with one or more cores having a lower power consumption. In at least one embodiment, processor 2200 can be implemented on one or more chips or as an SoC integrated circuit.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 23:
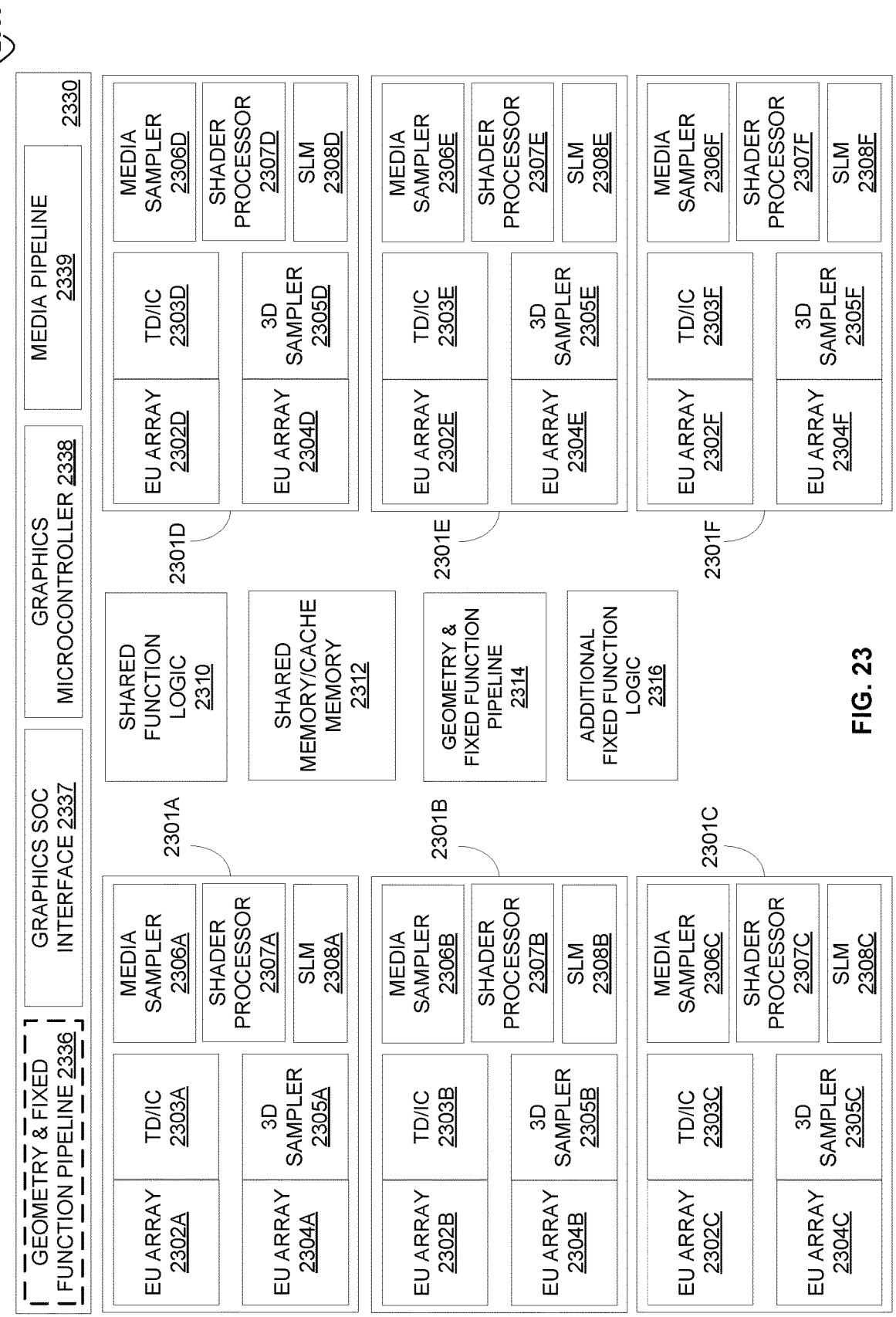
FIG. 23 illustrates a graphics processor core, in accordance with at least one embodiment.

FIG. 23 illustrates a graphics processor core 2300, in accordance with at least one embodiment described. In at least one embodiment, graphics processor core 2300 is included within a graphics core array. In at least one embodiment, graphics processor core 2300, sometimes referred to as a core slice, can be one or multiple graphics cores within a modular graphics processor. In at least one embodiment, graphics processor core 2300 is exemplary of one graphics core slice, and a graphics processor as described herein may include multiple graphics core slices based on target power and performance envelopes. In at least one embodiment, each graphics core 2300 can include a fixed function block 2330 coupled with multiple sub-cores 2301A-2301F, also referred to as sub-slices, that include modular blocks of general-purpose and fixed function logic.

In at least one embodiment, fixed function block 2330 includes a geometry/fixed function pipeline 2336 that can be shared by all sub-cores in graphics processor 2300, for example, in lower performance and/or lower power graphics processor implementations. In at least one embodiment, geometry/fixed function pipeline 2336 includes a 3D fixed function pipeline, a video front-end unit, a thread spawner and thread dispatcher, and a unified return buffer manager, which manages unified return buffers.

In at least one embodiment, fixed function block 2330 also includes a graphics SoC interface 2337, a graphics microcontroller 2338, and a media pipeline 2339. Graphics SoC interface 2337 provides an interface between graphics core 2300 and other processor cores within an SoC integrated circuit. In at least one embodiment, graphics microcontroller 2338 is a programmable sub-processor that is configurable to manage various functions of graphics processor 2300, including thread dispatch, scheduling, and pre-emption. In at least one embodiment, media pipeline 2339 includes logic to facilitate decoding, encoding, pre-processing, and/or post-processing of multimedia data, including image and video data. In at least one embodiment, media pipeline 2339 implements media operations via requests to compute or sampling logic within sub-cores 2301-2301F.

In at least one embodiment, SoC interface 2337 enables graphics core 2300 to communicate with general-purpose application processor cores (e.g., CPUs) and/or other components within an SoC, including memory hierarchy elements such as a shared LLC memory, system RAM, and/or embedded on-chip or on-package DRAM. In at least one embodiment, SoC interface 2337 can also enable communication with fixed function devices within an SoC, such as camera imaging pipelines, and enables use of and/or implements global memory atomics that may be shared between graphics core 2300 and CPUs within an SoC. In at least one embodiment, SoC interface 2337 can also implement power management controls for graphics core 2300 and enable an interface between a clock domain of graphic core 2300 and other clock domains within an SoC. In at least one embodiment, SoC interface 2337 enables receipt of command buffers from a command streamer and global thread dispatcher that are configured to provide commands and instructions to each of one or more graphics cores within a graphics processor. In at least one embodiment, commands and instructions can be dispatched to media pipeline 2339, when media operations are to be performed, or a geometry and fixed function pipeline (e.g., geometry and fixed function pipeline 2336, geometry and fixed function pipeline 2314) when graphics processing operations are to be performed.

In at least one embodiment, graphics microcontroller 2338 can be configured to perform various scheduling and management tasks for graphics core 2300. In at least one embodiment, graphics microcontroller 2338 can perform graphics and/or compute workload scheduling on various graphics parallel engines within execution unit (EU) arrays 2302A-2302F, 2304A-2304F within sub-cores 2301A-2301F. In at least one embodiment, host software executing on a CPU core of an SoC including graphics core 2300 can submit workloads one of multiple graphic processor doorbells, which invokes a scheduling operation on an appropriate graphics engine. In at least one embodiment, scheduling operations include determining which workload to run next, submitting a workload to a command streamer, pre-empting existing workloads running on an engine, monitoring progress of a workload, and notifying host software when a workload is complete. In at least one embodiment, graphics microcontroller 2338 can also facilitate low-power or idle states for graphics core 2300, providing graphics core 2300 with an ability to save and restore registers within graphics core 2300 across low-power state transitions independently from an operating system and/or graphics driver software on a system.

In at least one embodiment, graphics core 2300 may have greater than or fewer than illustrated sub-cores 2301A-2301F, up to N modular sub-cores. For each set of N sub-cores, in at least one embodiment, graphics core 2300 can also include shared function logic 2310, shared and/or cache memory 2312, a geometry/fixed function pipeline 2314, as well as additional fixed function logic 2316 to accelerate various graphics and compute processing operations. In at least one embodiment, shared function logic 2310 can include logic units (e.g., sampler, math, and/or inter-thread communication logic) that can be shared by each N sub-cores within graphics core 2300. Shared and/or cache memory 2312 can be an LLC for N sub-cores 2301A-2301F within graphics core 2300 and can also serve as shared memory that is accessible by multiple sub-cores. In at least one embodiment, geometry/fixed function pipeline 2314 can be included instead of geometry/fixed function pipeline 2336 within fixed function block 2330 and can include same or similar logic units.

In at least one embodiment, graphics core 2300 includes additional fixed function logic 2316 that can include various fixed function acceleration logic for use by graphics core 2300. In at least one embodiment, additional fixed function logic 2316 includes an additional geometry pipeline for use in position only shading. In position-only shading, at least two geometry pipelines exist, whereas in a full geometry pipeline within geometry/fixed function pipeline 2316, 2336, and a cull pipeline, which is an additional geometry pipeline which may be included within additional fixed function logic 2316. In at least one embodiment, cull pipeline is a trimmed down version of a full geometry pipeline. In at least one embodiment, a full pipeline and a cull pipeline can execute different instances of an application, each instance having a separate context. In at least one embodiment, position only shading can hide long cull runs of discarded triangles, enabling shading to be completed earlier in some instances. For example, in at least one embodiment, cull pipeline logic within additional fixed function logic 2316 can execute position shaders in parallel with a main application and generally generates critical results faster than a full pipeline, as a cull pipeline fetches and shades position attribute of vertices, without performing rasterization and rendering of pixels to a frame buffer. In at least one embodiment, a cull pipeline can use generated critical results to compute visibility information for all triangles without regard to whether those triangles are culled. In at least one embodiment, a full pipeline (which in this instance may be referred to as a replay pipeline) can consume visibility information to skip culled triangles to shade only visible triangles that are finally passed to a rasterization phase.

In at least one embodiment, additional fixed function logic 2316 can also include general purpose processing acceleration logic, such as fixed function matrix multiplication logic, for accelerating CUDA programs.

In at least one embodiment, each graphics sub-core 2301A-2301F includes a set of execution resources that may be used to perform graphics, media, and compute operations in response to requests by graphics pipeline, media pipeline, or shader programs. In at least one embodiment, graphics sub-cores 2301A-2301F include multiple EU arrays 2302A-2302F, 2304A-2304F, thread dispatch and inter-thread communication ("TD/IC") logic 2303A-2303F, a 3D (e.g., texture) sampler 2305A-2305F, a media sampler 2306A-2306F, a shader processor 2307A-2307F, and shared local memory ("SLM") 2308A-2308F. EU arrays 2302A-2302F, 2304A-2304F each include multiple execution units, which are GPGPUs capable of performing floating-point and integer/fixed-point logic operations in service of a graphics, media, or compute operation, including graphics, media, or compute shader programs. In at least one embodiment, TD/IC logic 2303A-2303F performs local thread dispatch and thread control operations for execution units within a sub-core and facilitate communication between threads executing on execution units of a sub-core. In at least one embodiment, 3D sampler 2305A-2305F can read texture or other 3D graphics related data into memory. In at least one embodiment, 3D sampler can read texture data differently based on a configured sample state and texture format associated with a given texture. In at least one embodiment, media sampler 2306A-2306F can perform similar read operations based on a type and format associated with media data. In at least one embodiment, each graphics sub-core 2301A-2301F can alternately include a unified 3D and media sampler. In at least one embodiment, threads executing on execution units within each of sub-cores 2301A-2301F can make use of shared local memory 2308A-2308F within each sub-core, to enable threads executing within a thread group to execute using a common pool of on-chip memory.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 24:
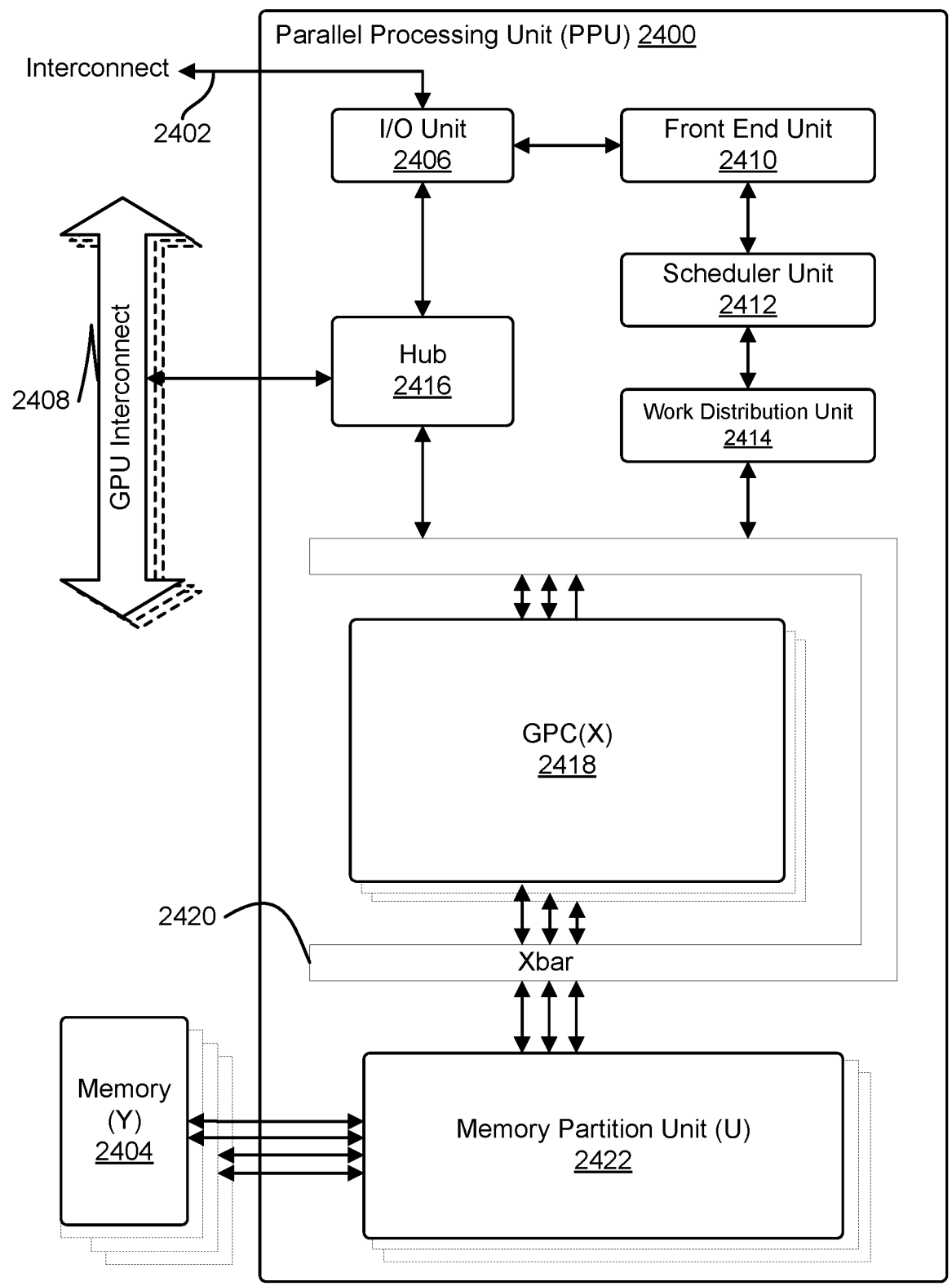
FIG. 24 illustrates a PPU, in accordance with at least one embodiment.

FIG. 24 illustrates a parallel processing unit ("PPU") 2400, in accordance with at least one embodiment. In at least one embodiment, PPU 2400 is configured with machine-readable code that, if executed by PPU 2400, causes PPU 2400 to perform some or all of processes and techniques described herein. In at least one embodiment, PPU 2400 is a multi-threaded processor that is implemented on one or more integrated circuit devices and that utilizes multithreading as a latency-hiding technique designed to process computer-readable instructions (also referred to as machine-readable instructions or simply instructions) on multiple threads in parallel. In at least one embodiment, a thread refers to a thread of execution and is an instantiation of a set of instructions configured to be executed by PPU 2400. In at least one embodiment, PPU 2400 is a GPU configured to implement a graphics rendering pipeline for processing three-dimensional ("3D") graphics data in order to generate two-dimensional ("2D") image data for display on a display device such as an LCD device. In at least one embodiment, PPU 2400 is utilized to perform computations such as linear algebra operations and machine-learning operations. FIG. 24 illustrates an example parallel processor for illustrative purposes only and should be construed as a non-limiting example of a processor architecture that may be implemented in at least one embodiment.

In at least one embodiment, one or more PPUs 2400 are configured to accelerate High Performance Computing ("HPC"), data center, and machine learning applications. In at least one embodiment, one or more PPUs 2400 are configured to accelerate CUDA programs. In at least one embodiment, PPU 2400 includes, without limitation, an I/O unit 2406, a front-end unit 2410, a scheduler unit 2412, a work distribution unit 2414, a hub 2416, a crossbar ("Xbar") 2420, one or more general processing clusters ("GPCs") 2418, and one or more partition units ("memory partition units") 2422. In at least one embodiment, PPU 2400 is connected to a host processor or other PPUs 2400 via one or more high-speed GPU interconnects ("GPU interconnects") 2408. In at least one embodiment, PPU 2400 is connected to a host processor or other peripheral devices via an interconnect 2402. In at least one embodiment, PPU 2400 is connected to a local memory comprising one or more memory devices ("memory") 2404. In at least one embodiment, memory devices 2404 include, without limitation, one or more dynamic random access memory (DRAM) devices. In at least one embodiment, one or more DRAM devices are configured and/or configurable as high-bandwidth memory ("HBM") subsystems, with multiple DRAM dies stacked within each device.

In at least one embodiment, high-speed GPU interconnect 2408 may refer to a wire-based multi-lane communications link that is used by systems to scale and include one or more PPUs 2400 combined with one or more CPUs, supports cache coherence between PPUs 2400 and CPUs, and CPU mastering. In at least one embodiment, data and/or commands are transmitted by high-speed GPU interconnect 2408 through hub 2416 to/from other units of PPU 2400 such as one or more copy engines, video encoders, video decoders, power management units, and other components which may not be explicitly illustrated in FIG. 24.

In at least one embodiment, I/O unit 2406 is configured to transmit and receive communications (e.g., commands, data) from a host processor (not illustrated in FIG. 24) over system bus 2402. In at least one embodiment, I/O unit 2406 communicates with host processor directly via system bus 2402 or through one or more intermediate devices such as a memory bridge. In at least one embodiment, I/O unit 2406 may communicate with one or more other processors, such as one or more of PPUs 2400 via system bus 2402. In at least one embodiment, I/O unit 2406 implements a PCIe interface for communications over a PCIe bus. In at least one embodiment, I/O unit 2406 implements interfaces for communicating with external devices.

In at least one embodiment, I/O unit 2406 decodes packets received via system bus 2402. In at least one embodiment, at least some packets represent commands configured to cause PPU 2400 to perform various operations. In at least one embodiment, I/O unit 2406 transmits decoded commands to various other units of PPU 2400 as specified by commands. In at least one embodiment, commands are transmitted to front-end unit 2410 and/or transmitted to hub 2416 or other units of PPU 2400 such as one or more copy engines, a video encoder, a video decoder, a power management unit, etc. (not explicitly illustrated in FIG. 24). In at least one embodiment, I/O unit 2406 is configured to route communications between and among various logical units of PPU 2400.

In at least one embodiment, a program executed by host processor encodes a command stream in a buffer that provides workloads to PPU 2400 for processing. In at least one embodiment, a workload comprises instructions and data to be processed by those instructions. In at least one embodiment, buffer is a region in a memory that is accessible (e.g., read/write) by both a host processor and PPU 2400—a host interface unit may be configured to access buffer in a system memory connected to system bus 2402 via memory requests transmitted over system bus 2402 by I/O unit 2406. In at least one embodiment, a host processor writes a command stream to a buffer and then transmits a pointer to the start of the command stream to PPU 2400 such that front-end unit 2410 receives pointers to one or more command streams and manages one or more command streams, reading commands from command streams and forwarding commands to various units of PPU 2400.

In at least one embodiment, front-end unit 2410 is coupled to scheduler unit 2412 that configures various GPCs 2418 to process tasks defined by one or more command streams. In at least one embodiment, scheduler unit 2412 is configured to track state information related to various tasks managed by scheduler unit 2412 where state information may indicate which of GPCs 2418 a task is assigned to, whether task is active or inactive, a priority level associated with task, and so forth. In at least one embodiment, scheduler unit 2412 manages execution of a plurality of tasks on one or more of GPCs 2418.

In at least one embodiment, scheduler unit 2412 is coupled to work distribution unit 2414 that is configured to dispatch tasks for execution on GPCs 2418. In at least one embodiment, work distribution unit 2414 tracks a number of scheduled tasks received from scheduler unit 2412 and work distribution unit 2414 manages a pending task pool and an active task pool for each of GPCs 2418. In at least one embodiment, pending task pool comprises a number of slots (e.g., 32 slots) that contain tasks assigned to be processed by a particular GPC 2418; active task pool may comprise a number of slots (e.g., 4 slots) for tasks that are actively being processed by GPCs 2418 such that as one of GPCs 2418 completes execution of a task, that task is evicted from active task pool for GPC 2418 and one of other tasks from pending task pool is selected and scheduled for execution on GPC 2418. In at least one embodiment, if an active task is idle on GPC 2418, such as while waiting for a data dependency to be resolved, then the active task is evicted from GPC 2418 and returned to a pending task pool while another task in the pending task pool is selected and scheduled for execution on GPC 2418.

In at least one embodiment, work distribution unit 2414 communicates with one or more GPCs 2418 via XBar 2420. In at least one embodiment, XBar 2420 is an interconnect network that couples many units of PPU 2400 to other units of PPU 2400 and can be configured to couple work distribution unit 2414 to a particular GPC 2418. In at least one embodiment, one or more other units of PPU 2400 may also be connected to XBar 2420 via hub 2416.

In at least one embodiment, tasks are managed by scheduler unit 2412 and dispatched to one of GPCs 2418 by work distribution unit 2414. GPC 2418 is configured to process task and generate results. In at least one embodiment, results may be consumed by other tasks within GPC 2418, routed to a different GPC 2418 via XBar 2420, or stored in memory 2404. In at least one embodiment, results can be written to memory 2404 via partition units 2422, which implement a memory interface for reading and writing data to/from memory 2404. In at least one embodiment, results can be transmitted to another PPU 2404 or CPU via high-speed GPU interconnect 2408. In at least one embodiment, PPU 2400 includes, without limitation, a number U of partition units 2422 that is equal to number of separate and distinct memory devices 2404 coupled to PPU 2400.

In at least one embodiment, a host processor executes a driver kernel that implements an application programming interface ("API") that enables one or more applications executing on host processor to schedule operations for execution on PPU 2400. In at least one embodiment, multiple compute applications are simultaneously executed by PPU 2400 and PPU 2400 provides isolation, quality of service ("QoS"), and independent address spaces for multiple compute applications. In at least one embodiment, an application generates instructions (e.g., in the form of API calls) that cause a driver kernel to generate one or more tasks for execution by PPU 2400 and the driver kernel outputs tasks to one or more streams being processed by PPU 2400. In at least one embodiment, each task comprises one or more groups of related threads, which may be referred to as a warp. In at least one embodiment, a warp comprises a plurality of related threads (e.g., 32 threads) that can be executed in parallel. In at least one embodiment, cooperating threads can refer to a plurality of threads including instructions to perform a task and that exchange data through shared memory.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 25:
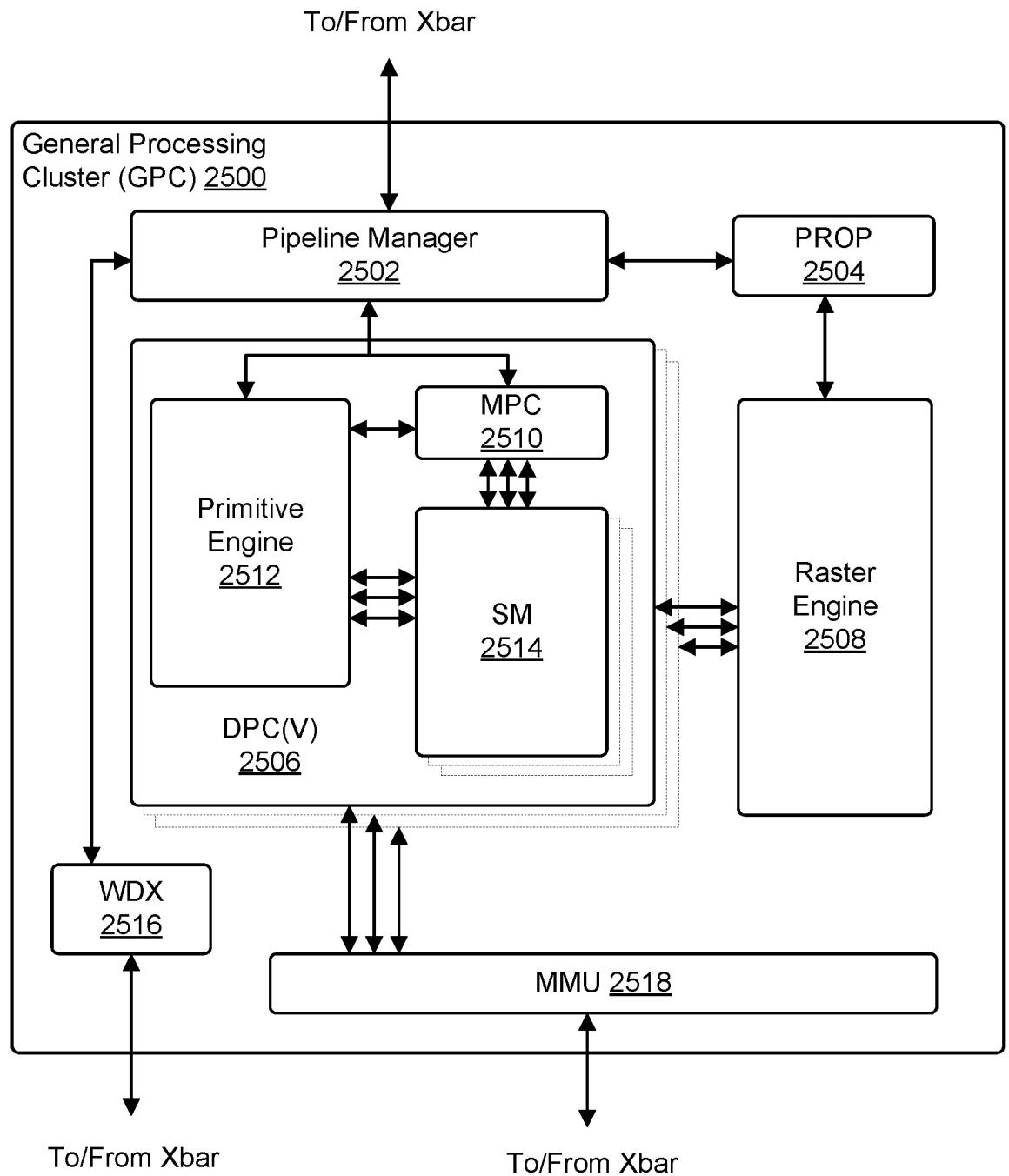
FIG. 25 illustrates a GPC, in accordance with at least one embodiment.

FIG. 25 illustrates a GPC 2500, in accordance with at least one embodiment. In at least one embodiment, GPC 2500 is GPC 2418 of FIG. 24. In at least one embodiment, each GPC 2500 includes, without limitation, a number of hardware units for processing tasks and each GPC 2500 includes, without limitation, a pipeline manager 2502, a pre-raster operations unit ("PROP") 2504, a raster engine 2508, a work distribution crossbar ("WDX") 2516, an MMU 2518, one or more Data Processing Clusters ("DPCs") 2506, and any suitable combination of parts.

In at least one embodiment, operation of GPC 2500 is controlled by pipeline manager 2502. In at least one embodiment, pipeline manager 2502 manages configuration of one or more DPCs 2506 for processing tasks allocated to GPC 2500. In at least one embodiment, pipeline manager 2502 configures at least one of one or more DPCs 2506 to implement at least a portion of a graphics rendering pipeline. In at least one embodiment, DPC 2506 is configured to execute a vertex shader program on a programmable streaming multiprocessor ("SM") 2514. In at least one embodiment, pipeline manager 2502 is configured to route packets received from a work distribution unit to appropriate logical units within GPC 2500 and, in at least one embodiment, some packets may be routed to fixed function hardware units in PROP 2504 and/or raster engine 2508 while other packets may be routed to DPCs 2506 for processing by a primitive engine 2512 or SM 2514. In at least one embodiment, pipeline manager 2502 configures at least one of DPCs 2506 to implement a computing pipeline. In at least one embodiment, pipeline manager 2502 configures at least one of DPCs 2506 to execute at least a portion of a CUDA program.

In at least one embodiment, PROP unit 2504 is configured to route data generated by raster engine 2508 and DPCs 2506 to a Raster Operations ("ROP") unit in a partition unit, such as memory partition unit 2422 described in more detail above in conjunction with FIG. 24. In at least one embodiment, PROP unit 2504 is configured to perform optimizations for color blending, organize pixel data, perform address translations, and more. In at least one embodiment, raster engine 2508 includes, without limitation, a number of fixed function hardware units configured to perform various raster operations and, in at least one embodiment, raster engine 2508 includes, without limitation, a setup engine, a coarse raster engine, a culling engine, a clipping engine, a fine raster engine, a tile coalescing engine, and any suitable combination thereof. In at least one embodiment, a setup engine receives transformed vertices and generates plane equations associated with geometric primitive defined by vertices; plane equations are transmitted to a coarse raster engine to generate coverage information (e.g., an x, y coverage mask for a tile) for a primitive; the output of the coarse raster engine is transmitted to a culling engine where fragments associated with a primitive that fail a z-test are culled, and transmitted to a clipping engine where fragments lying outside a viewing frustum are clipped. In at least one embodiment, fragments that survive clipping and culling are passed to a fine raster engine to generate attributes for pixel fragments based on plane equations generated by a setup engine. In at least one embodiment, the output of raster engine 2508 comprises fragments to be processed by any suitable entity such as by a fragment shader implemented within DPC 2506.

In at least one embodiment, each DPC 2506 included in GPC 2500 comprise, without limitation, an M-Pipe Controller ("MPC") 2510; primitive engine 2512; one or more SMs 2514; and any suitable combination thereof. In at least one embodiment, MPC 2510 controls operation of DPC 2506, routing packets received from pipeline manager 2502 to appropriate units in DPC 2506. In at least one embodiment, packets associated with a vertex are routed to primitive engine 2512, which is configured to fetch vertex attributes associated with vertex from memory; in contrast, packets associated with a shader program may be transmitted to SM 2514.

In at least one embodiment, SM 2514 comprises, without limitation, a programmable streaming processor that is configured to process tasks represented by a number of threads. In at least one embodiment, SM 2514 is multi-threaded and configured to execute a plurality of threads (e.g., 32 threads) from a particular group of threads concurrently and implements a SIMD architecture where each thread in a group of threads (e.g., a warp) is configured to process a different set of data based on same set of instructions. In at least one embodiment, all threads in group of threads execute same instructions. In at least one embodiment, SM 2514 implements a SIMT architecture wherein each thread in a group of threads is configured to process a different set of data based on same set of instructions, but where individual threads in group of threads are allowed to diverge during execution. In at least one embodiment, a program counter, a call stack, and an execution state is maintained for each warp, enabling concurrency between warps and serial execution within warps when threads within a warp diverge. In another embodiment, a program counter, a call stack, and an execution state is maintained for each individual thread, enabling equal concurrency between all threads, within and between warps. In at least one embodiment, an execution state is maintained for each individual thread and threads executing the same instructions may be converged and executed in parallel for better efficiency. At least one embodiment of SM 2514 is described in more detail in conjunction with FIG. 26.

In at least one embodiment, MMU 2518 provides an interface between GPC 2500 and a memory partition unit (e.g., partition unit 2422 of FIG. 24) and MMU 2518 provides translation of virtual addresses into physical addresses, memory protection, and arbitration of memory requests. In at least one embodiment, MMU 2518 provides one or more translation lookaside buffers (TLBs) for performing translation of virtual addresses into physical addresses in memory.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Figure 26:
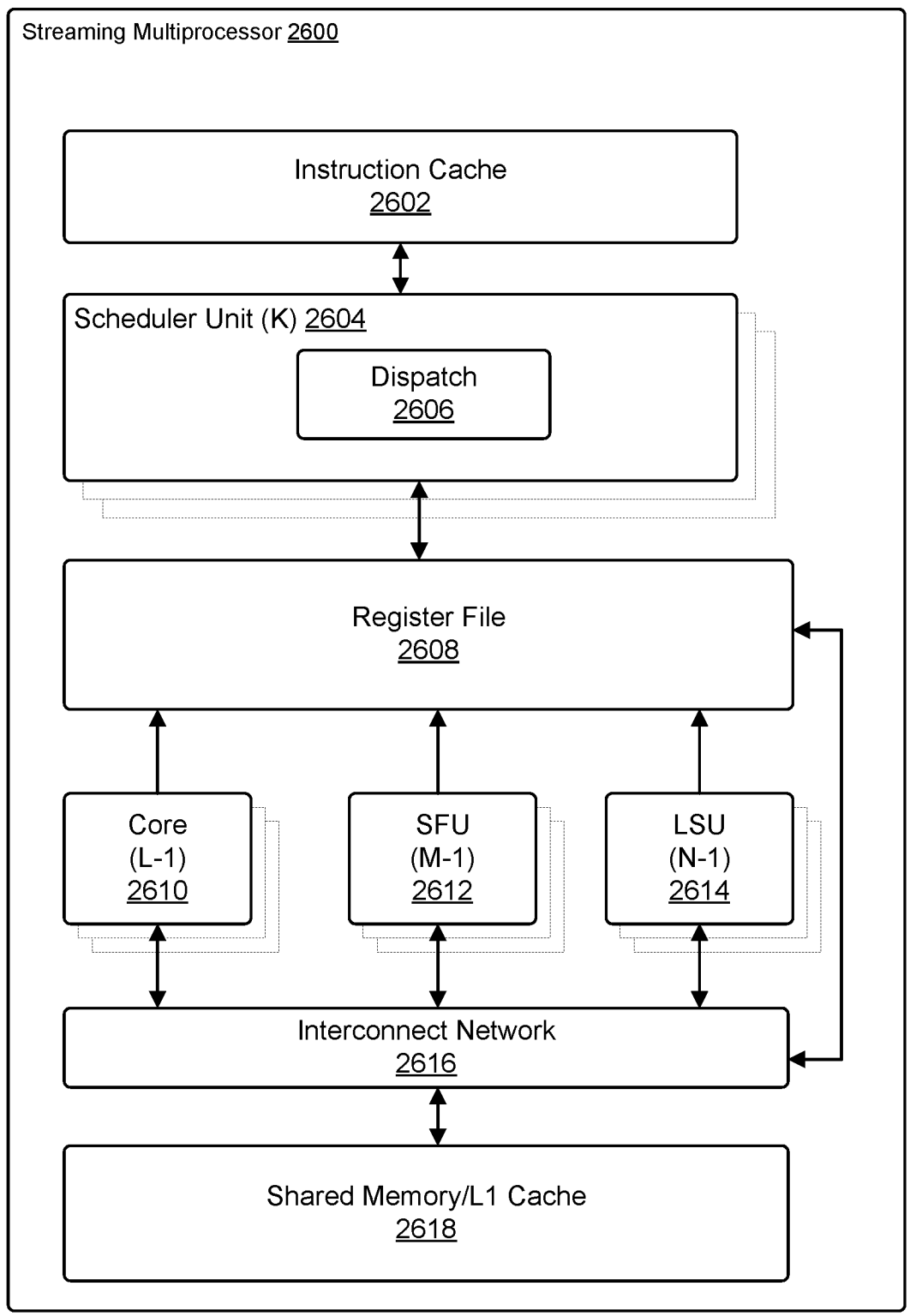
FIG. 26 illustrates a streaming multiprocessor, in accordance with at least one embodiment.

FIG. 26 illustrates a streaming multiprocessor ("SM") 2600, in accordance with at least one embodiment. In at least one embodiment, SM 2600 is SM 2514 of FIG. 25. In at least one embodiment, SM 2600 includes, without limitation, an instruction cache 2602; one or more scheduler units 2604; a register file 2608; one or more processing cores ("cores") 2610; one or more special function units ("SFUs") 2612; one or more LSUs 2614; an interconnect network 2616; a shared memory/L1 cache 2618; and any suitable combination thereof. In at least one embodiment, a work distribution unit dispatches tasks for execution on GPCs of parallel processing units (PPUs) and each task is allocated to a particular Data Processing Cluster (DPC) within a GPC and, if a task is associated with a shader program, then the task is allocated to one of SMs 2600. In at least one embodiment, scheduler unit 2604 receives tasks from a work distribution unit and manages instruction scheduling for one or more thread blocks assigned to SM 2600. In at least one embodiment, scheduler unit 2604 schedules thread blocks for execution as warps of parallel threads, wherein each thread block is allocated at least one warp. In at least one embodiment, each warp executes threads. In at least one embodiment, scheduler unit 2604 manages a plurality of different thread blocks, allocating warps to different thread blocks and then dispatching instructions from a plurality of different cooperative groups to various functional units (e.g., processing cores 2610, SFUs 2612, and LSUs 2614) during each clock cycle.

In at least one embodiment, "cooperative groups" may refer to a programming model for organizing groups of communicating threads that allows developers to express granularity at which threads are communicating, enabling expression of richer, more efficient parallel decompositions. In at least one embodiment, cooperative launch APIs support synchronization amongst thread blocks for execution of parallel algorithms. In at least one embodiment, APIs of conventional programming models provide a single, simple construct for synchronizing cooperating threads: a barrier across all threads of a thread block (e.g., syncthreads( ) function). However, in at least one embodiment, programmers may define groups of threads at smaller than thread block granularities and synchronize within defined groups to enable greater performance, design flexibility, and software reuse in the form of collective group-wide function interfaces. In at least one embodiment, cooperative groups enable programmers to define groups of threads explicitly at sub-block and multi-block granularities, and to perform collective operations such as synchronization on threads in a cooperative group. In at least one embodiment, a sub-block granularity is as small as a single thread. In at least one embodiment, a programming model supports clean composition across software boundaries, so that libraries and utility functions can synchronize safely within their local context without having to make assumptions about convergence. In at least one embodiment, cooperative group primitives enable new patterns of cooperative parallelism, including, without limitation, producer-consumer parallelism, opportunistic parallelism, and global synchronization across an entire grid of thread blocks.

In at least one embodiment, a dispatch unit 2606 is configured to transmit instructions to one or more of functional units and scheduler unit 2604 includes, without limitation, two dispatch units 2606 that enable two different instructions from same warp to be dispatched during each clock cycle. In at least one embodiment, each scheduler unit 2604 includes a single dispatch unit 2606 or additional dispatch units 2606.

In at least one embodiment, each SM 2600, in at least one embodiment, includes, without limitation, register file 2608 that provides a set of registers for functional units of SM 2600. In at least one embodiment, register file 2608 is divided between each of the functional units such that each functional unit is allocated a dedicated portion of register file 2608. In at least one embodiment, register file 2608 is divided between different warps being executed by SM 2600 and register file 2608 provides temporary storage for operands connected to data paths of functional units. In at least one embodiment, each SM 2600 comprises, without limitation, a plurality of L processing cores 2610. In at least one embodiment, SM 2600 includes, without limitation, a large number (e.g., 128 or more) of distinct processing cores 2610. In at least one embodiment, each processing core 2610 includes, without limitation, a fully-pipelined, single-precision, double-precision, and/or mixed precision processing unit that includes, without limitation, a floating point arithmetic logic unit and an integer arithmetic logic unit. In at least one embodiment, floating point arithmetic logic units implement IEEE 754-2008 standard for floating point arithmetic. In at least one embodiment, processing cores 2610 include, without limitation, 64 single-precision (32-bit) floating point cores, 64 integer cores, 32 double-precision (64-bit) floating point cores, and 8 tensor cores.

In at least one embodiment, tensor cores are configured to perform matrix operations. In at least one embodiment, one or more tensor cores are included in processing cores 2610. In at least one embodiment, tensor cores are configured to perform deep learning matrix arithmetic, such as convolution operations for neural network training and inferencing. In at least one embodiment, each tensor core operates on a 4×4 matrix and performs a matrix multiply and accumulate operation $D=A\times B+C$, where A, B, C, and D are 4×4 matrices.

In at least one embodiment, matrix multiply inputs A and B are 16-bit floating point matrices and accumulation matrices C and D are 16-bit floating point or 32-bit floating point matrices. In at least one embodiment, tensor cores operate on 16-bit floating point input data with 32-bit floating point accumulation. In at least one embodiment, 16-bit floating point multiply uses 64 operations and results in a full precision product that is then accumulated using 32-bit floating point a26ition with other intermediate products for a 4×4×4 matrix multiply. Tensor cores are used to perform much larger two-dimensional or higher dimensional matrix operations, built up from these smaller elements, in at least one embodiment. In at least one embodiment, an API, such as a CUDA-C++ API, exposes specialized matrix load, matrix multiply and accumulate, and matrix store operations to efficiently use tensor cores from a CUDA-C++ program. In at least one embodiment, at the CUDA level, a warp-level interface assumes 16×16 size matrices spanning all 32 threads of a warp.

In at least one embodiment, each SM 2600 comprises, without limitation, M SFUs 2612 that perform special functions (e.g., attribute evaluation, reciprocal square root, and like). In at least one embodiment, SFUs 2612 include, without limitation, a tree traversal unit configured to traverse a hierarchical tree data structure. In at least one embodiment, SFUs 2612 include, without limitation, a texture unit configured to perform texture map filtering operations. In at least one embodiment, texture units are configured to load texture maps (e.g., a 2D array of texels) from memory and sample texture maps to produce sampled texture values for use in shader programs executed by SM 2600. In at least one embodiment, texture maps are stored in shared memory/L1 cache 2618. In at least one embodiment, texture units implement texture operations such as filtering operations using mip-maps (e.g., texture maps of varying levels of detail). In at least one embodiment, each SM 2600 includes, without limitation, two texture units.

In at least one embodiment, each SM 2600 comprises, without limitation, N LSUs 2614 that implement load and store operations between shared memory/L1 cache 2618 and register file 2608. In at least one embodiment, each SM 2600 includes, without limitation, interconnect network 2616 that connects each of the functional units to register file 2608 and LSU 2614 to register file 2608 and shared memory/L1 cache 2618. In at least one embodiment, interconnect network 2616 is a crossbar that can be configured to connect any of the functional units to any of the registers in register file 2608 and connect LSUs 2614 to register file 2608 and memory locations in shared memory/L1 cache 2618.

In at least one embodiment, shared memory/L1 cache 2618 is an array of on-chip memory that allows for data storage and communication between SM 2600 and a primitive engine and between threads in SM 2600. In at least one embodiment, shared memory/L1 cache 2618 comprises, without limitation, 128 KB of storage capacity and is in a path from SM 2600 to a partition unit. In at least one embodiment, shared memory/L1 cache 2618 is used to cache reads and writes. In at least one embodiment, one or more of shared memory/L1 cache 2618, L2 cache, and memory are backing stores.

In at least one embodiment, combining data cache and shared memory functionality into a single memory block provides improved performance for both types of memory accesses. In at least one embodiment, capacity is used or is usable as a cache by programs that do not use shared memory, such as if shared memory is configured to use half of capacity, texture and load/store operations can use remaining capacity. In at least one embodiment, integration within shared memory/L1 cache 2618 enables shared memory/L1 cache 2618 to function as a high-throughput conduit for streaming data while simultaneously providing high-bandwidth and low-latency access to frequently reused data. In at least one embodiment, when configured for general purpose parallel computation, a simpler configuration can be used compared with graphics processing. In at least one embodiment, fixed function GPUs are bypassed, creating a much simpler programming model. In at least one embodiment and in a general purpose parallel computation configuration, a work distribution unit assigns and distributes blocks of threads directly to DPCs. In at least one embodiment, threads in a block execute the same program, using a unique thread ID in a calculation to ensure each thread generates unique results, using SM 2600 to execute a program and perform calculations, shared memory/L1 cache 2618 to communicate between threads, and LSU 2614 to read and write global memory through shared memory/L1 cache 2618 and a memory partition unit. In at least one embodiment, when configured for general purpose parallel computation, SM 2600 writes commands that scheduler unit 2604 can use to launch new work on DPCs.

In at least one embodiment, PPU is included in or coupled to a desktop computer, a laptop computer, a tablet computer, servers, supercomputers, a smart-phone (e.g., a wireless, hand-held device), a PDA, a digital camera, a vehicle, a head mounted display, a hand-held electronic device, and more. In at least one embodiment, PPU is embodied on a single semiconductor substrate. In at least one embodiment, PPU is included in an SoC along with one or more other devices such as additional PPUs, memory, a RISC CPU, an MMU, a digital-to-analog converter ("DAC"), and like.

In at least one embodiment, PPU may be included on a graphics card that includes one or more memory devices. In at least one embodiment, a graphics card may be configured to interface with a PCIe slot on a motherboard of a desktop computer. In at least one embodiment, PPU may be an integrated GPU ("iGPU") included in chipset of motherboard.

In at least one embodiment, a component of said FIG. is cooled by a heatsink assembly connected, by a flexible heat conduit, to said component. In at least one embodiment, said flexible heat conduit comprises a loop thermosiphon. In at least one embodiment, a position of said heatsink is adjustable, while said heatsink is connected to said FIG. In at least one embodiment, positional adjustment of said heatsink improves airflow to said heatsink, or to other components or heatsinks. In at least one embodiment, improved airflow improves cooling efficiency.

Software Constructions for General-Purpose Computing

The following FIGS. set forth, without limitation, exemplary software constructs for implementing at least one embodiment.

Figure 27:
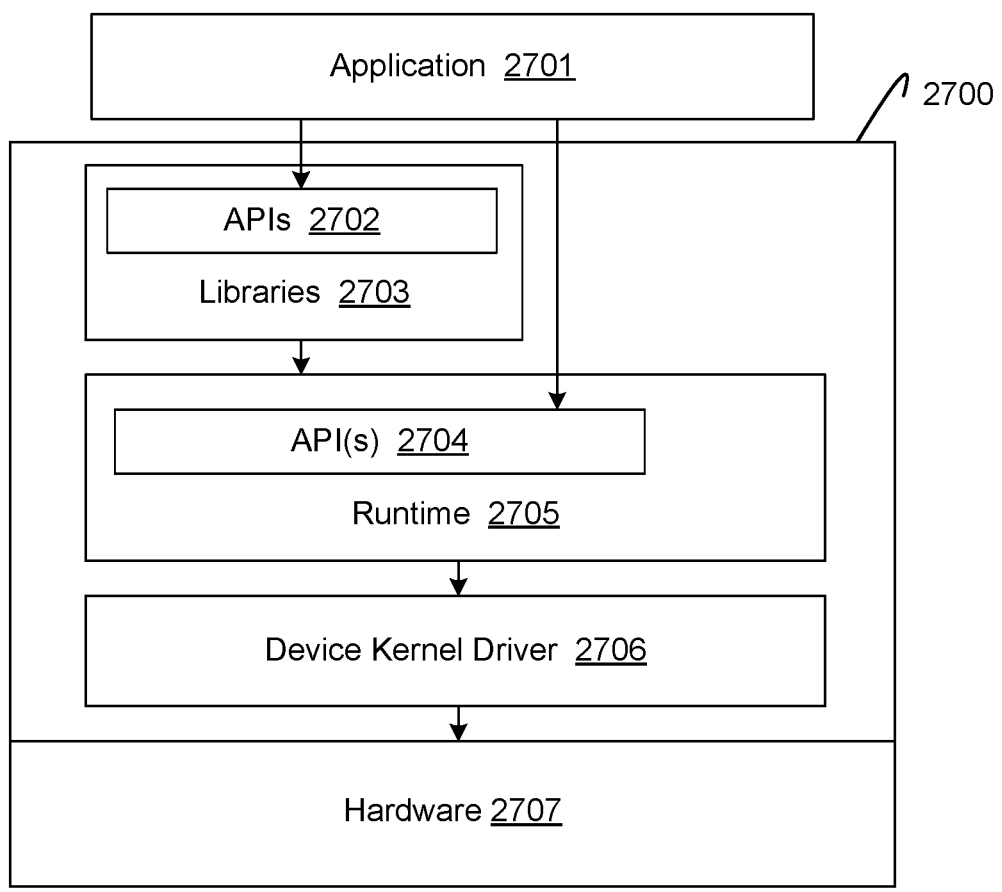
FIG. 27 illustrates a software stack of a programming platform, in accordance with at least one embodiment.

FIG. 27 illustrates a software stack of a programming platform, in accordance with at least one embodiment. In at least one embodiment, a programming platform is a platform for leveraging hardware on a computing system to accelerate computational tasks. A programming platform may be accessible to software developers through libraries, compiler directives, and/or extensions to programming languages, in at least one embodiment. In at least one embodiment, a programming platform may be, but is not limited to, CUDA, Radeon Open Compute Platform ("ROCm"), OpenCL (OpenCL™ is developed by Khronos group), SYCL, or Intel One API.

In at least one embodiment, a software stack 2700 of a programming platform provides an execution environment for an application 2701. In at least one embodiment, application 2701 may include any computer software capable of being launched on software stack 2700. In at least one embodiment, application 2701 may include, but is not limited to, an artificial intelligence ("AI")/machine learning ("ML") application, a high performance computing ("HPC") application, a virtual desktop infrastructure ("VDI"), or a data center workload.

In at least one embodiment, application 2701 and software stack 2700 run on hardware 2707. Hardware 2707 may include one or more GPUs, CPUs, FPGAs, AI engines, and/or other types of compute devices that support a programming platform, in at least one embodiment. In at least one embodiment, such as with CUDA, software stack 2700 may be vendor specific and compatible with only devices from particular vendor(s). In at least one embodiment, such as in with OpenCL, software stack 2700 may be used with devices from different vendors. In at least one embodiment, hardware 2707 includes a host connected to one more devices that can be accessed to perform computational tasks via application programming interface ("API") calls. A device within hardware 2707 may include, but is not limited to, a GPU, FPGA, AI engine, or other compute device (but may also include a CPU) and its memory, as opposed to a host within hardware 2707 that may include, but is not limited to, a CPU (but may also include a compute device) and its memory, in at least one embodiment.

In at least one embodiment, software stack 2700 of a programming platform includes, without limitation, a number of libraries 2703, a runtime 2705, and a device kernel driver 2706. Each of libraries 2703 may include data and programming code that can be used by computer programs and leveraged during software development, in at least one embodiment. In at least one embodiment, libraries 2703 may include, but are not limited to, pre-written code and subroutines, classes, values, type specifications, configuration data, documentation, help data, and/or message templates. In at least one embodiment, libraries 2703 include functions that are optimized for execution on one or more types of devices. In at least one embodiment, libraries 2703 may include, but are not limited to, functions for performing mathematical, deep learning, and/or other types of operations on devices. In at least one embodiment, libraries 2803 are associated with corresponding APIs 2802, which may include one or more APIs, that expose functions implemented in libraries 2803.

In at least one embodiment, application 2701 is written as source code that is compiled into executable code, as discussed in greater detail below in conjunction with FIGS. 32-34. Executable code of application 2701 may run, at least in part, on an execution environment provided by software stack 2700, in at least one embodiment. In at least one embodiment, during execution of application 2701, code may be reached that needs to run on a device, as opposed to a host. In such a case, runtime 2705 may be called to load and launch requisite code on the device, in at least one embodiment. In at least one embodiment, runtime 2705 may include any technically feasible runtime system that is able to support execution of application S01.

In at least one embodiment, runtime 2705 is implemented as one or more runtime libraries associated with corresponding APIs, which are shown as API(s) 2704. One or more of such runtime libraries may include, without limitation, functions for memory management, execution control, device management, error handling, and/or synchronization, among other things, in at least one embodiment. In at least one embodiment, memory management functions may include, but are not limited to, functions to allocate, deallocate, and copy device memory, as well as transfer data between host memory and device memory. In at least one embodiment, execution control functions may include, but are not limited to, functions to launch a function (sometimes referred to as a "kernel" when a function is a global function callable from a host) on a device and set attribute values in a buffer maintained by a runtime library for a given function to be executed on a device.

Runtime libraries and corresponding API(s) 2704 may be implemented in any technically feasible manner, in at least one embodiment. In at least one embodiment, one (or any number of) API may expose a low-level set of functions for fine-grained control of a device, while another (or any number of) API may expose a higher-level set of such functions. In at least one embodiment, a high-level runtime API may be built on top of a low-level API. In at least one embodiment, one or more of runtime APIs may be language-specific APIs that are layered on top of a language-independent runtime API.

In at least one embodiment, device kernel driver 2706 is configured to facilitate communication with an underlying device. In at least one embodiment, device kernel driver 2706 may provide low-level functionalities upon which APIs, such as API(s) 2704, and/or other software relies. In at least one embodiment, device kernel driver 2706 may be configured to compile intermediate representation ("IR") code into binary code at runtime. For CUDA, device kernel driver 2706 may compile Parallel Thread Execution ("PTX") IR code that is not hardware specific into binary code for a specific target device at runtime (with caching of compiled binary code), which is also sometimes referred to as "finalizing" code, in at least one embodiment. Doing so may permit finalized code to run on a target device, which may not have existed when source code was originally compiled into PTX code, in at least one embodiment. Alternatively, in at least one embodiment, device source code may be compiled into binary code offline, without requiring device kernel driver 2706 to compile IR code at runtime.

Figure 28:
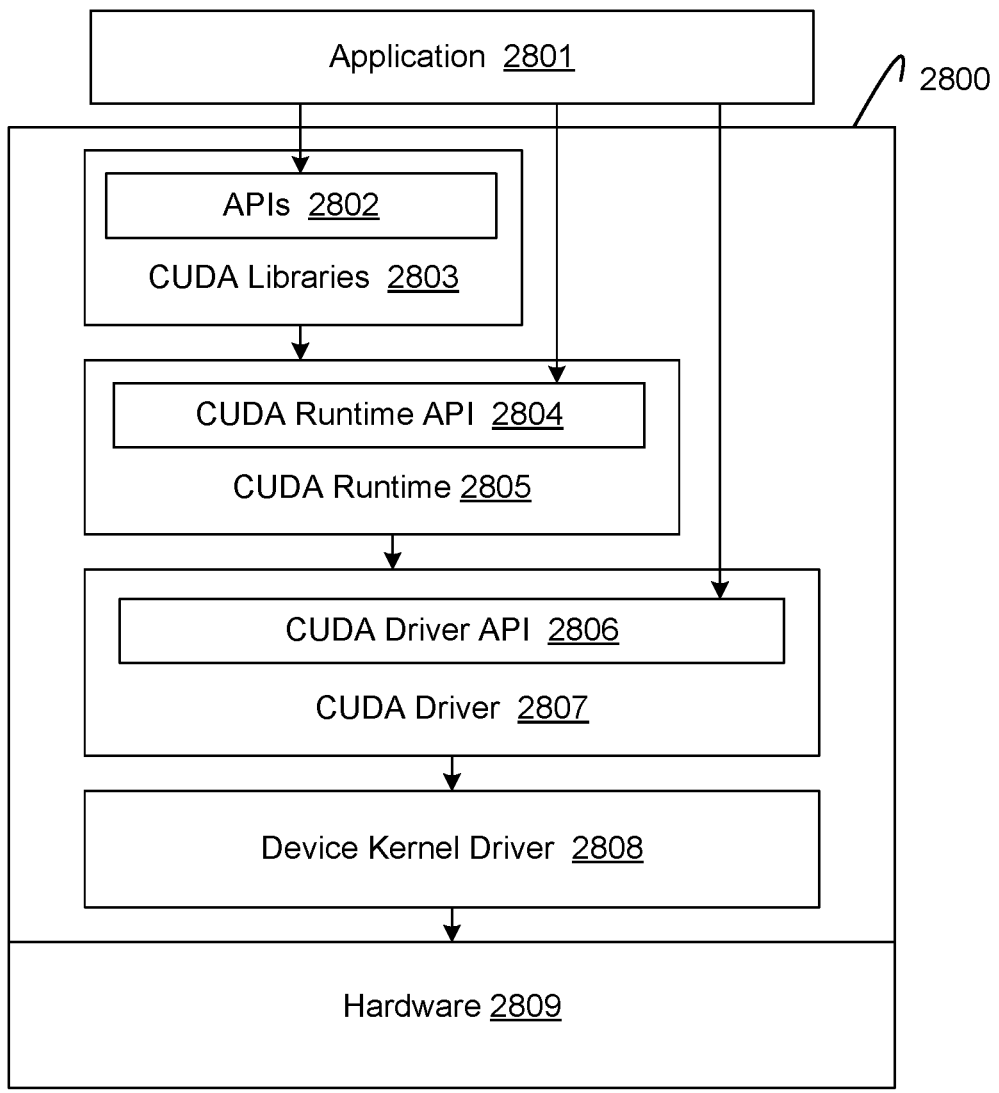
FIG. 28 illustrates a CUDA implementation of a software stack of FIG. 27, in accordance with at least one embodiment.

FIG. 28 illustrates a CUDA implementation of software stack 2700 of FIG. 27, in accordance with at least one embodiment. In at least one embodiment, a CUDA software stack 2800, on which an application 2801 may be launched, includes CUDA libraries 2803, a CUDA runtime 2805, a CUDA driver 2807, and a device kernel driver 2808. In at least one embodiment, CUDA software stack 2800 executes on hardware 2809, which may include a GPU that supports CUDA and is developed by NVIDIA Corporation of Santa Clara, Calif.

In at least one embodiment, application 2801, CUDA runtime 2805, and device kernel driver 2808 may perform similar functionalities as application 2701, runtime 2705, and device kernel driver 2706, respectively, which are described above in conjunction with FIG. 27. In at least one embodiment, CUDA driver 2807 includes a library (libcuda.so) that implements a CUDA driver API 2806. Similar to a CUDA runtime API 2804 implemented by a CUDA runtime library (cudart), CUDA driver API 2806 may, without limitation, expose functions for memory management, execution control, device management, error handling, synchronization, and/or graphics interoperability, among other things, in at least one embodiment. In at least one embodiment, CUDA driver API 2806 differs from CUDA runtime API 2804 in that CUDA runtime API 2804 simplifies device code management by providing implicit initialization, context (analogous to a process) management, and module (analogous to dynamically loaded libraries) management. In contrast to high-level CUDA runtime API 2804, CUDA driver API 2806 is a low-level API providing more fine-grained control of the device, particularly with respect to contexts and module loading, in at least one embodiment. In at least one embodiment, CUDA driver API 2806 may expose functions for context management that are not exposed by CUDA runtime API 2804. In at least one embodiment, CUDA driver API 2806 is also language-independent and supports, e.g., OpenCL in addition to CUDA runtime API 2804. Further, in at least one embodiment, development libraries, including CUDA runtime 2805, may be considered as separate from driver components, including user-mode CUDA driver 2807 and kernel-mode device driver 2808 (also sometimes referred to as a "display" driver).

In at least one embodiment, CUDA libraries 2803 may include, but are not limited to, mathematical libraries, deep learning libraries, parallel algorithm libraries, and/or signal/image/video processing libraries, which parallel computing applications such as application 2801 may utilize. In at least one embodiment, CUDA libraries 2803 may include mathematical libraries such as a cuBLAS library that is an implementation of Basic Linear Algebra Subprograms ("BLAS") for performing linear algebra operations, a cuFFT library for computing fast Fourier transforms ("FFTs"), and a cuRAND library for generating random numbers, among others. In at least one embodiment, CUDA libraries 2803 may include deep learning libraries such as a cuDNN library of primitives for deep neural networks and a TensorRT platform for high-performance deep learning inference, among others.

Figure 29:
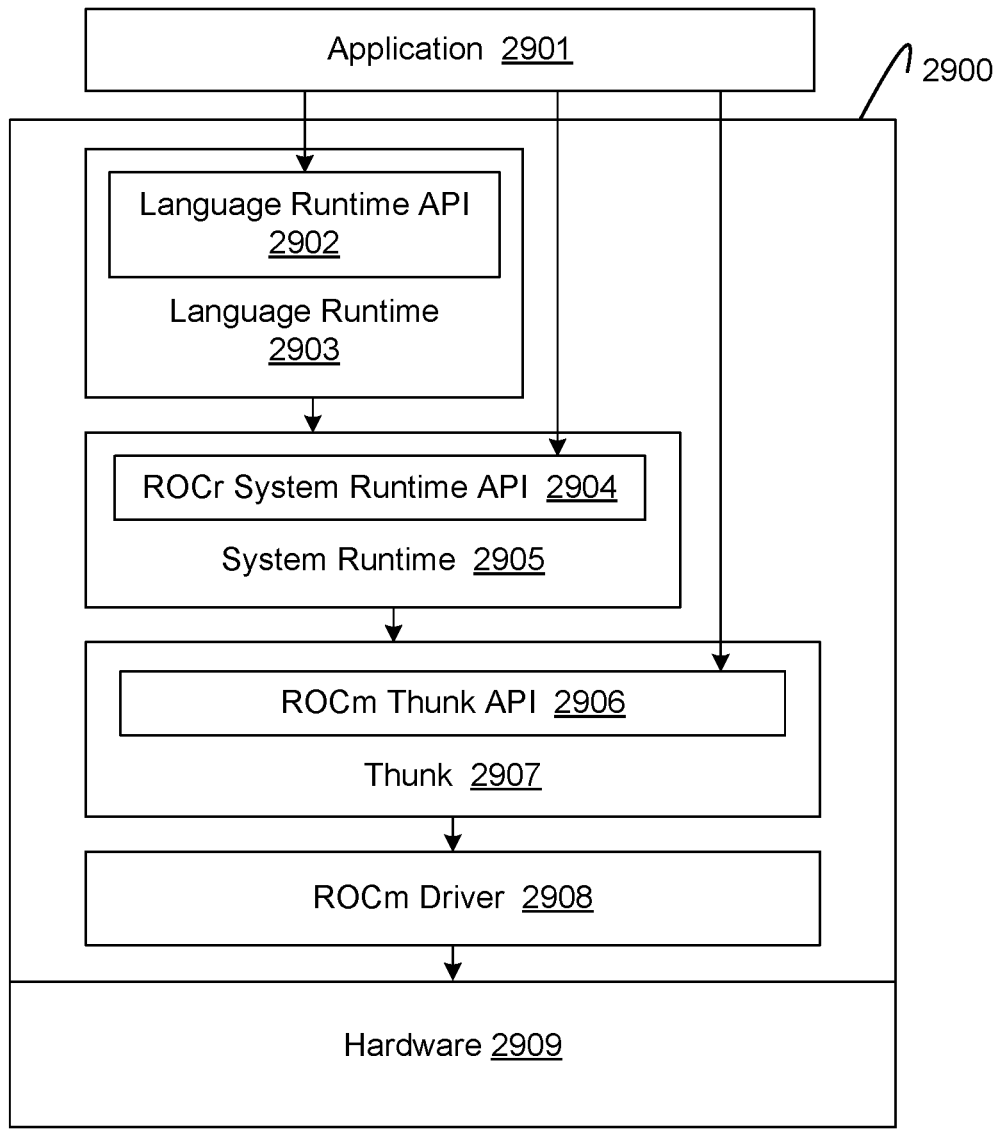
FIG. 29 illustrates a ROCm implementation of a software stack of FIG. 27, in accordance with at least one embodiment.

FIG. 29 illustrates a ROCm implementation of software stack 2700 of FIG. 27, in accordance with at least one embodiment. In at least one embodiment, a ROCm software stack 2900, on which an application 2901 may be launched, includes a language runtime 2903, a system runtime 2905, a thunk 2907, a ROCm kernel driver 2908, and a device kernel driver. In at least one embodiment, ROCm software stack 2900 executes on hardware 2909, which may include a GPU that supports ROCm and is developed by AMD Corporation of Santa Clara, Calif.

In at least one embodiment, application 2901 may perform similar functionalities as application 2701 discussed above in conjunction with FIG. 27. In addition, language runtime 2903 and system runtime 2905 may perform similar functionalities as runtime 2705 discussed above in conjunction with FIG. 27, in at least one embodiment. In at least one embodiment, language runtime 2903 and system runtime 2905 differ in that system runtime 2905 is a language-independent runtime that implements a ROCr system runtime API 2904 and makes use of a Heterogeneous System Architecture ("HSA") Runtime API. HSA runtime API is a thin, user-mode API that exposes interfaces to access and interact with an AMD GPU, including functions for memory management, execution control via architected dispatch of kernels, error handling, system and agent information, and runtime initialization and shutdown, among other things, in at least one embodiment. In contrast to system runtime 2905, language runtime 2903 is an implementation of a language-specific runtime API 2902 layered on top of ROCr system runtime API 2904, in at least one embodiment. In at least one embodiment, language runtime API may include, but is not limited to, a Heterogeneous compute Interface for Portability ("HIP") language runtime API, a Heterogeneous Compute Compiler ("HCC") language runtime API, or an OpenCL API, among others. HIP language in particular is an extension of C++ programming language with functionally similar versions of CUDA mechanisms, and, in at least one embodiment, a HIP language runtime API includes functions that are similar to those of CUDA runtime API 2804 discussed above in conjunction with FIG. 28, such as functions for memory management, execution control, device management, error handling, and synchronization, among other things.

In at least one embodiment, thunk (ROCt) 2907 is an interface that can be used to interact with underlying ROCm driver 2908. In at least one embodiment, ROCm driver 2908 is a ROCk driver, which is a combination of an AMDGPU driver and a HSA kernel driver (amdkfd). In at least one embodiment, AMDGPU driver is a device kernel driver for GPUs developed by AMD that performs similar functionalities as device kernel driver 2706 discussed above in conjunction with FIG. 27. In at least one embodiment, HSA kernel driver is a driver permitting different types of processors to share system resources more effectively via hardware features.

In at least one embodiment, various libraries (not shown) may be included in ROCm software stack 2900 above language runtime 2903 and provide functionality similarity to CUDA libraries 2803, discussed above in conjunction with FIG. 28. In at least one embodiment, various libraries may include, but are not limited to, mathematical, deep learning, and/or other libraries such as a hipBLAS library that implements functions similar to those of CUDA cuBLAS, a rocFFT library for computing FFTs that is similar to CUDA cuFFT, among others.

Figure 30:
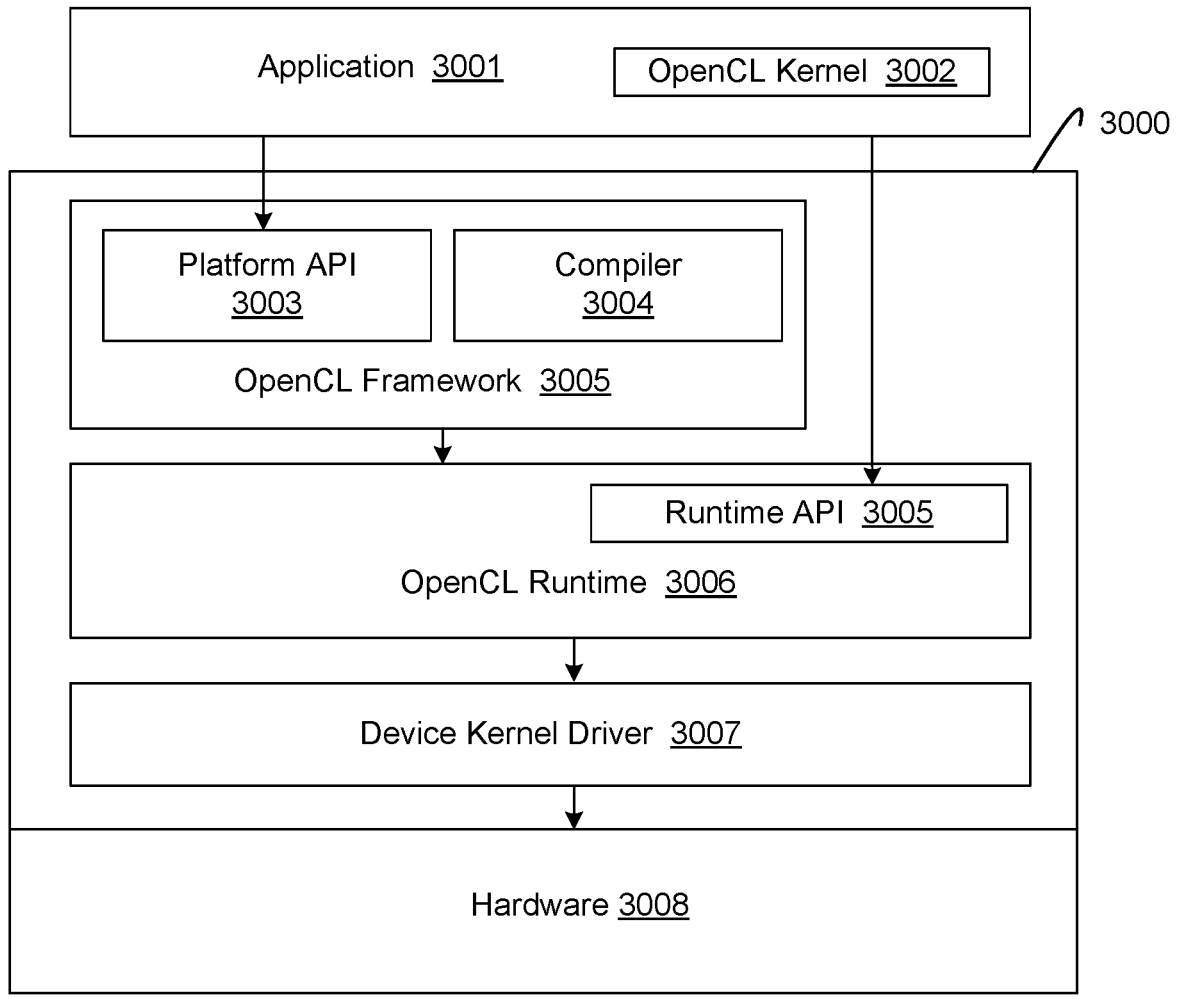
FIG. 30 illustrates an OpenCL implementation of a software stack of FIG. 27, in accordance with at least one embodiment.

FIG. 30 illustrates an OpenCL implementation of software stack 2700 of FIG. 27, in accordance with at least one embodiment. In at least one embodiment, an OpenCL software stack 3000, on which an application 3001 may be launched, includes an OpenCL framework 3005, an OpenCL runtime 3006, and a driver 3007. In at least one embodiment, OpenCL software stack 3000 executes on hardware 2809 that is not vendor-specific. As OpenCL is supported by devices developed by different vendors, specific OpenCL drivers may be required to interoperate with hardware from such vendors, in at least one embodiment.

In at least one embodiment, application 3001, OpenCL runtime 3006, device kernel driver 3007, and hardware 3008 may perform similar functionalities as application 2701, runtime 2705, device kernel driver 2706, and hardware 2707, respectively, that are discussed above in conjunction with FIG. 27. In at least one embodiment, application 3001 further includes an OpenCL kernel 3002 with code that is to be executed on a device.

In at least one embodiment, OpenCL defines a "platform" that allows a host to control devices connected to the host. In at least one embodiment, an OpenCL framework provides a platform layer API and a runtime API, shown as platform API 3003 and runtime API 3005. In at least one embodiment, runtime API 3005 uses contexts to manage execution of kernels on devices. In at least one embodiment, each identified device may be associated with a respective context, which runtime API 3005 may use to manage command queues, program objects, and kernel objects, share memory objects, among other things, for that device. In at least one embodiment, platform API 3003 exposes functions that permit device contexts to be used to select and initialize devices, submit work to devices via command queues, and enable data transfer to and from devices, among other things. In addition, OpenCL framework provides various built-in functions (not shown), including math functions, relational functions, and image processing functions, among others, in at least one embodiment.

In at least one embodiment, a compiler 3004 is also included in OpenCL framework 3005. Source code may be compiled offline prior to executing an application or online during execution of an application, in at least one embodiment. In contrast to CUDA and ROCm, OpenCL applications in at least one embodiment may be compiled online by compiler 3004, which is included to be representative of any number of compilers that may be used to compile source code and/or IR code, such as Standard Portable Intermediate Representation ("SPIR-V") code, into binary code. Alternatively, in at least one embodiment, OpenCL applications may be compiled offline, prior to execution of such applications.

Figure 31:
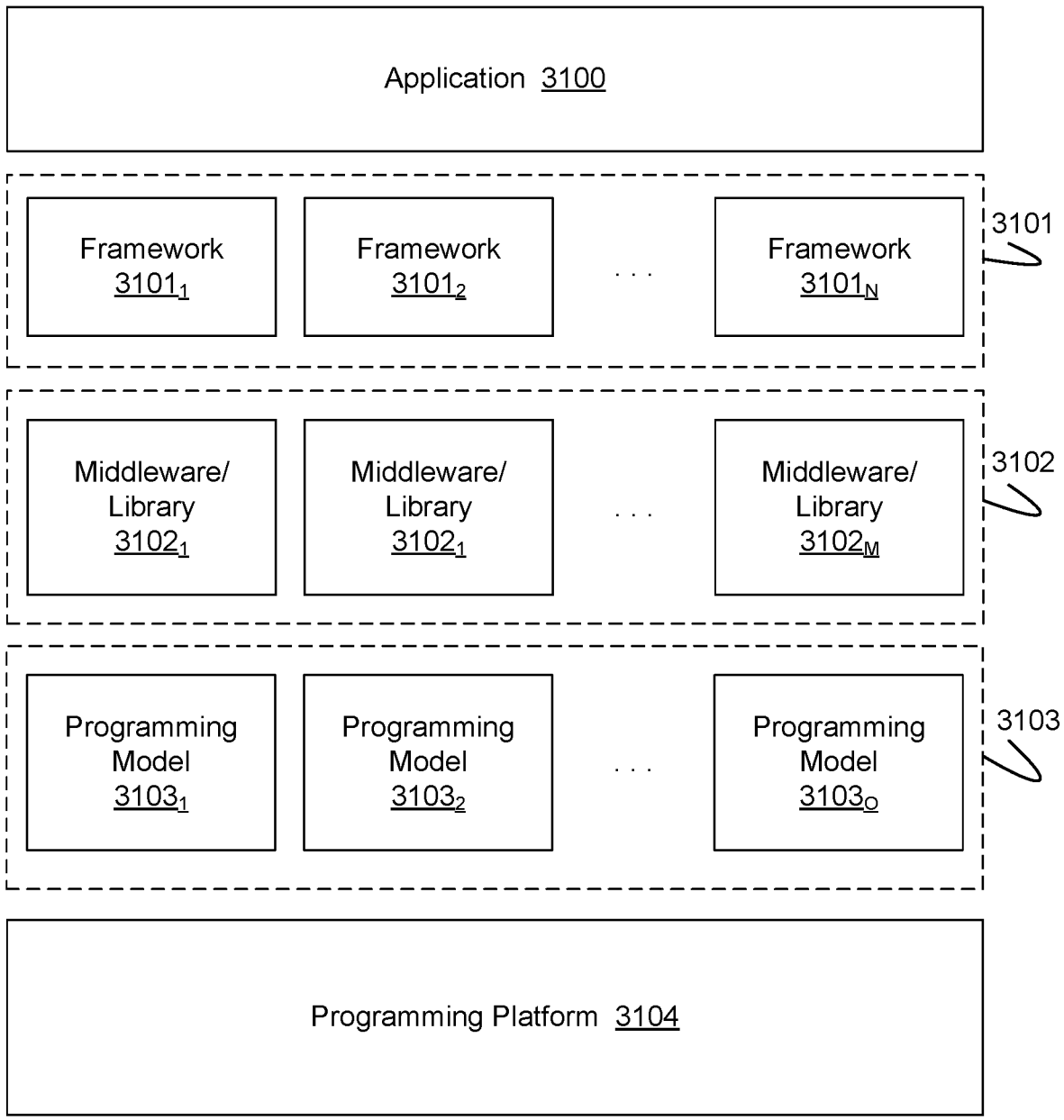
FIG. 31 illustrates software that is supported by a programming platform, in accordance with at least one embodiment.

FIG. 31 illustrates software that is supported by a programming platform, in accordance with at least one embodiment. In at least one embodiment, a programming platform 3104 is configured to support various programming models 3103, middlewares and/or libraries 3102, and frameworks 3101 that an application 3100 may rely upon. In at least one embodiment, application 3100 may be an AI/ML application implemented using, for example, a deep learning framework such as MXNet, PyTorch, or TensorFlow, which may rely on libraries such as cuDNN, NVIDIA Collective Communications Library ("NCCL"), and/or NVIDA Developer Data Loading Library ("DALI") CUDA libraries to provide accelerated computing on underlying hardware.

In at least one embodiment, programming platform 3104 may be one of a CUDA, ROCm, or OpenCL platform described above in conjunction with FIG. 28, FIG. 29, and FIG. 30, respectively. In at least one embodiment, programming platform 3104 supports multiple programming models 3103, which are abstractions of an underlying computing system permitting expressions of algorithms and data structures. Programming models 3103 may expose features of underlying hardware in order to improve performance, in at least one embodiment. In at least one embodiment, programming models 3103 may include, but are not limited to, CUDA, HIP, OpenCL, C++ Accelerated Massive Parallelism ("C++ AMP"), Open Multi-Processing ("OpenMP"), Open Accelerators ("OpenACC"), and/or Vulcan Compute.

In at least one embodiment, libraries and/or middlewares 3102 provide implementations of abstractions of programming models 3104. In at least one embodiment, such libraries include data and programming code that may be used by computer programs and leveraged during software development. In at least one embodiment, such middlewares include software that provides services to applications beyond those available from programming platform 3104. In at least one embodiment, libraries and/or middlewares 3102 may include, but are not limited to, cuBLAS, cuFFT, cuRAND, and other CUDA libraries, or rocBLAS, rocFFT, rocRAND, and other ROCm libraries. In addition, in at least one embodiment, libraries and/or middlewares 3102 may include NCCL and ROCm Communication Collectives Library ("RCCL") libraries providing communication routines for GPUs, a MIOpen library for deep learning acceleration, and/or an Eigen library for linear algebra, matrix and vector operations, geometrical transformations, numerical solvers, and related algorithms.

In at least one embodiment, application frameworks 3101 depend on libraries and/or middlewares 3102. In at least one embodiment, each of application frameworks 3101 is a software framework used to implement a standard structure of application software. Returning to the AI/ML example discussed above, an AI/ML application may be implemented using a framework such as Caffe, Caffe2, TensorFlow, Keras, PyTorch, or MxNet deep learning frameworks, in at least one embodiment.

Figure 32:
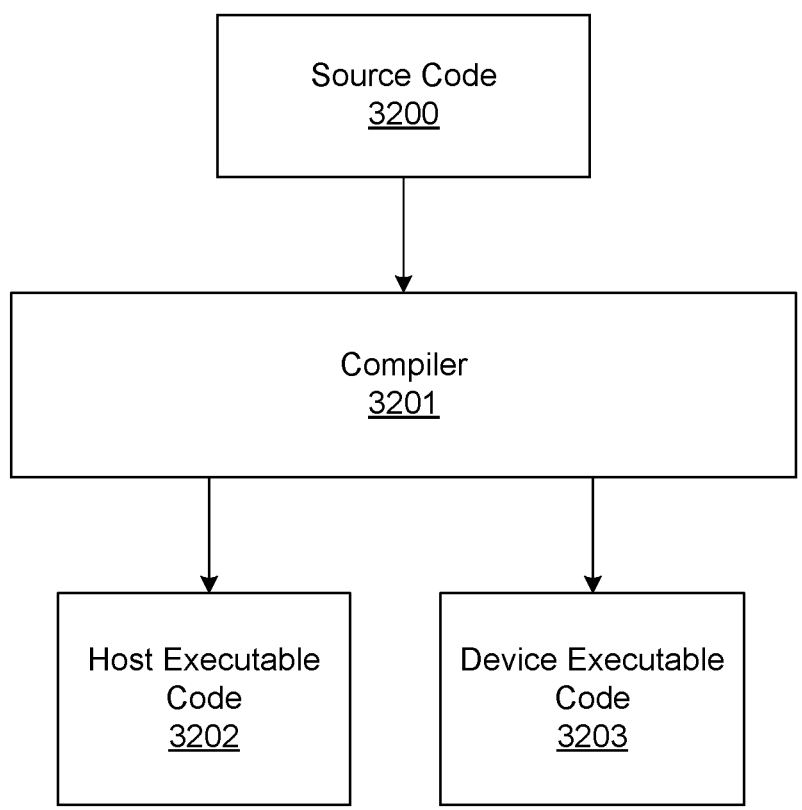
FIG. 32 illustrates compiling code to execute on programming platforms of FIGS. 27-30, in accordance with at least one embodiment.

FIG. 32 illustrates compiling code to execute on one of programming platforms of FIGS. 27-30, in accordance with at least one embodiment. In at least one embodiment, a compiler 3201 receives source code 3200 that includes both host code as well as device code. In at least one embodiment, compiler 3201 is configured to convert source code 3200 into host executable code 3202 for execution on a host and device executable code 3203 for execution on a device. In at least one embodiment, source code 3200 may either be compiled offline prior to execution of an application, or online during execution of an application.

In at least one embodiment, source code 3200 may include code in any programming language supported by compiler 3201, such as C++, C, Fortran, etc. In at least one embodiment, source code 3200 may be included in a single-source file having a mixture of host code and device code, with locations of device code being indicated therein. In at least one embodiment, a single-source file may be a .cu file that includes CUDA code or a .hip.cpp file that includes HIP code. Alternatively, in at least one embodiment, source code 3200 may include multiple source code files, rather than a single-source file, into which host code and device code are separated.

In at least one embodiment, compiler 3201 is configured to compile source code 3200 into host executable code 3202 for execution on a host and device executable code 3203 for execution on a device. In at least one embodiment, compiler 3201 performs operations including parsing source code 3200 into an abstract system tree (AST), performing optimizations, and generating executable code. In at least one embodiment in which source code 3200 includes a single-source file, compiler 3201 may separate device code from host code in such a single-source file, compile device code and host code into device executable code 3203 and host executable code 3202, respectively, and link device executable code 3203 and host executable code 3202 together in a single file, as discussed in greater detail below with respect to FIG. 33.

In at least one embodiment, host executable code 3202 and device executable code 3203 may be in any suitable format, such as binary code and/or IR code. In the case of CUDA, host executable code 3202 may include native object code and device executable code 3203 may include code in PTX intermediate representation, in at least one embodiment. In the case of ROCm, both host executable code 3202 and device executable code 3203 may include target binary code, in at least one embodiment.

Figure 33:
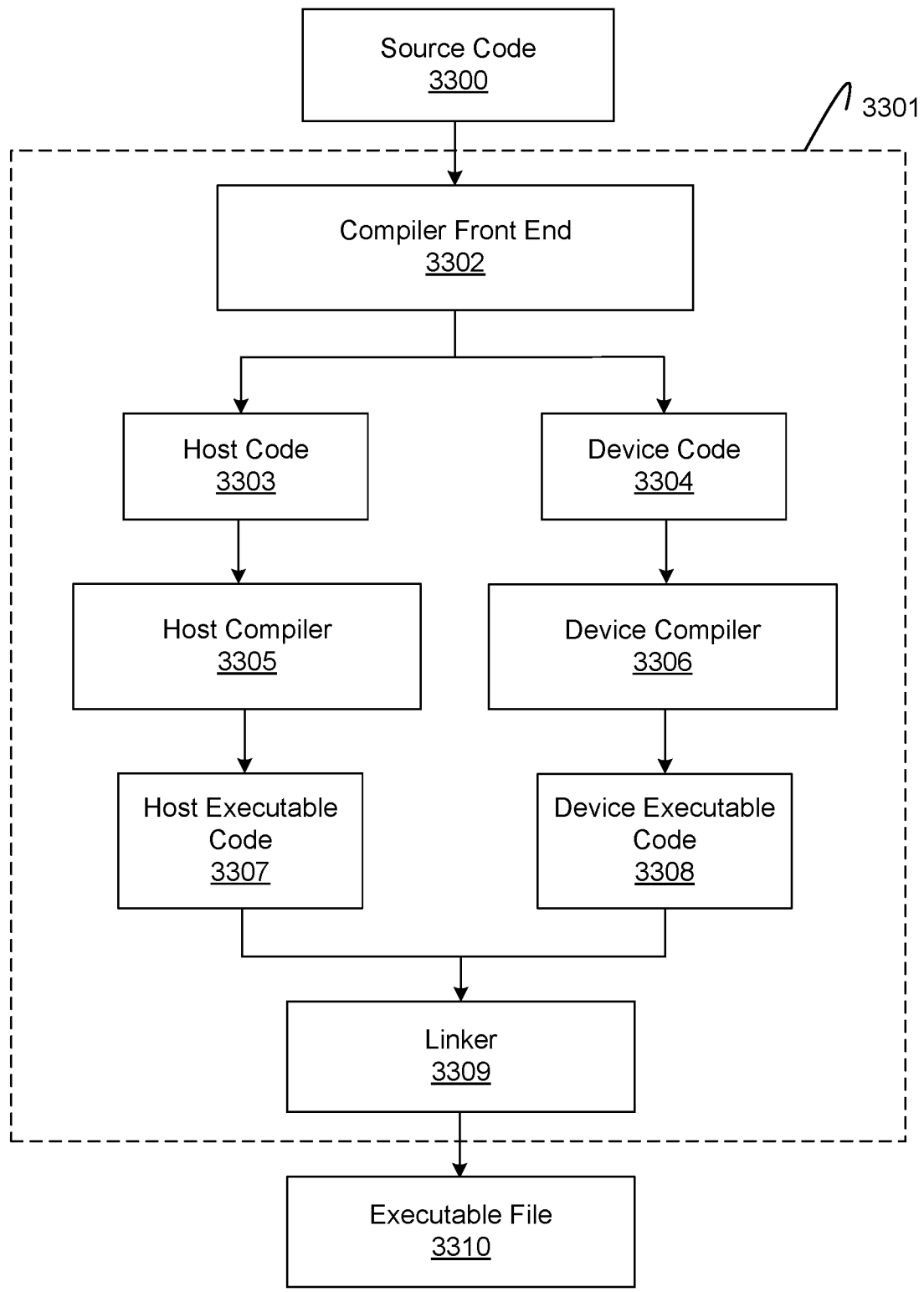
FIG. 33 illustrates in greater detail compiling code to execute on programming platforms of FIGS. 27-30, in accordance with at least one embodiment.

FIG. 33 is a more detailed illustration of compiling code to execute on one of programming platforms of FIGS. 27-30, in accordance with at least one embodiment. In at least one embodiment, a compiler 3301 is configured to receive source code 3300, compile source code 3300, and output an executable file 3310. In at least one embodiment, source code 3300 is a single-source file, such as a .cu file, a .hip.cpp file, or a file in another format, that includes both host and device code. In at least one embodiment, compiler 3301 may be, but is not limited to, an NVIDIA CUDA compiler ("NVCC") for compiling CUDA code in .cu files, or a HCC compiler for compiling HIP code in .hip.cpp files.

In at least one embodiment, compiler 3301 includes a compiler front end 3302, a host compiler 3305, a device compiler 3306, and a linker 3309. In at least one embodiment, compiler front end 3302 is configured to separate device code 3304 from host code 3303 in source code 3300. Device code 3304 is compiled by device compiler 3306 into device executable code 3308, which as described may include binary code or IR code, in at least one embodiment. Separately, host code 3303 is compiled by host compiler 3305 into host executable code 3307, in at least one embodiment. For NVCC, host compiler 3305 may be, but is not limited to, a general purpose C/C++ compiler that outputs native object code, while device compiler 3306 may be, but is not limited to, a Low Level Virtual Machine ("LLVM")-based compiler that forks a LLVM compiler infrastructure and outputs PTX code or binary code, in at least one embodiment. For HCC, both host compiler 3305 and device compiler 3306 may be, but are not limited to, LLVM-based compilers that output target binary code, in at least one embodiment.

Subsequent to compiling source code 3300 into host executable code 3307 and device executable code 3308, linker 3309 links host and device executable code 3307 and 3308 together in executable file 3310, in at least one embodiment. In at least one embodiment, native object code for a host and PTX or binary code for a device may be linked together in an Executable and Linkable Format ("ELF") file, which is a container format used to store object code.

Figure 34:
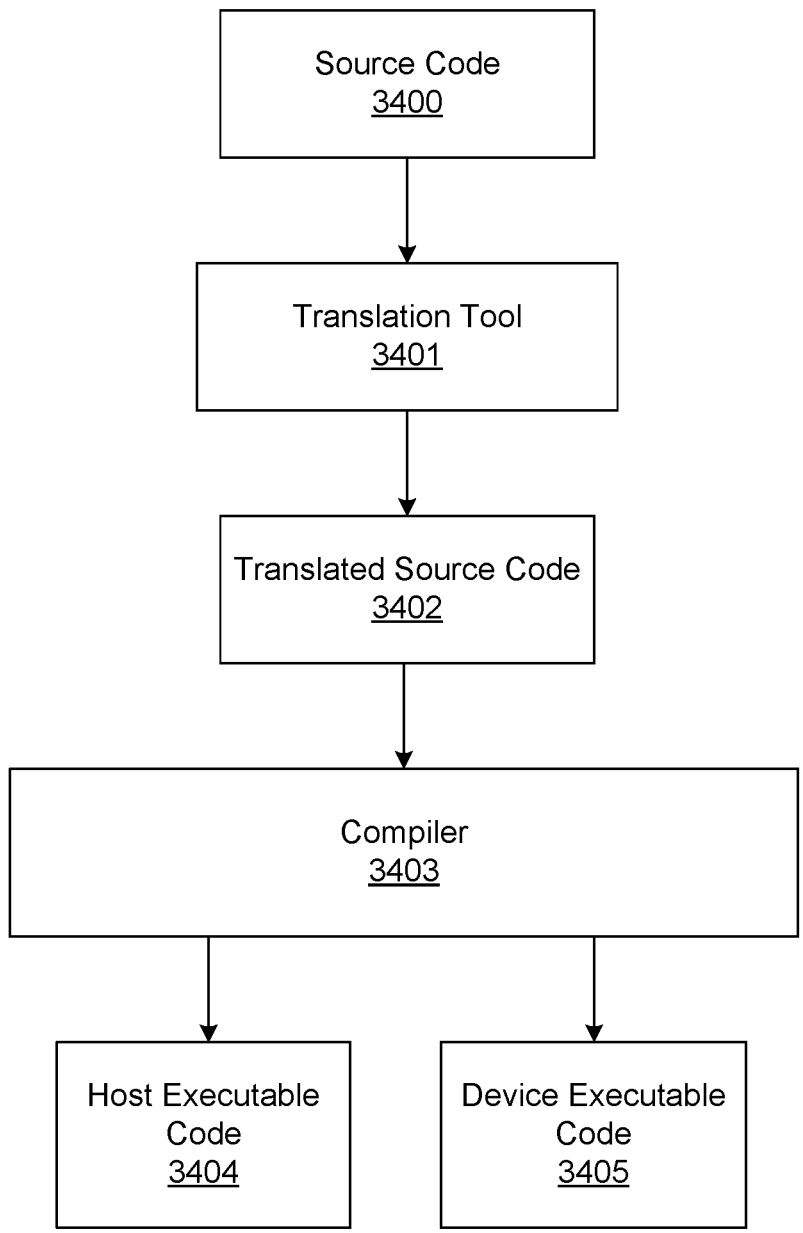
FIG. 34 illustrates translating source code prior to compiling source code, in accordance with at least one embodiment.

FIG. 34 illustrates translating source code prior to compiling source code, in accordance with at least one embodiment. In at least one embodiment, source code 3400 is passed through a translation tool 3401, which translates source code 3400 into translated source code 3402. In at least one embodiment, a compiler 3403 is used to compile translated source code 3402 into host executable code 3404 and device executable code 3405 in a process that is similar to compilation of source code 3200 by compiler 3201 into host executable code 3202 and device executable code 3203, as discussed above in conjunction with FIG. 32.

In at least one embodiment, a translation performed by translation tool 3401 is used to port source 3400 for execution in a different environment than that in which it was originally intended to run. In at least one embodiment, translation tool 3401 may include, but is not limited to, a HIP translator that is used to "hipify" CUDA code intended for a CUDA platform into HIP code that can be compiled and executed on a ROCm platform. In at least one embodiment, translation of source code 3400 may include parsing source code 3400 and converting calls to API(s) provided by one programming model (e.g., CUDA) into corresponding calls to API(s) provided by another programming model (e.g., HIP), as discussed in greater detail below in conjunction with FIGS. 35A-36. Returning to the example of hipifying CUDA code, calls to CUDA runtime API, CUDA driver API, and/or CUDA libraries may be converted to corresponding HIP API calls, in at least one embodiment. In at least one embodiment, automated translations performed by translation tool 3401 may sometimes be incomplete, requiring additional, manual effort to fully port source code 3400.

Configuring GPUs for General-Purpose Computing

The following FIGS. set forth, without limitation, exemplary architectures for compiling and executing compute source code, in accordance with at least one embodiment.

Figure 35A:
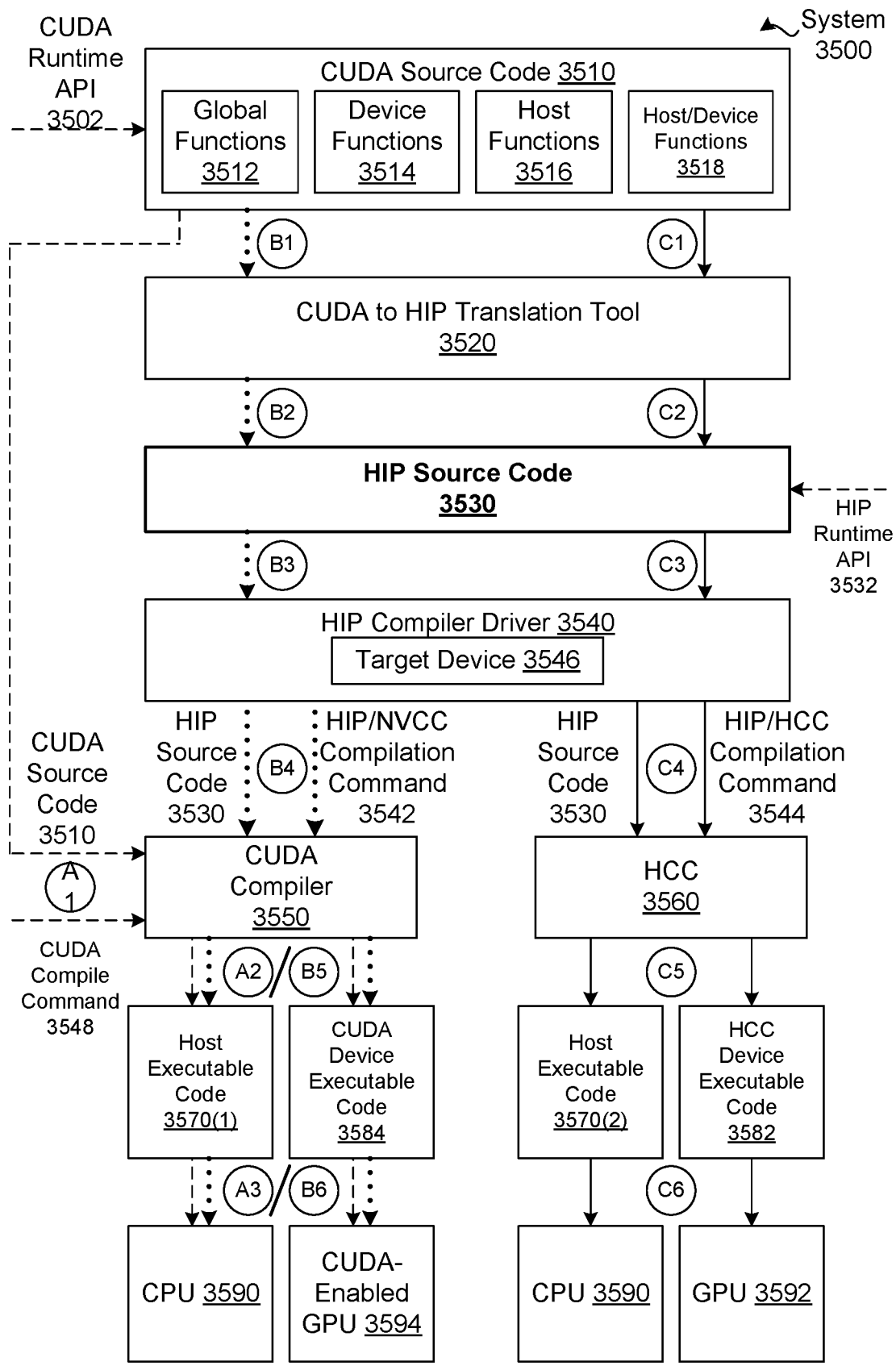
FIG. 35A illustrates a system configured to compile and execute CUDA source code using different types of processing units, in accordance with at least one embodiment.

FIG. 35A illustrates a system 3500 configured to compile and execute CUDA source code 3510 using different types of processing units, in accordance with at least one embodiment. In at least one embodiment, system 3500 includes, without limitation, CUDA source code 3510, a CUDA compiler 3550, host executable code 3570(1), host executable code 3570(2), CUDA device executable code 3584, a CPU 3590, a CUDA-enabled GPU 3594, a GPU 3592, a CUDA to HIP translation tool 3520, HIP source code 3530, a HIP compiler driver 3540, an HCC 3560, and HCC device executable code 3582.

In at least one embodiment, CUDA source code 3510 is a collection of human-readable code in a CUDA programming language. In at least one embodiment, CUDA code is human-readable code in a CUDA programming language. In at least one embodiment, a CUDA programming language is an extension of the C++ programming language that includes, without limitation, mechanisms to define device code and distinguish between device code and host code. In at least one embodiment, device code is source code that, after compilation, is executable in parallel on a device. In at least one embodiment, a device may be a processor that is optimized for parallel instruction processing, such as CUDA-enabled GPU 3590, GPU 35192, or another GPGPU, etc. In at least one embodiment, host code is source code that, after compilation, is executable on a host. In at least one embodiment, a host is a processor that is optimized for sequential instruction processing, such as CPU 3590.

In at least one embodiment, CUDA source code 3510 includes, without limitation, any number (including zero) of global functions 3512, any number (including zero) of device functions 3514, any number (including zero) of host functions 3516, and any number (including zero) of host/device functions 3518. In at least one embodiment, global functions 3512, device functions 3514, host functions 3516, and host/device functions 3518 may be mixed in CUDA source code 3510. In at least one embodiment, each of global functions 3512 is executable on a device and callable from a host. In at least one embodiment, one or more of global functions 3512 may therefore act as entry points to a device. In at least one embodiment, each of global functions 3512 is a kernel. In at least one embodiment and in a technique known as dynamic parallelism, one or more of global functions 3512 defines a kernel that is executable on a device and callable from such a device. In at least one embodiment, a kernel is executed N (where N is any positive integer) times in parallel by N different threads on a device during execution.

In at least one embodiment, each of device functions 3514 is executed on a device and callable from such a device only. In at least one embodiment, each of host functions 3516 is executed on a host and callable from such a host only. In at least one embodiment, each of host/device functions 3516 defines both a host version of a function that is executable on a host and callable from such a host only and a device version of the function that is executable on a device and callable from such a device only.

In at least one embodiment, CUDA source code 3510 may also include, without limitation, any number of calls to any number of functions that are defined via a CUDA runtime API 3502. In at least one embodiment, CUDA runtime API 3502 may include, without limitation, any number of functions that execute on a host to allocate and deallocate device memory, transfer data between host memory and device memory, manage systems with multiple devices, etc. In at least one embodiment, CUDA source code 3510 may also include any number of calls to any number of functions that are specified in any number of other CUDA APIs. In at least one embodiment, a CUDA API may be any API that is designed for use by CUDA code. In at least one embodiment, CUDA APIs include, without limitation, CUDA runtime API 3502, a CUDA driver API, APIs for any number of CUDA libraries, etc. In at least one embodiment and relative to CUDA runtime API 3502, a CUDA driver API is a lower-level API but provides finer-grained control of a device. In at least one embodiment, examples of CUDA libraries include, without limitation, cuBLAS, cuFFT, cuRAND, cuDNN, etc.

In at least one embodiment, CUDA compiler 3550 compiles input CUDA code (e.g., CUDA source code 3510) to generate host executable code 3570(1) and CUDA device executable code 3584. In at least one embodiment, CUDA compiler 3550 is NVCC. In at least one embodiment, host executable code 3570(1) is a compiled version of host code included in input source code that is executable on CPU 3590. In at least one embodiment, CPU 3590 may be any processor that is optimized for sequential instruction processing.

In at least one embodiment, CUDA device executable code 3584 is a compiled version of device code included in input source code that is executable on CUDA-enabled GPU 3594. In at least one embodiment, CUDA device executable code 3584 includes, without limitation, binary code. In at least one embodiment, CUDA device executable code 3584 includes, without limitation, IR code, such as PTX code, that is further compiled at runtime into binary code for a specific target device (e.g., CUDA-enabled GPU 3594) by a device driver. In at least one embodiment, CUDA-enabled GPU 3594 may be any processor that is optimized for parallel instruction processing and that supports CUDA. In at least one embodiment, CUDA-enabled GPU 3594 is developed by NVIDIA Corporation of Santa Clara, Calif.

In at least one embodiment, CUDA to HIP translation tool 3520 is configured to translate CUDA source code 3510 to functionally similar HIP source code 3530. In a least one embodiment, HIP source code 3530 is a collection of human-readable code in a HIP programming language. In at least one embodiment, HIP code is human-readable code in a HIP programming language. In at least one embodiment, a HIP programming language is an extension of the C++ programming language that includes, without limitation, functionally similar versions of CUDA mechanisms to define device code and distinguish between device code and host code. In at least one embodiment, a HIP programming language may include a subset of functionality of a CUDA programming language. In at least one embodiment, for example, a HIP programming language includes, without limitation, mechanism(s) to define global functions 3512, but such a HIP programming language may lack support for dynamic parallelism and therefore global functions 3512 defined in HIP code may be callable from a host only.

In at least one embodiment, HIP source code 3530 includes, without limitation, any number (including zero) of global functions 3512, any number (including zero) of device functions 3514, any number (including zero) of host functions 3516, and any number (including zero) of host/device functions 3518. In at least one embodiment, HIP source code 3530 may also include any number of calls to any number of functions that are specified in a HIP runtime API 3532. In at least one embodiment, HIP runtime API 3532 includes, without limitation, functionally similar versions of a subset of functions included in CUDA runtime API 3502. In at least one embodiment, HIP source code 3530 may also include any number of calls to any number of functions that are specified in any number of other HIP APIs. In at least one embodiment, a HIP API may be any API that is designed for use by HIP code and/or ROCm. In at least one embodiment, HIP APIs include, without limitation, HIP runtime API 3532, a HIP driver API, APIs for any number of HIP libraries, APIs for any number of ROCm libraries, etc.

In at least one embodiment, CUDA to HIP translation tool 3520 converts each kernel call in CUDA code from a CUDA syntax to a HIP syntax and converts any number of other CUDA calls in CUDA code to any number of other functionally similar HIP calls. In at least one embodiment, a CUDA call is a call to a function specified in a CUDA API, and a HIP call is a call to a function specified in a HIP API. In at least one embodiment, CUDA to HIP translation tool 3520 converts any number of calls to functions specified in CUDA runtime API 3502 to any number of calls to functions specified in HIP runtime API 3532.

In at least one embodiment, CUDA to HIP translation tool 3520 is a tool known as hipify-perl that executes a text-based translation process. In at least one embodiment, CUDA to HIP translation tool 3520 is a tool known as hipify-clang that, relative to hipify-perl, executes a more complex and more robust translation process that involves parsing CUDA code using clang (a compiler front-end) and then translating resulting symbols. In at least one embodiment, properly converting CUDA code to HIP code may require modifications (e.g., manual edits) in addition to those performed by CUDA to HIP translation tool 3520.

In at least one embodiment, HIP compiler driver 3540 is a front end that determines a target device 3546 and then configures a compiler that is compatible with target device 3546 to compile HIP source code 3530. In at least one embodiment, target device 3546 is a processor that is optimized for parallel instruction processing. In at least one embodiment, HIP compiler driver 3540 may determine target device 3546 in any technically feasible fashion.

In at least one embodiment, if target device 3546 is compatible with CUDA (e.g., CUDA-enabled GPU 3594), then HIP compiler driver 3540 generates a HIP/NVCC compilation command 3542. In at least one embodiment and as described in greater detail in conjunction with FIG. 35B, HIP/NVCC compilation command 3542 configures CUDA compiler 3550 to compile HIP source code 3530 using, without limitation, a HIP to CUDA translation header and a CUDA runtime library. In at least one embodiment and in response to HIP/NVCC compilation command 3542, CUDA compiler 3550 generates host executable code 3570(1) and CUDA device executable code 3584.

In at least one embodiment, if target device 3546 is not compatible with CUDA, then HIP compiler driver 3540 generates a HIP/HCC compilation command 3544. In at least one embodiment and as described in greater detail in conjunction with FIG. 35C, HIP/HCC compilation command 3544 configures HCC 3560 to compile HIP source code 3530 using, without limitation, an HCC header and a HIP/HCC runtime library. In at least one embodiment and in response to HIP/HCC compilation command 3544, HCC 3560 generates host executable code 3570(2) and HCC device executable code 3582. In at least one embodiment, HCC device executable code 3582 is a compiled version of device code included in HIP source code 3530 that is executable on GPU 3592. In at least one embodiment, GPU 3592 may be any processor that is optimized for parallel instruction processing, is not compatible with CUDA, and is compatible with HCC. In at least one embodiment, GPU 3592 is developed by AMD Corporation of Santa Clara, Calif. In at least one embodiment GPU, 3592 is a non-CUDA-enabled GPU 3592.

For explanatory purposes only, three different flows that may be implemented in at least one embodiment to compile CUDA source code 3510 for execution on CPU 3590 and different devices are depicted in FIG. 35A. In at least one embodiment, a direct CUDA flow compiles CUDA source code 3510 for execution on CPU 3590 and CUDA-enabled GPU 3594 without translating CUDA source code 3510 to HIP source code 3530. In at least one embodiment, an indirect CUDA flow translates CUDA source code 3510 to HIP source code 3530 and then compiles HIP source code 3530 for execution on CPU 3590 and CUDA-enabled GPU 3594. In at least one embodiment, a CUDA/HCC flow translates CUDA source code 3510 to HIP source code 3530 and then compiles HIP source code 3530 for execution on CPU 3590 and GPU 3592.

A direct CUDA flow that may be implemented in at least one embodiment is depicted via dashed lines and a series of bubbles annotated A1-A3. In at least one embodiment and as depicted with bubble annotated A1, CUDA compiler 3550 receives CUDA source code 3510 and a CUDA compile command 3548 that configures CUDA compiler 3550 to compile CUDA source code 3510. In at least one embodiment, CUDA source code 3510 used in a direct CUDA flow is written in a CUDA programming language that is based on a programming language other than C++ (e.g., C, Fortran, Python, Java, etc.). In at least one embodiment and in response to CUDA compile command 3548, CUDA compiler 3550 generates host executable code 3570(1) and CUDA device executable code 3584 (depicted with bubble annotated A2). In at least one embodiment and as depicted with bubble annotated A3, host executable code 3570(1) and CUDA device executable code 3584 may be executed on, respectively, CPU 3590 and CUDA-enabled GPU 3594. In at least one embodiment, CUDA device executable code 3584 includes, without limitation, binary code. In at least one embodiment, CUDA device executable code 3584 includes, without limitation, PTX code and is further compiled into binary code for a specific target device at runtime.

An indirect CUDA flow that may be implemented in at least one embodiment is depicted via dotted lines and a series of bubbles annotated B1-B6. In at least one embodiment and as depicted with bubble annotated B1, CUDA to HIP translation tool 3520 receives CUDA source code 3510. In at least one embodiment and as depicted with bubble annotated B2, CUDA to HIP translation tool 3520 translates CUDA source code 3510 to HIP source code 3530. In at least one embodiment and as depicted with bubble annotated B3, HIP compiler driver 3540 receives HIP source code 3530 and determines that target device 3546 is CUDA-enabled.

In at least one embodiment and as depicted with bubble annotated B4, HIP compiler driver 3540 generates HIP/NVCC compilation command 3542 and transmits both HIP/NVCC compilation command 3542 and HIP source code 3530 to CUDA compiler 3550. In at least one embodiment and as described in greater detail in conjunction with FIG. 35B, HIP/NVCC compilation command 3542 configures CUDA compiler 3550 to compile HIP source code 3530 using, without limitation, a HIP to CUDA translation header and a CUDA runtime library. In at least one embodiment and in response to HIP/NVCC compilation command 3542, CUDA compiler 3550 generates host executable code 3570(1) and CUDA device executable code 3584 (depicted with bubble annotated B5). In at least one embodiment and as depicted with bubble annotated B6, host executable code 3570(1) and CUDA device executable code 3584 may be executed on, respectively, CPU 3590 and CUDA-enabled GPU 3594. In at least one embodiment, CUDA device executable code 3584 includes, without limitation, binary code. In at least one embodiment, CUDA device executable code 3584 includes, without limitation, PTX code and is further compiled into binary code for a specific target device at runtime.

A CUDA/HCC flow that may be implemented in at least one embodiment is depicted via solid lines and a series of bubbles annotated C1-C6. In at least one embodiment and as depicted with bubble annotated C1, CUDA to HIP translation tool 3520 receives CUDA source code 3510. In at least one embodiment and as depicted with bubble annotated C2, CUDA to HIP translation tool 3520 translates CUDA source code 3510 to HIP source code 3530. In at least one embodiment and as depicted with bubble annotated C3, HIP compiler driver 3540 receives HIP source code 3530 and determines that target device 3546 is not CUDA-enabled.

In at least one embodiment, HIP compiler driver 3540 generates HIP/HCC compilation command 3544 and transmits both HIP/HCC compilation command 3544 and HIP source code 3530 to HCC 3560 (depicted with bubble annotated C4). In at least one embodiment and as described in greater detail in conjunction with FIG. 35C, HIP/HCC compilation command 3544 configures HCC 3560 to compile HIP source code 3530 using, without limitation, an HCC header and a HIP/HCC runtime library. In at least one embodiment and in response to HIP/HCC compilation command 3544, HCC 3560 generates host executable code 3570(2) and HCC device executable code 3582 (depicted with bubble annotated C5). In at least one embodiment and as depicted with bubble annotated C6, host executable code 3570(2) and HCC device executable code 3582 may be executed on, respectively, CPU 3590 and GPU 3592.

In at least one embodiment, after CUDA source code 3510 is translated to HIP source code 3530, HIP compiler driver 3540 may subsequently be used to generate executable code for either CUDA-enabled GPU 3594 or GPU 3592 without re-executing CUDA to HIP translation tool 3520. In at least one embodiment, CUDA to HIP translation tool 3520 translates CUDA source code 3510 to HIP source code 3530 that is then stored in memory. In at least one embodiment, HIP compiler driver 3540 then configures HCC 3560 to generate host executable code 3570(2) and HCC device executable code 3582 based on HIP source code 3530. In at least one embodiment, HIP compiler driver 3540 subsequently configures CUDA compiler 3550 to generate host executable code 3570(1) and CUDA device executable code 3584 based on stored HIP source code 3530.

Figure 35B:
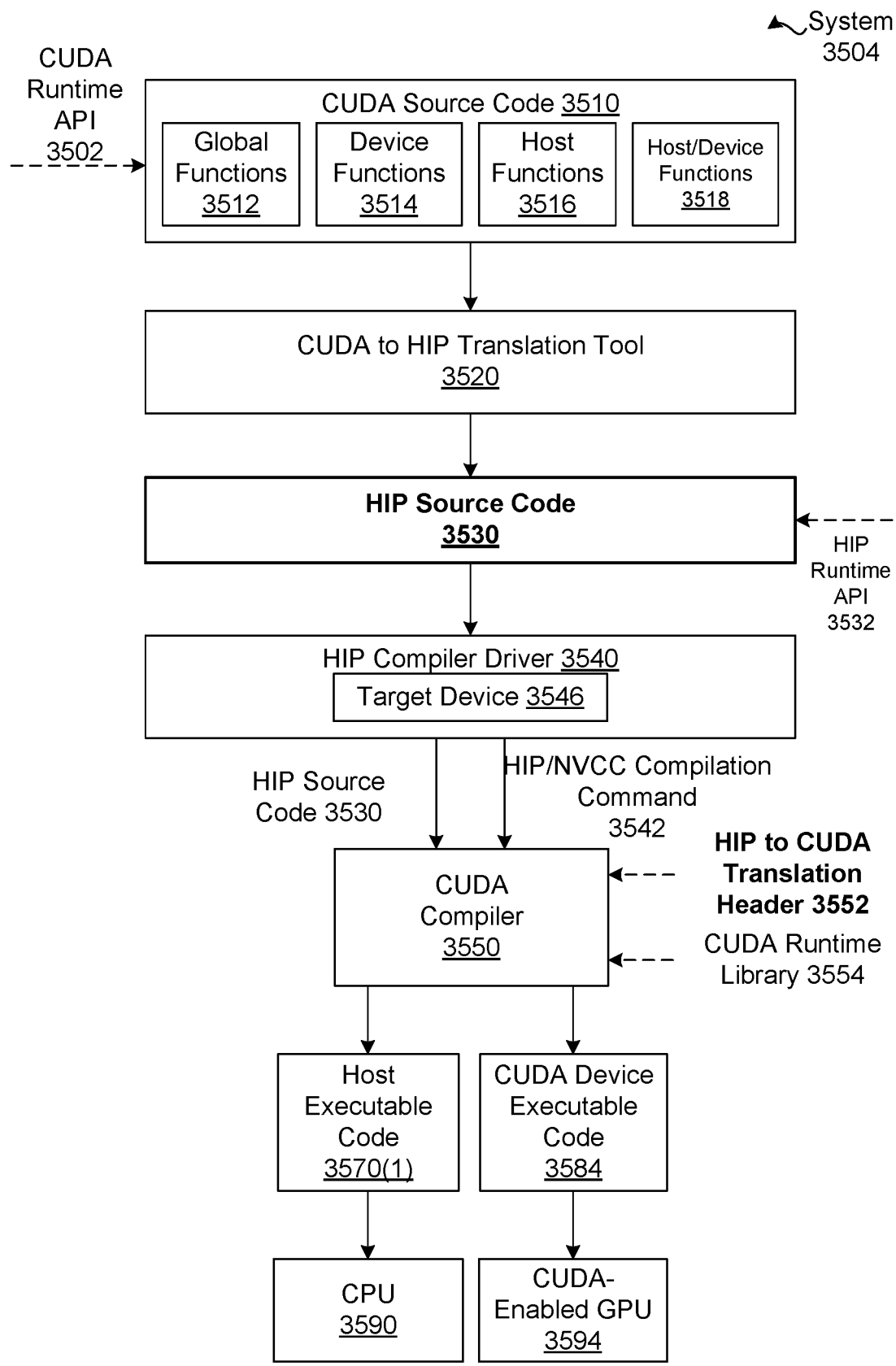
FIG. 35B illustrates a system configured to compile and execute CUDA source code of FIG. 35A using a CPU and a CUDA-enabled GPU, in accordance with at least one embodiment.

FIG. 35B illustrates a system 3504 configured to compile and execute CUDA source code 3510 of FIG. 35A using CPU 3590 and CUDA-enabled GPU 3594, in accordance with at least one embodiment. In at least one embodiment, system 3504 includes, without limitation, CUDA source code 3510, CUDA to HIP translation tool 3520, HIP source code 3530, HIP compiler driver 3540, CUDA compiler 3550, host executable code 3570(1), CUDA device executable code 3584, CPU 3590, and CUDA-enabled GPU 3594.

In at least one embodiment and as described previously herein in conjunction with FIG. 35A, CUDA source code 3510 includes, without limitation, any number (including zero) of global functions 3512, any number (including zero) of device functions 3514, any number (including zero) of host functions 3516, and any number (including zero) of host/device functions 3518. In at least one embodiment, CUDA source code 3510 also includes, without limitation, any number of calls to any number of functions that are specified in any number of CUDA APIs.

In at least one embodiment, CUDA to HIP translation tool 3520 translates CUDA source code 3510 to HIP source code 3530. In at least one embodiment, CUDA to HIP translation tool 3520 converts each kernel call in CUDA source code 3510 from a CUDA syntax to a HIP syntax and converts any number of other CUDA calls in CUDA source code 3510 to any number of other functionally similar HIP calls.

In at least one embodiment, HIP compiler driver 3540 determines that target device 3546 is CUDA-enabled and generates HIP/NVCC compilation command 3542. In at least one embodiment, HIP compiler driver 3540 then configures CUDA compiler 3550 via HIP/NVCC compilation command 3542 to compile HIP source code 3530. In at least one embodiment, HIP compiler driver 3540 provides access to a HIP to CUDA translation header 3552 as part of configuring CUDA compiler 3550. In at least one embodiment, HIP to CUDA translation header 3552 translates any number of mechanisms (e.g., functions) specified in any number of HIP APIs to any number of mechanisms specified in any number of CUDA APIs. In at least one embodiment, CUDA compiler 3550 uses HIP to CUDA translation header 3552 in conjunction with a CUDA runtime library 3554 corresponding to CUDA runtime API 3502 to generate host executable code 3570(1) and CUDA device executable code 3584. In at least one embodiment, host executable code 3570(1) and CUDA device executable code 3584 may then be executed on, respectively, CPU 3590 and CUDA-enabled GPU 3594. In at least one embodiment, CUDA device executable code 3584 includes, without limitation, binary code. In at least one embodiment, CUDA device executable code 3584 includes, without limitation, PTX code and is further compiled into binary code for a specific target device at runtime.

Figure 35C:
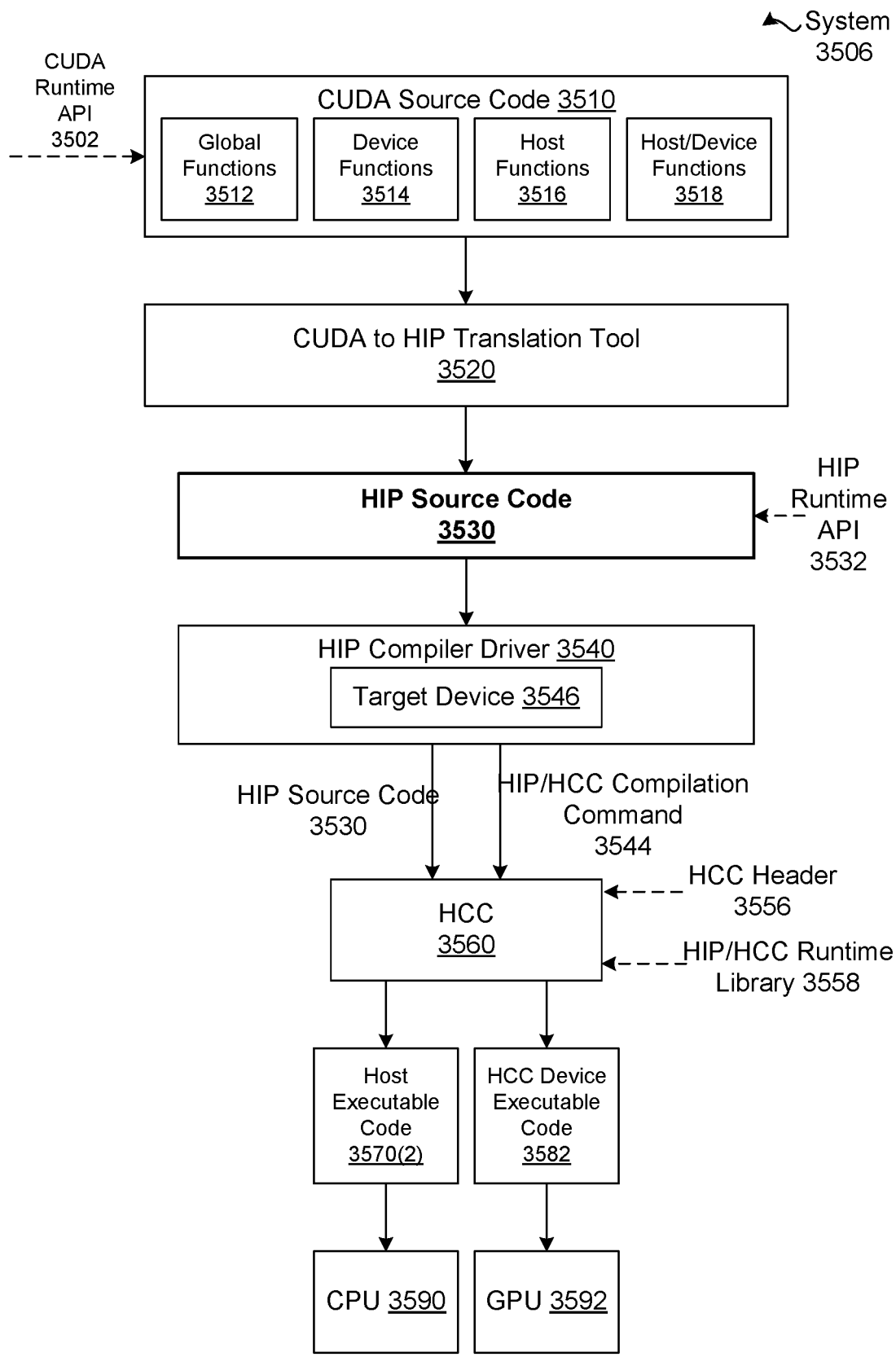
FIG. 35C illustrates a system configured to compile and execute CUDA source code of FIG. 35A using a CPU and a non-CUDA-enabled GPU, in accordance with at least one embodiment.

FIG. 35C illustrates a system 3506 configured to compile and execute CUDA source code 3510 of FIG. 35A using CPU 3590 and non-CUDA-enabled GPU 3592, in accordance with at least one embodiment. In at least one embodiment, system 3506 includes, without limitation, CUDA source code 3510, CUDA to HIP translation tool 3520, HIP source code 3530, HIP compiler driver 3540, HCC 3560, host executable code 3570(2), HCC device executable code 3582, CPU 3590, and GPU 3592.

In at least one embodiment and as described previously herein in conjunction with FIG. 35A, CUDA source code 3510 includes, without limitation, any number (including zero) of global functions 3512, any number (including zero) of device functions 3514, any number (including zero) of host functions 3516, and any number (including zero) of host/device functions 3518. In at least one embodiment, CUDA source code 3510 also includes, without limitation, any number of calls to any number of functions that are specified in any number of CUDA APIs.

In at least one embodiment, CUDA to HIP translation tool 3520 translates CUDA source code 3510 to HIP source code 3530. In at least one embodiment, CUDA to HIP translation tool 3520 converts each kernel call in CUDA source code 3510 from a CUDA syntax to a HIP syntax and converts any number of other CUDA calls in source code 3510 to any number of other functionally similar HIP calls.

In at least one embodiment, HIP compiler driver 3540 subsequently determines that target device 3546 is not CUDA-enabled and generates HIP/HCC compilation command 3544. In at least one embodiment, HIP compiler driver 3540 then configures HCC 3560 to execute HIP/HCC compilation command 3544 to compile HIP source code 3530. In at least one embodiment, HIP/HCC compilation command 3544 configures HCC 3560 to use, without limitation, a HIP/HCC runtime library 3558 and an HCC header 3556 to generate host executable code 3570(2) and HCC device executable code 3582. In at least one embodiment, HIP/HCC runtime library 3558 corresponds to HIP runtime API 3532. In at least one embodiment, HCC header 3556 includes, without limitation, any number and type of interoperability mechanisms for HIP and HCC. In at least one embodiment, host executable code 3570(2) and HCC device executable code 3582 may be executed on, respectively, CPU 3590 and GPU 3592.

Figure 36:
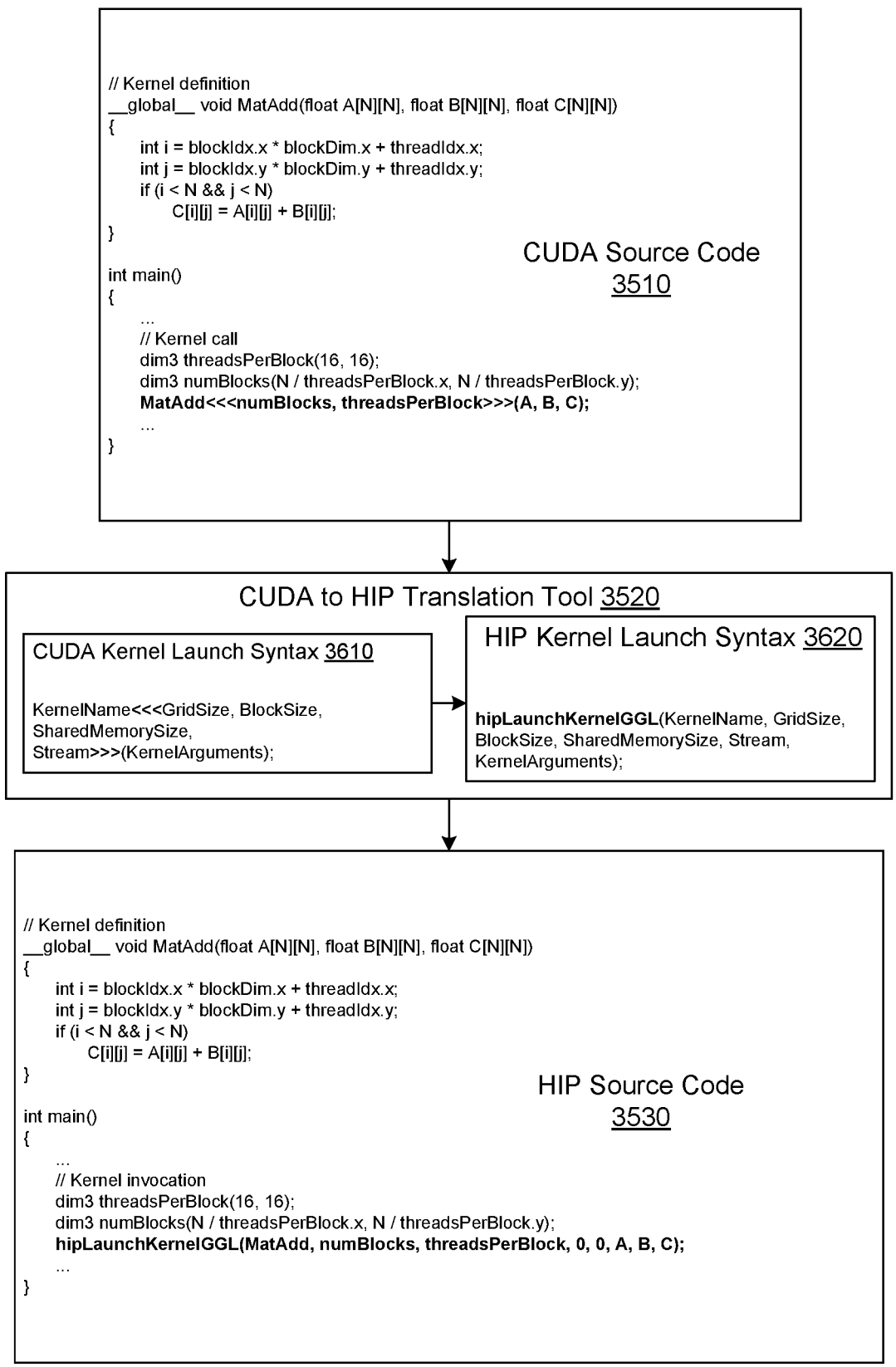
FIG. 36 illustrates an exemplary kernel translated by CUDA-to-HIP translation tool of FIG. 35C, in accordance with at least one embodiment.

FIG. 36 illustrates an exemplary kernel translated by CUDA-to-HIP translation tool 3520 of FIG. 35C, in accordance with at least one embodiment. In at least one embodiment, CUDA source code 3510 partitions an overall problem that a given kernel is designed to solve into relatively coarse sub-problems that can independently be solved using thread blocks. In at least one embodiment, each thread block includes, without limitation, any number of threads. In at least one embodiment, each sub-problem is partitioned into relatively fine pieces that can be solved cooperatively in parallel by threads within a thread block. In at least one embodiment, threads within a thread block can cooperate by sharing data through shared memory and by synchronizing execution to coordinate memory accesses.

In at least one embodiment, CUDA source code 3510 organizes thread blocks associated with a given kernel into a one-dimensional, a two-dimensional, or a three-dimensional grid of thread blocks. In at least one embodiment, each thread block includes, without limitation, any number of threads, and a grid includes, without limitation, any number of thread blocks.

In at least one embodiment, a kernel is a function in device code that is defined using a "_global_" declaration specifier. In at least one embodiment, the dimension of a grid that executes a kernel for a given kernel call and associated streams are specified using a CUDA kernel launch syntax 3610. In at least one embodiment, CUDA kernel launch syntax 3610 is specified as "KernelName<<<GridSize, BlockSize, SharedMemorySize, Stream>>>(KernelArguments);". In at least one embodiment, an execution configuration syntax is a "<<< . . . >>>" construct that is inserted between a kernel name ("KernelName") and a parenthesized list of kernel arguments ("KernelArguments"). In at least one embodiment, CUDA kernel launch syntax 3610 includes, without limitation, a CUDA launch function syntax instead of an execution configuration syntax.

In at least one embodiment, "GridSize" is of a type dim3 and specifies the dimension and size of a grid. In at least one embodiment, type dim3 is a CUDA-defined structure that includes, without limitation, unsigned integers x, y, and z. In at least one embodiment, if z is not specified, then z defaults to one. In at least one embodiment, if y is not specified, then y defaults to one. In at least one embodiment, the number of thread blocks in a grid is equal to the product of GridSize.x, GridSize.y, and GridSize.z. In at least one embodiment, "BlockSize" is of type dim3 and specifies the dimension and size of each thread block. In at least one embodiment, the number of threads per thread block is equal to the product of BlockSize.x, BlockSize.y, and BlockSize.z. In at least one embodiment, each thread that executes a kernel is given a unique thread ID that is accessible within the kernel through a built-in variable (e.g., "threadIdx").

In at least one embodiment and with respect to CUDA kernel launch syntax 3610, "SharedMemorySize" is an optional argument that specifies a number of bytes in a shared memory that is dynamically allocated per thread block for a given kernel call in addition to statically allocated memory. In at least one embodiment and with respect to CUDA kernel launch syntax 3610, SharedMemorySize defaults to zero. In at least one embodiment and with respect to CUDA kernel launch syntax 3610, "Stream" is an optional argument that specifies an associated stream and defaults to zero to specify a default stream. In at least one embodiment, a stream is a sequence of commands (possibly issued by different host threads) that execute in order. In at least one embodiment, different streams may execute commands out of order with respect to one another or concurrently.

In at least one embodiment, CUDA source code 3510 includes, without limitation, a kernel definition for an exemplary kernel "MatAdd" and a main function. In at least one embodiment, main function is host code that executes on a host and includes, without limitation, a kernel call that causes kernel MatAdd to execute on a device. In at least one embodiment and as shown, kernel MatAdd adds two matrices A and B of size N×N, where N is a positive integer, and stores the result in a matrix C. In at least one embodiment, main function defines a threadsPerBlock variable as 16 by 16 and a numBlocks variable as N/16 by N/16. In at least one embodiment, main function then specifies kernel call "MatAdd<<<numBlocks, threadsPerBlock>>>(A, B, C);". In at least one embodiment and as per CUDA kernel launch syntax 3610, kernel MatAdd is executed using a grid of thread blocks having a dimension N/16 by N/16, where each thread block has a dimension of 16 by 16. In at least one embodiment, each thread block includes 256 threads, a grid is created with enough blocks to have one thread per matrix element, and each thread in such a grid executes kernel MatAdd to perform one pair-wise addition.

In at least one embodiment, while translating CUDA source code 3510 to HIP source code 3530, CUDA to HIP translation tool 3520 translates each kernel call in CUDA source code 3510 from CUDA kernel launch syntax 3610 to a HIP kernel launch syntax 3620 and converts any number of other CUDA calls in source code 3510 to any number of other functionally similar HIP calls. In at least one embodiment, HIP kernel launch syntax 3620 is specified as "hipLaunchKernelGGL(KernelName, GridSize, BlockSize, SharedMemorySize, Stream, KernelArguments);". In at least one embodiment, each of KernelName, GridSize, BlockSize, ShareMemorySize, Stream, and KernelArguments has the same meaning in HIP kernel launch syntax 3620 as in CUDA kernel launch syntax 3610 (described previously herein). In at least one embodiment, arguments SharedMemorySize and Stream are required in HIP kernel launch syntax 3620 and are optional in CUDA kernel launch syntax 3610.

In at least one embodiment, a portion of HIP source code 3530 depicted in FIG. 36 is identical to a portion of CUDA source code 3510 depicted in FIG. 36 except for a kernel call that causes kernel MatAdd to execute on a device. In at least one embodiment, kernel MatAdd is defined in HIP source code 3530 with the same "_global_" declaration specifier with which kernel MatAdd is defined in CUDA source code 3510. In at least one embodiment, a kernel call in HIP source code 3530 is "hipLaunchKernelGGL(MatAdd, numBlocks, threadsPerBlock, 0, 0, A, B, C);", while a corresponding kernel call in CUDA source code 3510 is "MatAdd<<<numBlocks, threadsPerBlock>>>(A, B, C);".

Figure 37:
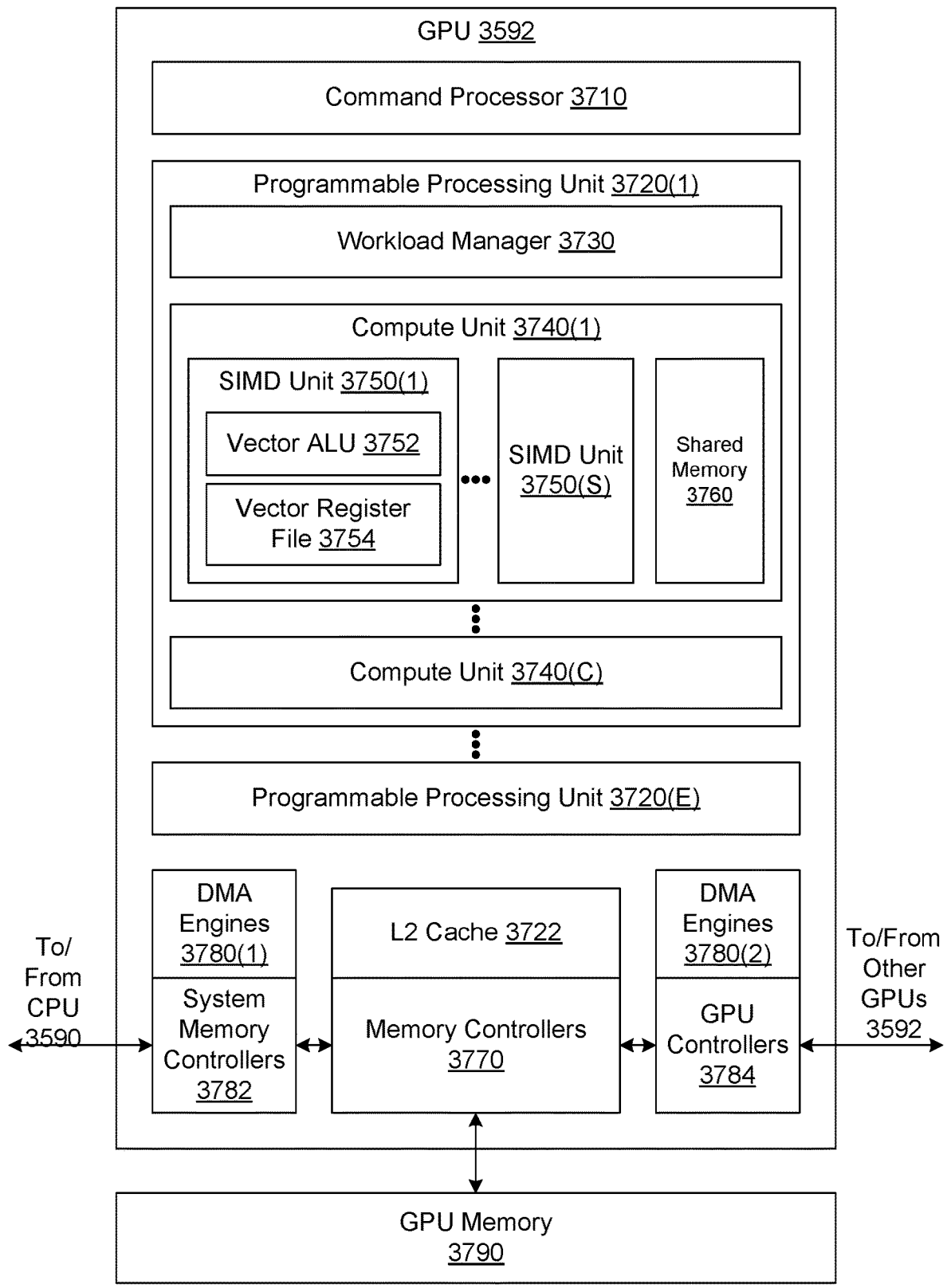
FIG. 37 illustrates non-CUDA-enabled GPU of FIG. 35C in greater detail, in accordance with at least one embodiment.

FIG. 37 illustrates non-CUDA-enabled GPU 3592 of FIG. 35C in greater detail, in accordance with at least one embodiment. In at least one embodiment, GPU 3592 is developed by AMD corporation of Santa Clara. In at least one embodiment, GPU 3592 can be configured to perform compute operations in a highly-parallel fashion. In at least one embodiment, GPU 3592 is configured to execute graphics pipeline operations such as draw commands, pixel operations, geometric computations, and other operations associated with rendering an image to a display. In at least one embodiment, GPU 3592 is configured to execute operations unrelated to graphics. In at least one embodiment, GPU 3592 is configured to execute both operations related to graphics and operations unrelated to graphics. In at least one embodiment, GPU 3592 can be configured to execute device code included in HIP source code 3530.

In at least one embodiment, GPU 3592 includes, without limitation, any number of programmable processing units 3720, a command processor 3710, an L2 cache 3722, memory controllers 3770, DMA engines 3780(1), system memory controllers 3782, DMA engines 3780(2), and GPU controllers 3784. In at least one embodiment, each programmable processing unit 3720 includes, without limitation, a workload manager 3730 and any number of compute units 3740. In at least one embodiment, command processor 3710 reads commands from one or more command queues (not shown) and distributes commands to workload managers 3730. In at least one embodiment, for each programmable processing unit 3720, associated workload manager 3730 distributes work to compute units 3740 included in programmable processing unit 3720. In at least one embodiment, each compute unit 3740 may execute any number of thread blocks, but each thread block executes on a single compute unit 3740. In at least one embodiment, a workgroup is a thread block.

In at least one embodiment, each compute unit 3740 includes, without limitation, any number of SIMD units 3750 and a shared memory 3760. In at least one embodiment, each SIMD unit 3750 implements a SIMD architecture and is configured to perform operations in parallel. In at least one embodiment, each SIMD unit 3750 includes, without limitation, a vector ALU 3752 and a vector register file 3754. In at least one embodiment, each SIMD unit 3750 executes a different warp. In at least one embodiment, a warp is a group of threads (e.g., 16 threads), where each thread in the warp belongs to a single thread block and is configured to process a different set of data based on a single set of instructions. In at least one embodiment, predication can be used to disable one or more threads in a warp. In at least one embodiment, a lane is a thread. In at least one embodiment, a work item is a thread. In at least one embodiment, a wavefront is a warp. In at least one embodiment, different wavefronts in a thread block may synchronize together and communicate via shared memory 3760.

In at least one embodiment, programmable processing units 3720 are referred to as "shader engines." In at least one embodiment, each programmable processing unit 3720 includes, without limitation, any amount of dedicated graphics hardware in addition to compute units 3740. In at least one embodiment, each programmable processing unit 3720 includes, without limitation, any number (including zero) of geometry processors, any number (including zero) of rasterizers, any number (including zero) of render back ends, workload manager 3730, and any number of compute units 3740.

In at least one embodiment, compute units 3740 share L2 cache 3722. In at least one embodiment, L2 cache 3722 is partitioned. In at least one embodiment, a GPU memory 3790 is accessible by all compute units 3740 in GPU 3592. In at least one embodiment, memory controllers 3770 and system memory controllers 3782 facilitate data transfers between GPU 3592 and a host, and DMA engines 3780(1) enable asynchronous memory transfers between GPU 3592 and such a host. In at least one embodiment, memory controllers 3770 and GPU controllers 3784 facilitate data transfers between GPU 3592 and other GPUs 3592, and DMA engines 3780(2) enable asynchronous memory transfers between GPU 3592 and other GPUs 3592.

In at least one embodiment, GPU 3592 includes, without limitation, any amount and type of system interconnect that facilitates data and control transmissions across any number and type of directly or indirectly linked components that may be internal or external to GPU 3592. In at least one embodiment, GPU 3592 includes, without limitation, any number and type of I/O interfaces (e.g., PCIe) that are coupled to any number and type of peripheral devices. In at least one embodiment, GPU 3592 may include, without limitation, any number (including zero) of display engines and any number (including zero) of multimedia engines. In at least one embodiment, GPU 3592 implements a memory subsystem that includes, without limitation, any amount and type of memory controllers (e.g., memory controllers 3770 and system memory controllers 3782) and memory devices (e.g., shared memories 3760) that may be dedicated to one component or shared among multiple components. In at least one embodiment, GPU 3592 implements a cache subsystem that includes, without limitation, one or more cache memories (e.g., L2 cache 3722) that may each be private to or shared between any number of components (e.g., SIMD units 3750, compute units 3740, and programmable processing units 3720).

Figure 38:
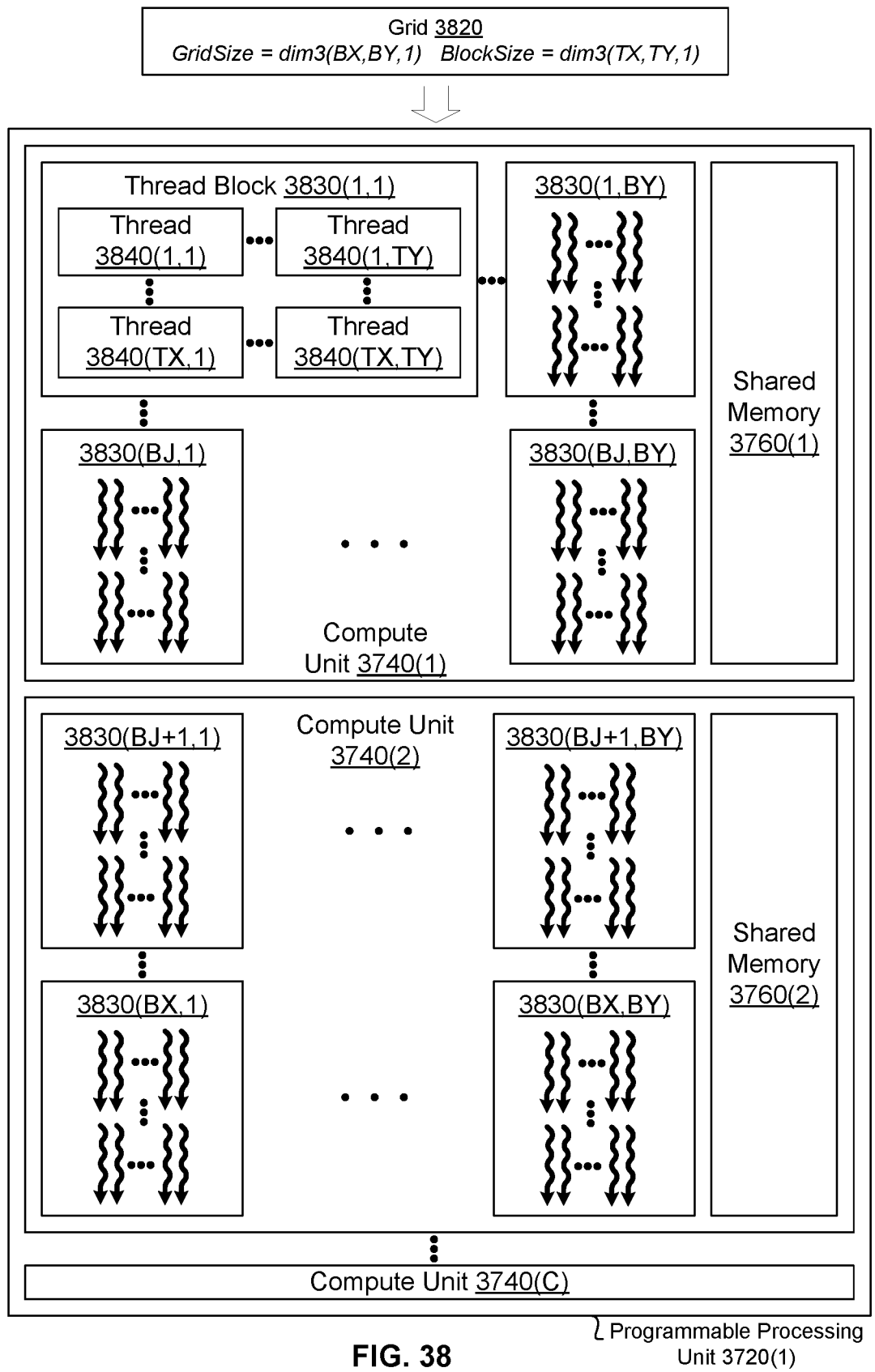
FIG. 38 illustrates how threads of an exemplary CUDA grid are mapped to different compute units of FIG. 37, in accordance with at least one embodiment.

FIG. 38 illustrates how threads of an exemplary CUDA grid 3820 are mapped to different compute units 3740 of FIG. 37, in accordance with at least one embodiment. In at least one embodiment and for explanatory purposes only, grid 3820 has a GridSize of BX by BY by 1 and a BlockSize of TX by TY by 1. In at least one embodiment, grid 3820 therefore includes, without limitation, (BX*BY) thread blocks 3830 and each thread block 3830 includes, without limitation, (TX*TY) threads 3840. Threads 3840 are depicted in FIG. 38 as squiggly arrows.

In at least one embodiment, grid 3820 is mapped to programmable processing unit 3720(1) that includes, without limitation, compute units 3740(1)-3740(C). In at least one embodiment and as shown, (BJ*BY) thread blocks 3830 are mapped to compute unit 3740(1), and the remaining thread blocks 3830 are mapped to compute unit 3740(2). In at least one embodiment, each thread block 3830 may include, without limitation, any number of warps, and each warp is mapped to a different SIMD unit 3750 of FIG. 37.

In at least one embodiment, warps in a given thread block 3830 may synchronize together and communicate through shared memory 3760 included in associated compute unit 3740. For example and in at least one embodiment, warps in thread block 3830(BJ,1) can synchronize together and communicate through shared memory 3760(1). For example and in at least one embodiment, warps in thread block 3830(BJ+1,1) can synchronize together and communicate through shared memory 3760(2).

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. Use of term "set" (e.g., "a set of items") or "subset" unless otherwise noted or contradicted by context, is to be construed as a nonempty collection comprising one or more members. Further, unless otherwise noted or contradicted by context, term "subset" of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, term "plurality" indicates a state of being plural (e.g., "a plurality of items" indicates multiple items). Number of items in a plurality is at least two, but can be more when so indicated either explicitly or by context. Further, unless stated otherwise or otherwise clear from context, phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause computer system to perform operations described herein. Set of non-transitory computer-readable storage media, in at least one embodiment, comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors—for example, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, term "processor" may refer to any device or portion of a device that processes electronic data from registers and/or memory and transform that electronic data into other electronic data that may be stored in registers and/or memory. As non-limiting examples, "processor" may be a CPU or a GPU. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. Terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. Process of obtaining, acquiring, receiving, or inputting analog and digital data can be accomplished in a variety of ways such as by receiving data as a parameter of a function call or a call to an application programming interface. In some implementations, process of obtaining, acquiring, receiving, or inputting analog or digital data can be accomplished by transferring data via a serial or parallel interface. In another implementation, process of obtaining, acquiring, receiving, or inputting analog or digital data can be accomplished by transferring data via a computer network from providing entity to acquiring entity. References may also be made to providing, outputting, transmitting, sending, or presenting analog or digital data. In various examples, process of providing, outputting, transmitting, sending, or presenting analog or digital data can be accomplished by transferring data as an input or output parameter of a function call, a parameter of an application programming interface or interprocess communication mechanism.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A system, comprising:
   one or more processors;
   a heatsink connected by a flexible heat conduit to the one or more processors; and
   a support comprising a plurality of slots, each slot of the plurality of slots to secure the heatsink in a respective position of a plurality of positions via a connector pin of the heatsink.

2. The system of claim 1, wherein the one or more processors comprise one or more graphics processing units.

3. The system of claim 1, wherein the flexible heat conduit comprises a loop siphon.

4. The system of claim 1, wherein a position of the heatsink is adjustable to improve heat dissipation by the heatsink.

5. The system of claim 1, wherein a position of the heatsink is adjustable to improve at least one of utilization, velocity, or temperature of airflow to a second heatsink.

6. The system of claim 1, wherein a position of the heatsink is adjustable to accommodate siting of the heatsink on a chassis.

7. The system of claim 1, further comprising one or more attachment points, the one or more attachment points permitting the heatsink to be secured in the respective position of the plurality of positions via the connector pin.

8. The system of claim 1, wherein a position of the heatsink is at least one of angularly, horizontally, or vertically adjustable with respect to a plane defined by a surface on which the one or more processors are mounted.

9. A system, comprising:
   a heatsink comprising a connector pin;
   a flexible heat conduit to connect the heatsink to one or more processors; and
   a support comprising a plurality of slots, each slot of the plurality of slots to secure the heatsink to a respective position of a plurality of positions via the connector pin.

10. The system of claim 9, wherein the flexible heat conduit comprises a loop siphon.

11. The system of claim 10, wherein the heatsink connects to the one or more processors by a reservoir base.

12. The system of claim 9, wherein a position of the heatsink is adjustable to maximize airflow to a second heatsink.

13. The system of claim 9, wherein a position of the heatsink is adjustable to lower temperature of airflow to a second heatsink.

14. The system of claim 9, wherein a position of the heatsink is adjustable to accommodate siting of the heatsink on a chassis.

15. A method, comprising:
connecting a heatsink comprising a connector pin, by a flexible heat conduit, to one or more processors, wherein a position of the heatsink, while connected to the one or more processors, is adjustable using a support comprising a plurality of slots, each slot of the plurality of slots to secure the heatsink in a respective position of a plurality of positions via the connector pin.

16. The method of claim 15, wherein the flexible heat conduit comprises a loop siphon.

17. The method of claim 16, further comprising connecting the flexible heat conduit to the one or more processors by a reservoir base.

18. The method of claim 15, further comprising adjusting a position of the heatsink to maximize airflow to the heatsink.

19. The method of claim 15, further comprising adjusting a position of the heatsink to maximize airflow to a second heatsink.

20. The method of claim 15, further comprising adjusting a position of the heatsink to lower temperature of airflow to a second heatsink.

21. The method of claim 15, further comprising providing a plurality of attachment points into which the heatsink can be secured.

22. A graphics card, comprising:
one or more graphics processing units;
a heatsink comprising a connector pin and connected by a flexible heat conduit to the one or more graphics processing units, wherein a position of the heatsink is adjustable; and
a support comprising a plurality of slots, each slot of the plurality of slots to secure the heatsink in a respective position of a plurality of positions via the connector pin.

23. The graphics card of claim 22, wherein the support comprises a plurality of mounting points to secure the heatsink via the connector pin.

24. The graphics card of claim 22, wherein a position of the heatsink can be at least one of raised or lowered.

25. The graphics card of claim 22, wherein adjustment of a position of the heatsink comprises tilting the heatsink.

26. The graphics card of claim 22, wherein the flexible heat conduit comprises a loop siphon.

27. The graphics card of claim 22, wherein the flexible heat conduit comprises a base to attach the heatsink to the one or more graphics processing units.

28. The graphics card of claim 22, wherein adjustment of a position of the heatsink improves airflow to at least one of the heatsink and a second heatsink.

\* \* \* \* \*